US012683554B2

(12) United States Patent
Kim et al.

(10) Patent No.: US 12,683,554 B2
(45) Date of Patent: Jul. 14, 2026

(54) SUPPLY MODULATOR AND WIRELESS COMMUNICATION APPARATUS INCLUDING THE SAME

(71) Applicant: SAMSUNG ELECTRONICS CO., LTD., Suwon-si (KR)

(72) Inventors: Dongsu Kim, Hwaseong-si (KR); Junsuk Bang, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 461 days.

(21) Appl. No.: 18/142,298

(22) Filed: May 2, 2023

(65) Prior Publication Data

US 2023/0275547 A1      Aug. 31, 2023

Related U.S. Application Data

(63) Continuation of application No. 17/031,172, filed on Sep. 24, 2020, now Pat. No. 11,677,356.

(30) Foreign Application Priority Data

Feb. 19, 2020    (KR) ........................ 10-2020-0020345
May 13, 2020    (KR) ........................ 10-2020-0057148

(51) Int. Cl.
*H03F 1/02*        (2006.01)
*H03F 3/19*        (2006.01)
*H03F 3/24*        (2006.01)
(52) U.S. Cl.
CPC ............. *H03F 1/0227* (2013.01); *H03F 3/19* (2013.01); *H03F 3/245* (2013.01);
(Continued)

(58) Field of Classification Search
CPC .......... H03F 1/0227; H03F 3/19; H03F 3/245; H03F 2200/102; H03F 2200/432; H03F 2200/451
(Continued)

(56) References Cited

U.S. PATENT DOCUMENTS 6,850,130 B1 *    2/2005    Gottl ........................ H01Q 3/32
                                                                          333/156
7,116,946 B2    10/2006    Tanabe et al.
(Continued)

FOREIGN PATENT DOCUMENTS

JP          2020072468 A      5/2020
KR      20050053591 A      6/2005
(Continued)

*Primary Examiner* — Hafizur Rahman
(74) *Attorney, Agent, or Firm* — Fish & Richardson P.C.

(57)                            ABSTRACT

A supply modulator includes a linear regulator that generates an output voltage in an envelope tracking mode. A switching regulator operates with the linear regulator to generate the output voltage in the envelope tracking mode and to selectively generate the output voltage in an average power tracking mode. A single inductor multiple output converter operates selectively with the switching regulator to generate the output voltage in the average power tracking mode, operates to provide a power supply voltage to the linear regulator in the envelope tracking mode, and includes a first capacitor connected with a power supply terminal of the linear regulator and a second capacitor selectively connected with an output terminal of the linear regulator through a first switch. A main controller decides a tracking mode to be executed by the supply modulator.

20 Claims, 33 Drawing Sheets

(52) U.S. Cl.
CPC .. *H03F 2200/102* (2013.01); *H03F 2200/432*
(2013.01); *H03F 2200/451* (2013.01)

(58) Field of Classification Search
USPC ........................................................ 330/149
See application file for complete search history.

(56)                    References Cited

U.S. PATENT DOCUMENTS

| | | | |
|---|---|---|---|
| 7,949,316 B2 * | 5/2011 | Takinami .............. | H03F 1/0227 |
| | | | 455/108 |
| 8,532,595 B1 | 9/2013 | Khlat et al. | |
| 9,225,362 B2 | 12/2015 | Drogi et al. | |
| 9,473,023 B2 | 10/2016 | Vannorsdel et al. | |
| 9,479,118 B2 | 10/2016 | Khlat et al. | |
| 9,503,024 B2 * | 11/2016 | Aoki ......................... | H03F 3/72 |
| 9,628,118 B2 * | 4/2017 | Xu ......................... | H03F 1/0266 |
| 9,634,650 B2 * | 4/2017 | Allison .................... | H03H 7/20 |
| 9,768,731 B2 | 9/2017 | Perreault et al. | |
| 9,912,306 B1 | 3/2018 | Lin et al. | |
| 10,153,741 B2 | 12/2018 | Yang et al. | |
| 10,291,282 B1 * | 5/2019 | Lin .......................... | H04B 1/52 |
| 10,305,429 B2 | 5/2019 | Choo et al. | |
| 10,348,247 B2 | 7/2019 | Henzler et al. | |
| 10,491,161 B2 | 11/2019 | Youn et al. | |
| 10,523,120 B2 | 12/2019 | Youn et al. | |
| 10,530,320 B2 * | 1/2020 | Sharma .................... | H03H 7/06 |
| 10,644,651 B1 | 5/2020 | Kim et al. | |
| 10,680,581 B2 * | 6/2020 | Valdes Garcia ........ | H01P 1/127 |
| 2013/0194017 A1 * | 8/2013 | Staudinger ........... | H03F 1/3282 |
| | | | 327/231 |
| 2013/0234793 A1 * | 9/2013 | Khlat ...................... | H03G 3/30 |
| | | | 330/127 |
| 2014/0361837 A1 * | 12/2014 | Strange ................... | H03F 3/195 |
| | | | 330/297 |
| 2015/0188432 A1 * | 7/2015 | Vannorsdel .......... | H02M 3/156 |
| | | | 323/271 |
| 2015/0311791 A1 | 10/2015 | Tseng et al. | |
| 2016/0099686 A1 | 4/2016 | Perreault et al. | |
| 2016/0380623 A1 * | 12/2016 | Allison .................... | H03H 7/25 |
| | | | 327/237 |
| 2018/0152144 A1 * | 5/2018 | Choo .................... | H03F 1/0227 |
| 2018/0316311 A1 | 11/2018 | Gebeyehu et al. | |
| 2019/0158069 A1 * | 5/2019 | Grelaud .............. | H04B 1/0458 |
| 2020/0007088 A1 | 1/2020 | Ranta et al. | |
| 2020/0028435 A1 | 1/2020 | Kim et al. | |
| 2021/0194517 A1 * | 6/2021 | Mirea ...................... | H03F 3/24 |

FOREIGN PATENT DOCUMENTS

| | | |
|---|---|---|
| KR | 20150129722 A | 11/2015 |
| KR | 20180058994 A | 6/2018 |

* cited by examiner

SUPPLY MODULATOR AND WIRELESS COMMUNICATION APPARATUS INCLUDING THE SAME

CROSS-REFERENCE TO RELATED APPLICATIONS

This is a Continuation of U.S. application Ser. No. 17/031,172, filed Sep. 24, 2020, and a claim of priority is made to Korean Patent Application Nos. 10-2020-0020345 filed on Feb. 19, 2020 and 10-2020-0057148 filed on May 13, 2020, in the Korean Intellectual Property Office, the disclosures of which are incorporated by reference herein in their entireties.

BACKGROUND

Embodiments of the present disclosure described herein relate to a supply modulator having a fast voltage change characteristic and a wireless communication apparatus including the same.

A wireless communication apparatus such as a smartphone, a tablet, or an Internet of Things (IoT) apparatus uses a WCDMA (3G), LTE, LTE Advanced (4G) or NR (5G) technology for high-speed communication. However, as a communication technology develops, a high peak-to-average power ratio (PAPR) and a high bandwidth of a transmit/receive signal is required. In the case where a power of a power amplifier of a transmission stage is connected with a battery, efficiency of the power amplifier decreases. As such, to improve power efficiency of the power amplifier under the high PAPR and the high bandwidth, an average power tracking (hereinafter referred to as an "APT") or envelope tracking (hereinafter referred to as an "ET") technology is used. A chip that supports the APT technology and the ET technology is referred to as a "supply modulator (SM)".

SUMMARY

Embodiments of the present disclosure provide a supply modulator with improved power use efficiency and modulation operation performance and a wireless communication apparatus including the same.

According to an exemplary embodiment, a supply modulator is driven in a tracking mode of an envelope tracking (ET) mode and an average power tracking (APT) mode to provide an output voltage to a power amplifier. The supply modulator includes a linear regulator configured to generate the output voltage in the envelope tracking mode. A switching regulator is configured to generate, with the linear regulator, the output voltage in the envelope tracking mode and selectively operates to generate the output voltage in the average power tracking mode. A single inductor multiple output (SIMO) converter is configured to selectively operate with the switching regulator to generate the output voltage in the average power tracking mode and to provide a power supply voltage to the linear regulator in the envelope tracking mode. The SIMO converter includes a first capacitor connected with a power supply terminal of the linear regulator and a second capacitor selectively connected with an output terminal of the linear regulator through a first switch. A main controller is configured to decide the tracking mode and to control at least one of the first switch, the linear regulator, the switching regulator, and the single inductor multiple output converter based on the decided tracking mode.

According to an exemplary embodiment, a supply modulator is driven in a tracking mode of an envelope tracking mode and an average power tracking mode to provide an output voltage to a power amplifier. The supply modulator includes a linear regulator configured to generate the output voltage in the envelope tracking mode. A switching regulator is configured to generate, with the linear regulator, the output voltage in the envelope tracking mode and to selectively operate to generate the output voltage in the average power tracking mode. A boost-buck converter is configured to provide a power supply voltage to the linear regulator in the envelope tracking mode and includes a first capacitor connected with a power supply terminal of the linear regulator. A linear charger is configured to selectively operate with the switching regulator to generate the output voltage in the average power tracking mode and includes a second capacitor selectively connected with an output terminal of the linear regulator through a switch. A main controller is configured to decide the tracking mode and to control at least one of the switch, the linear regulator, the switching regulator, the boost-buck converter, and the linear charger based on the decided tracking mode.

BRIEF DESCRIPTION OF THE FIGURES

The above and other objects and features of the present disclosure will become apparent by describing in detail exemplary embodiments thereof with reference to the accompanying drawings.

FIG. 1 is a block diagram illustrating a wireless communication apparatus according to an embodiment of the present disclosure.

FIG. 2 is a block diagram illustrating how a digital transmission processing unit illustrated in FIG. 1 processes signals.

Figure 4:
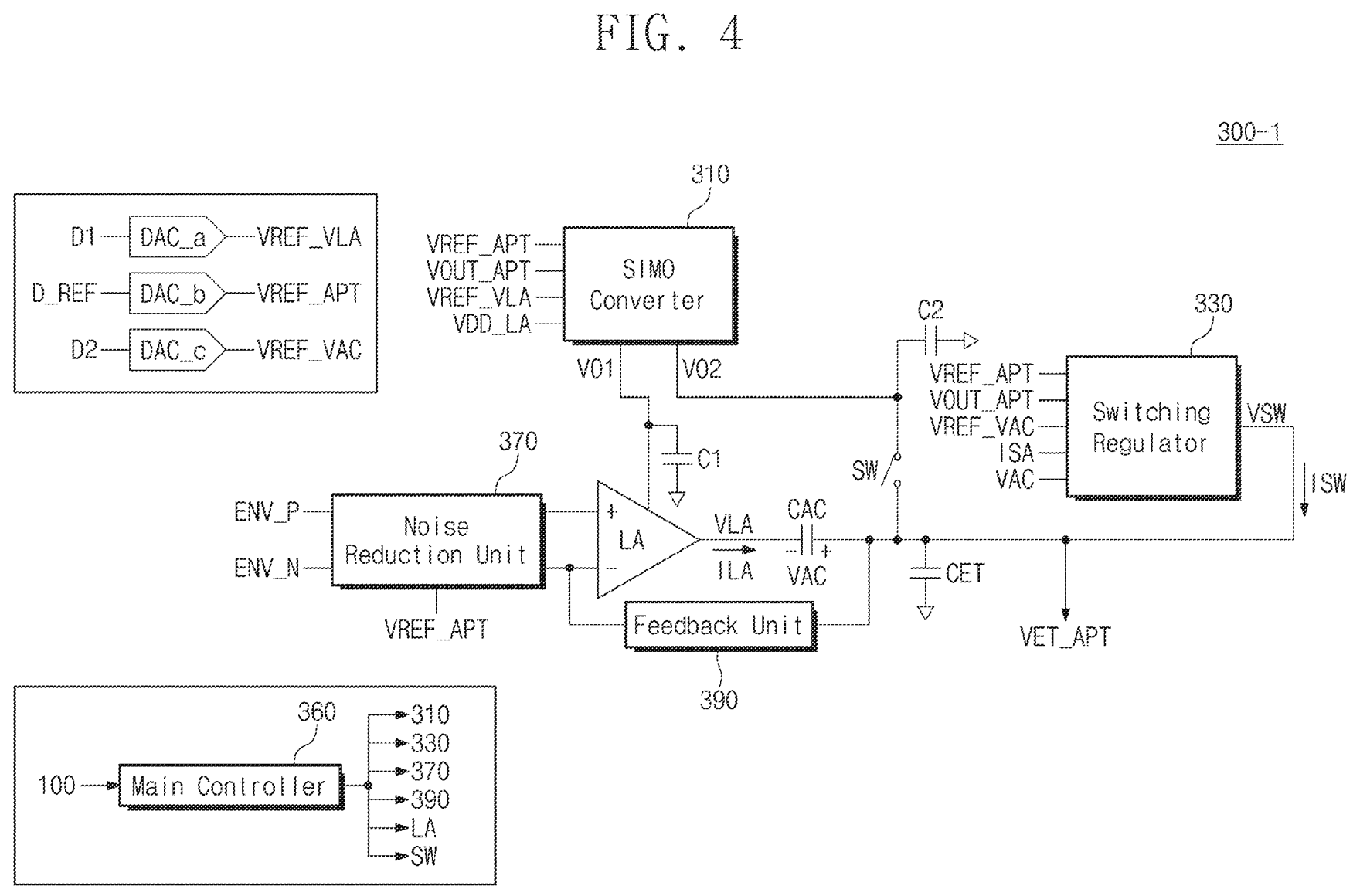

FIG. 4 is a circuit diagram illustrating a first example of a supply modulator included in a wireless communication apparatus according to some embodiments of the present disclosure.

Figure 11:
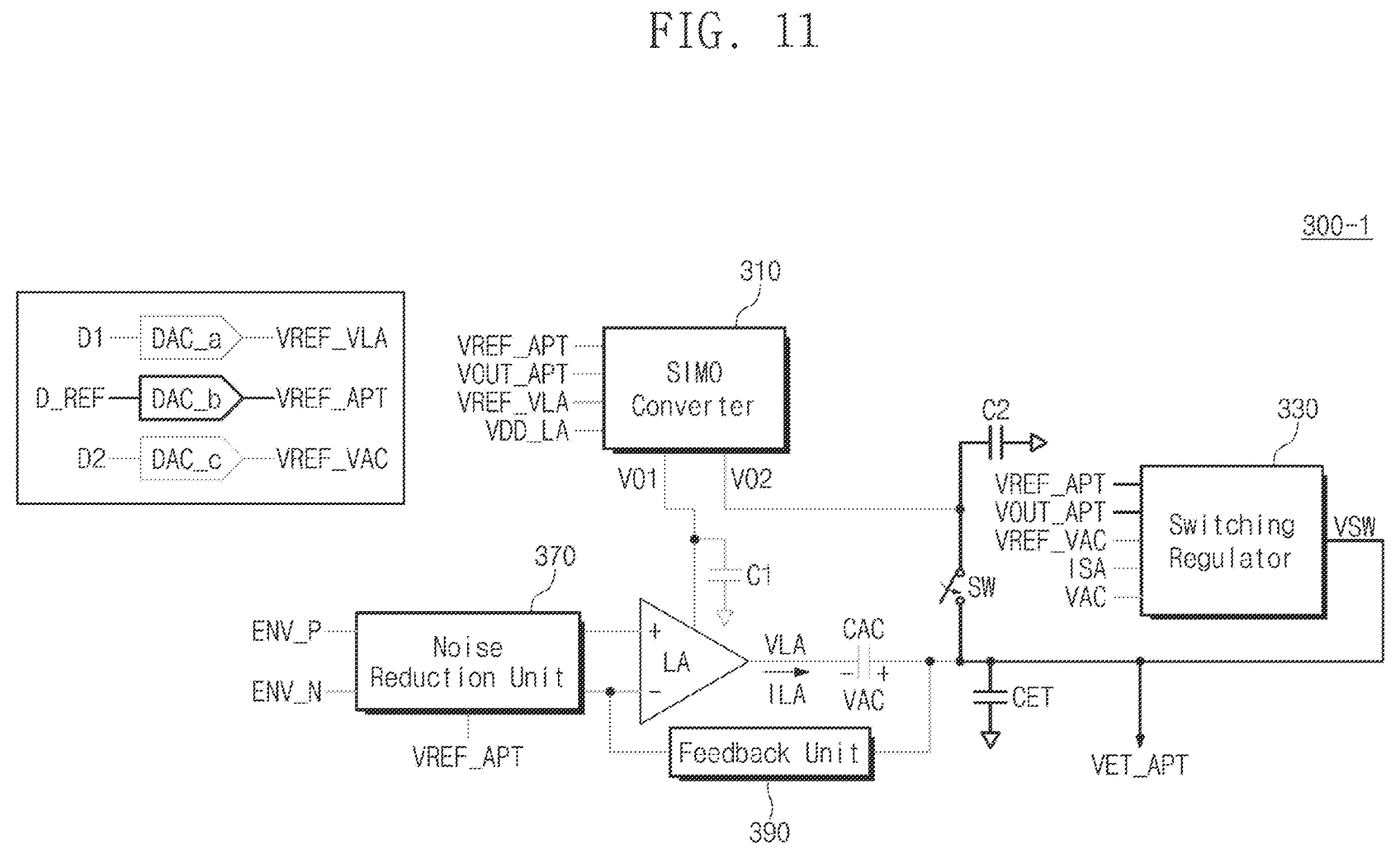

FIG. 11 is a diagram illustrating an average power tracking mode operation of a supply modulator of FIG. 4.

Figure 12:
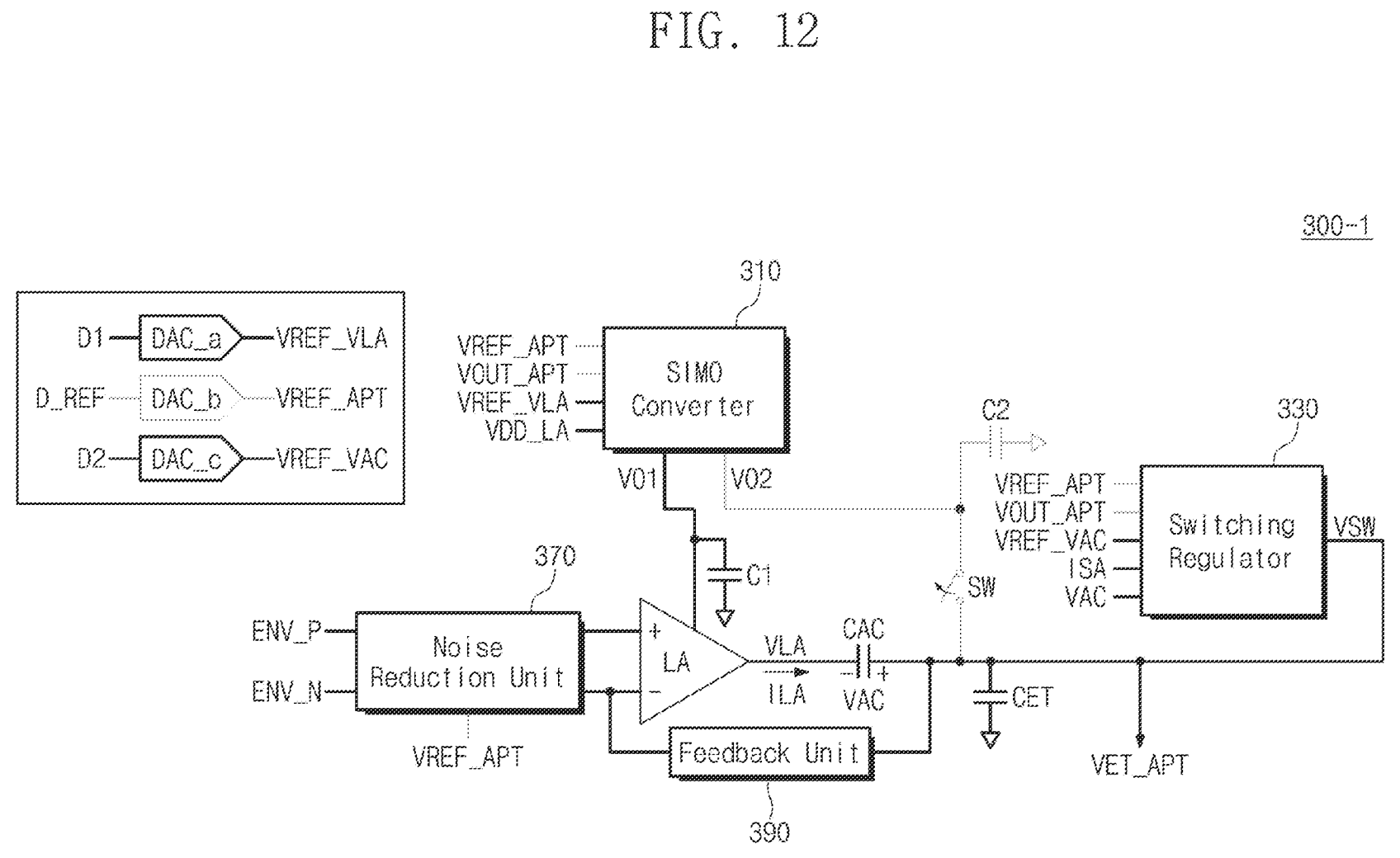

FIG. 12 is a diagram illustrating an envelope tracking mode operation of a supply modulator of FIG. 4.

Figure 13:
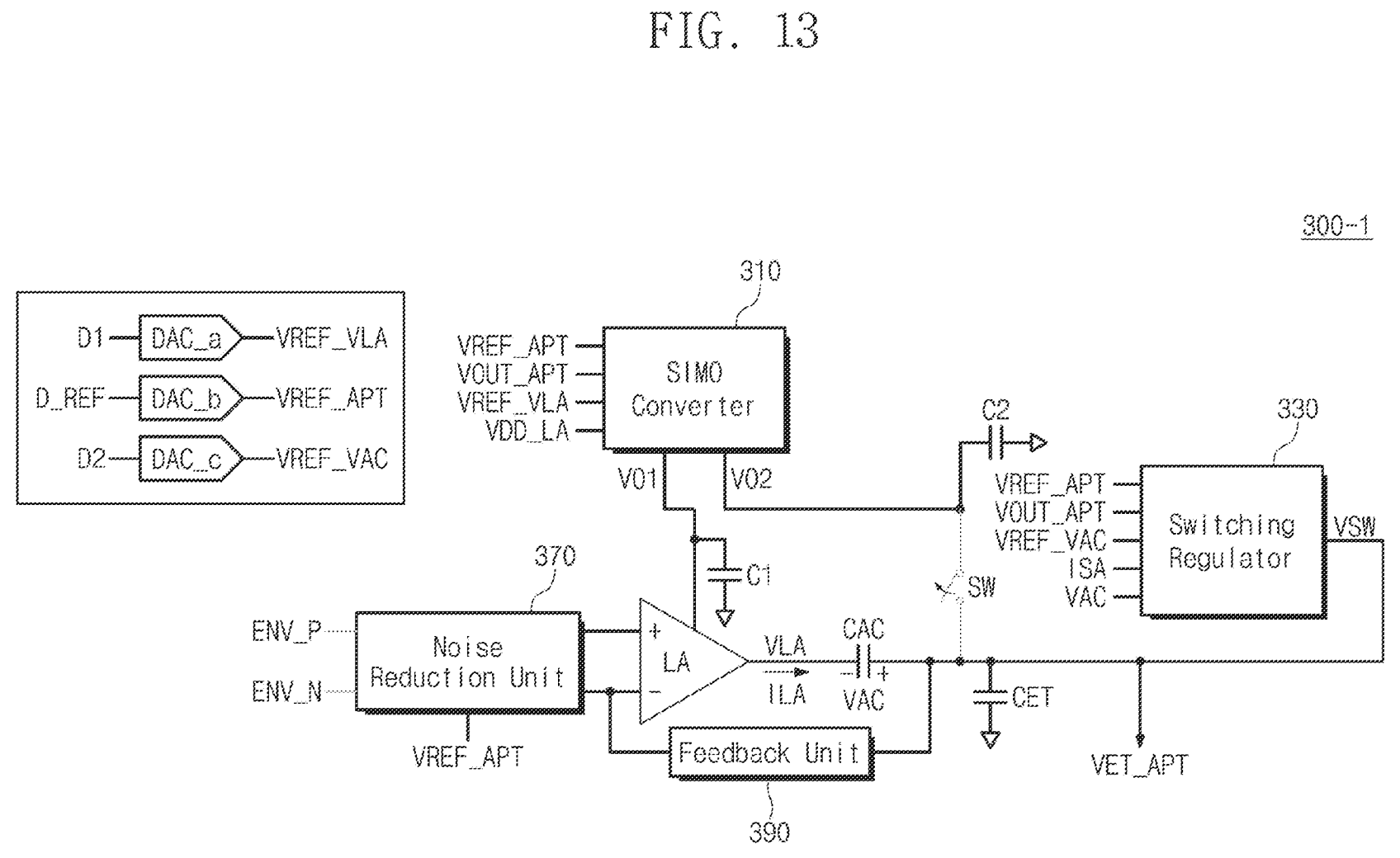

FIG. 13 is a diagram illustrating a capacitor charging operation performed by a supply modulator of FIG. 4 to maintain a voltage level of an output voltage when a tracking mode is changed.

FIG. 23 is a circuit diagram illustrating a third example of a supply modulator included in a wireless communication apparatus according to some embodiments of the present disclosure.

FIG. 31 is a circuit diagram illustrating a fourth example of a supply modulator included in a wireless communication apparatus according to some embodiments of the present disclosure.

DETAILED DESCRIPTION

Figure 3:
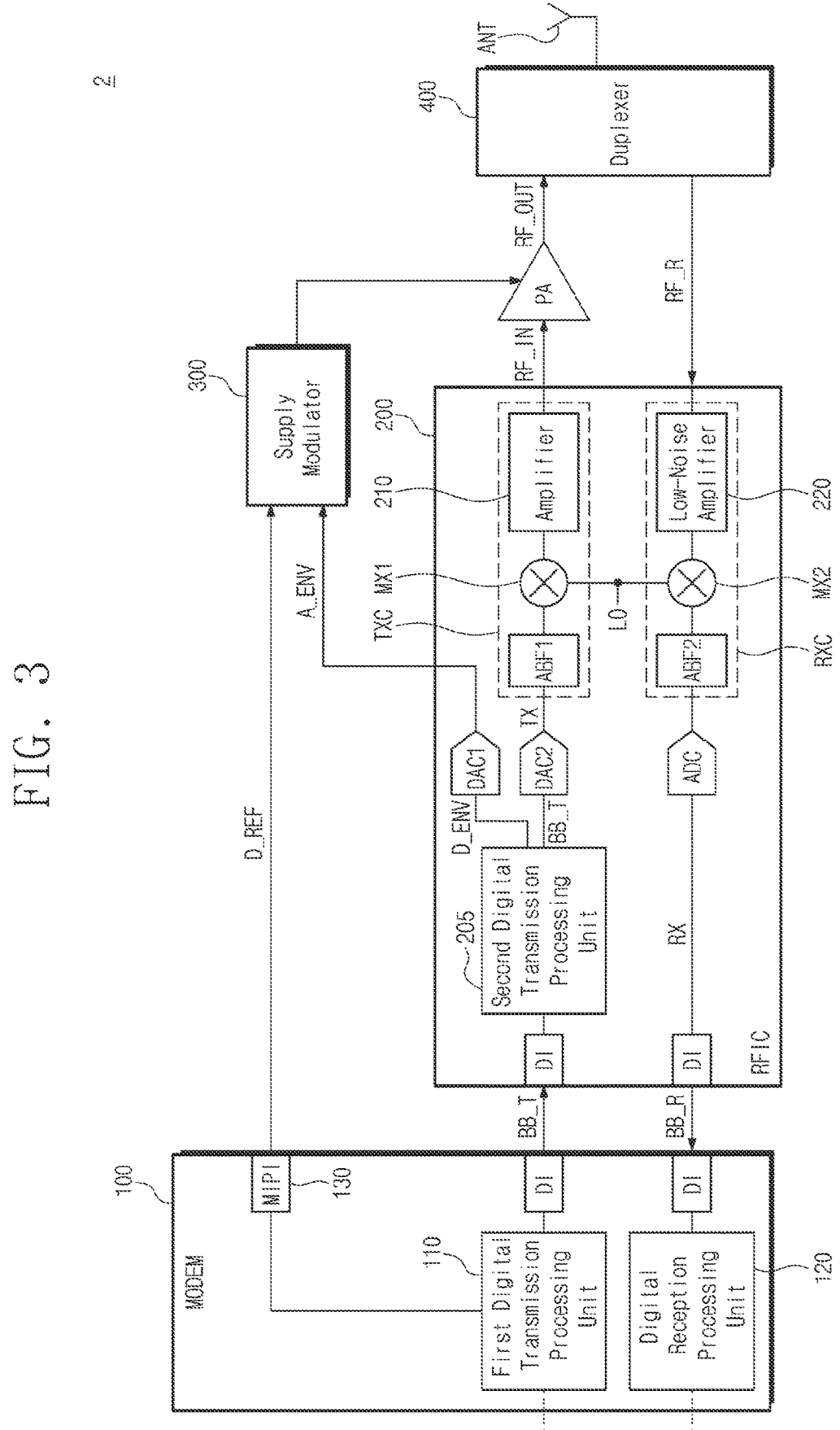
FIG. 3 is a block diagram illustrating a wireless communication apparatus according to another embodiment of the present disclosure.

Below, embodiments of the present disclosure will be described in detail with reference to accompanying drawings.

The above and other aspects, features and advantages of the present disclosure will become apparent from the description of the embodiments given in conjunction with the drawings. However, the present disclosure may be variously implemented in different forms, not limited to the following embodiments. The embodiments make the description of the present disclosure to which the present disclosure pertains complete. Also, the embodiments are provided to inform those skilled in the art of the claims of the present disclosure completely, and the present disclosure is defined only by the claims. Specific components described only in each embodiment of the present disclosure may also be applied to any other embodiments. The same reference numerals denote the same components throughout the specification.

The expression "one element is connected to or coupled to any other element" includes all the cases: one element is directly connected to or coupled to any other element, and one element is connected to or coupled to any other element through an intermediate element. In contrast, the expression "one element is directly connected to or directly coupled to any other element" means that an intermediate element is not interposed between the elements. The same reference numerals denote the same elements throughout the specification. As used herein, the term "and/or" includes each of the associated listed items and one all combinations of one or more thereof.

It will be understood that, although the terms "first", "second", etc., may be used herein to describe various elements, components, and/or sections, these elements, components, and/or sections should not be limited by these terms. These terms are only used to distinguish one element, component, or section from another element, component, or section. Thus, a first element, a first component, or a first section discussed below could be termed a second element, a second component, or a second section without departing from the teachings of the present disclosure.

The terms used herein are provided to describe the embodiments but not to limit the present disclosure. In the specification, the singular forms include plural forms unless particularly mentioned. The terms "comprises" and/or "comprising," when used in the specification, specify the presence of steps, operations, and/or components, but do not preclude the presence or addition of one or more other steps, operations, and components.

Unless otherwise defined, all terms (including technical and scientific terms) used herein have the same meaning as commonly understood by those skilled in the art to which the present disclosure pertains. It will be further understood that terms, such as those defined in commonly used dictionaries, should be interpreted as having a meaning that is consistent with their meaning in the context of the specification and relevant art and should not be interpreted in an idealized or overly formal sense unless expressly so defined herein.

Figure 1:
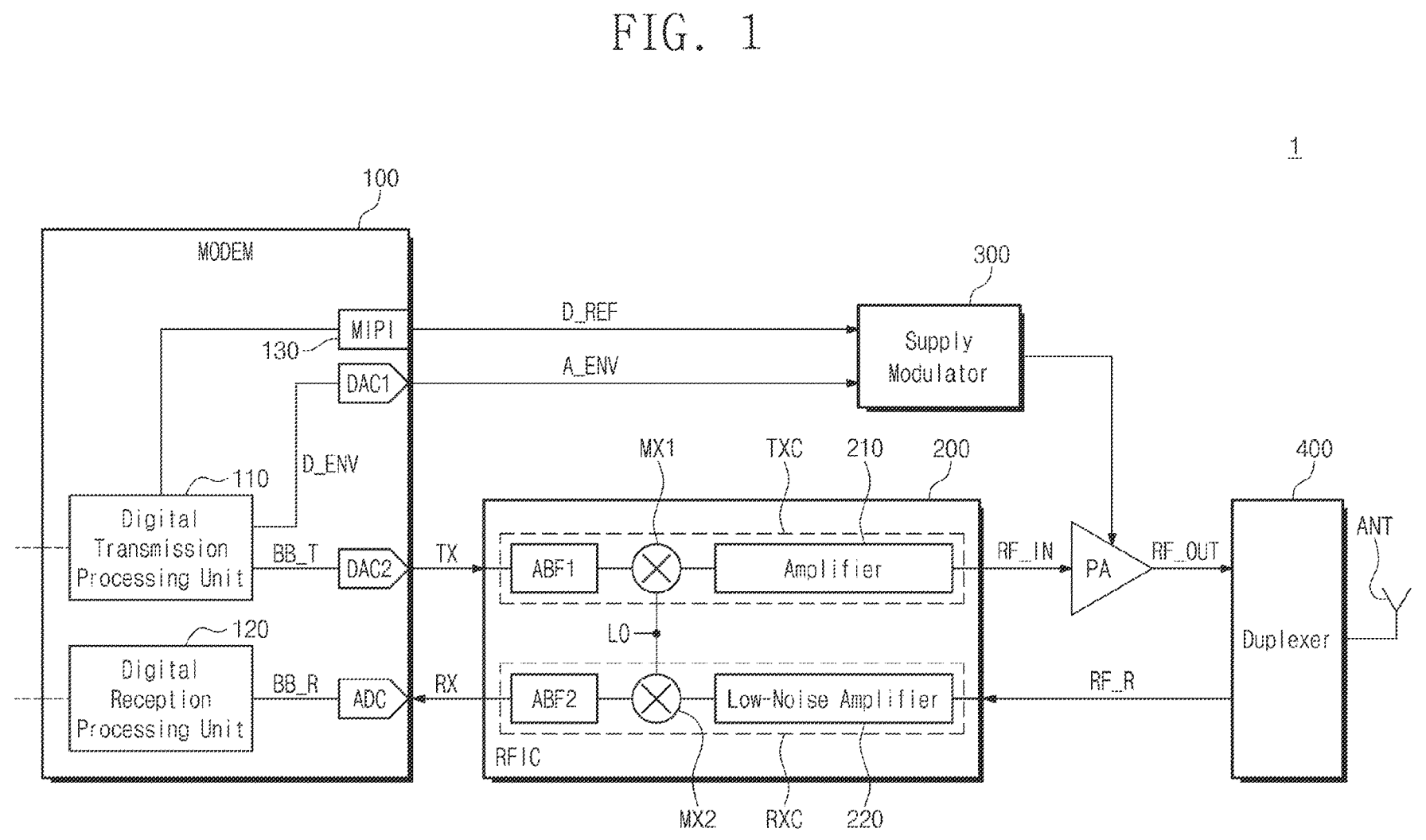
Figure 2:
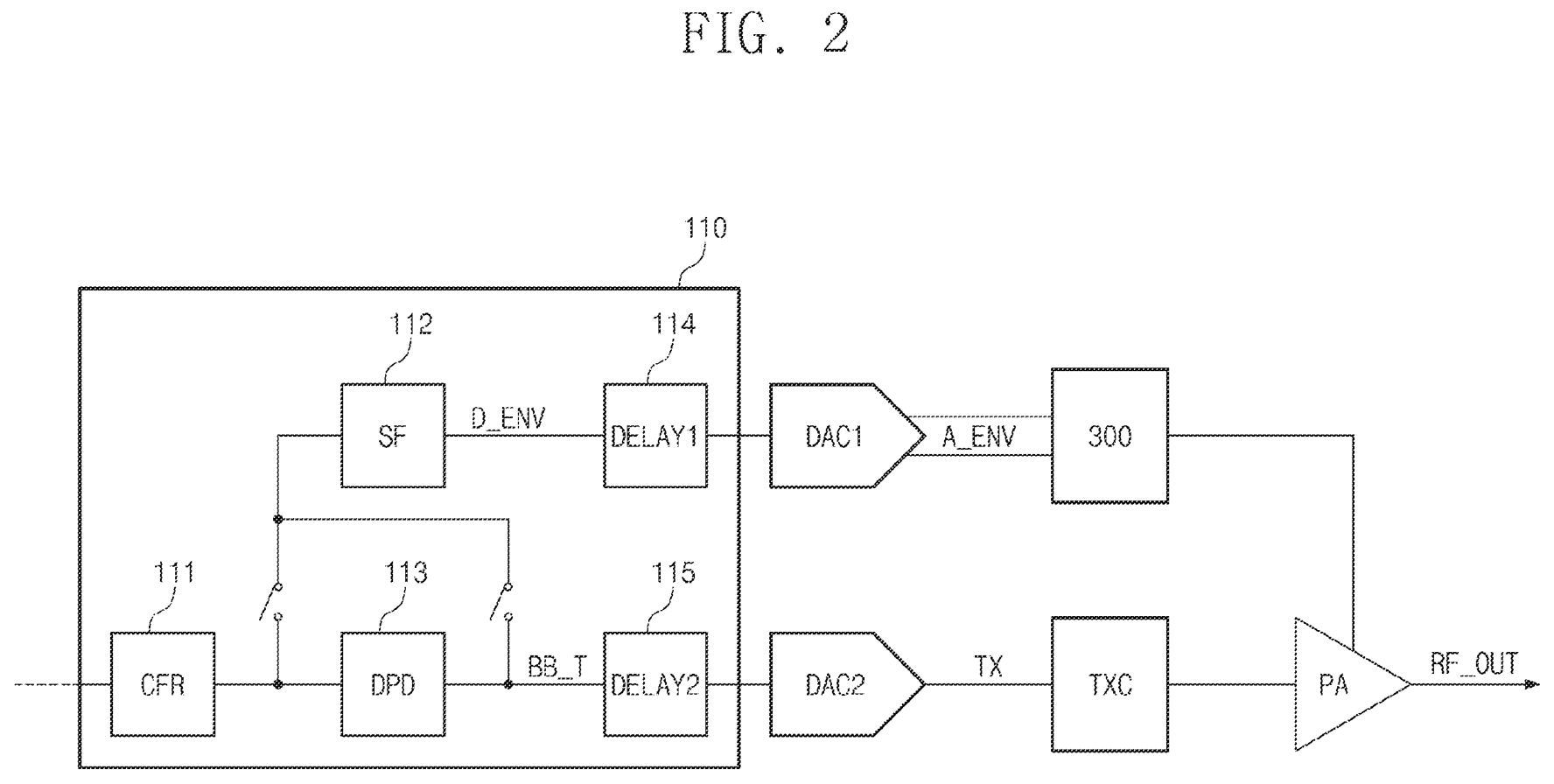

FIG. 1 is a block diagram illustrating a wireless communication apparatus according to an embodiment of the present disclosure. FIG. 2 is a block diagram illustrating how a digital transmission processing unit illustrated in FIG. 1 processes signals.

Referring to FIG. 1, a wireless communication apparatus 1 according to an embodiment of the present disclosure may include a MODEM 100, a radio frequency integrated circuit (RFIC) 200, a supply modulator 300, a duplexer 400, a power amplifier PA, and an antenna ANT.

The MODEM 100 may include a digital transmission processing unit 110, a digital reception processing unit 120, a plurality of digital-to-analog converters DAC1 and DAC2, an analog-to-digital converter ADC, and a mobile industry processor interface (MIPI) 130.

The MODEM 100 may process a baseband signal BB_T (e.g., including an I signal and a Q signal) including information to be transmitted through the digital transmission processing unit 110 in compliance with a given communication scheme. The MODEM 100 may process a received baseband signal BB_R through the digital reception processing unit 120 in compliance with the given communication scheme. For example, the MODEM 100 may process a signal to be transmitted or a received signal in compliance with a communication scheme such as OFDM (Orthogonal Frequency Division Multiplexing), OFDMA (Orthogonal Frequency Division Multiple access), WCDMA (Wideband Code Multiple Access), or HSPA+(High Speed Packet Access+). In addition, the MODEM 100 may process the baseband signal BB_T or BB_R in compliance with various kinds of communication schemes (i.e., various communication schemes to which a technology for modulating or demodulating an amplitude and a frequency of the baseband signal BB_T or BB_R is applied).

The MODEM 100 may extract an envelope of the baseband signal BB_T through the digital transmission processing unit 110 and may generate a digital envelope signal D_ENV based on the extracted envelope. The MODEM 100 may generate an average power signal D_REF based on an average power tracking table (i.e., an APT table) stored in a memory (e.g., 1300 of FIG. 34 or 2200 of FIG. 35). Here, the extracted envelope may correspond to an amplitude component (i.e., a magnitude of the I signal and the Q signals) of the baseband signal BB_T.

The APT table may store information of a necessary power supply voltage of the power amplifier PA according to an expected output power (or a transmission power) of the antenna ANT and information of an average power signal corresponding to the necessary power supply voltage of the power amplifier PA. As such, when the expected output power of the antenna ANT is decided, the MODEM 100 may generate the average power signal D_REF by using the APT table and may provide the generated average power signal D_REF to the supply modulator 300 as a reference voltage signal.

Here, referring to FIG. 2, a detailed signal processing procedure of the digital transmission processing unit 110 is illustrated.

In detail, the digital transmission processing unit 110 may perform various operations through crest factor reduction (CFR) 111, a shaping function (SF) 112, a digital pre-distortion (DPD) 113, a first delay (DELAY1) 114, a second delay (DELAY2) 115, as well as the above operations of processing a baseband signal, extracting an envelope, and generating a digital envelope signal.

The CFR 111 may reduce a peak-to-average power ratio (PAPR) of a communication signal (e.g., the baseband signal BB_T). The SF 112 may modify the digital envelope signal D_ENV such that efficiency and linearity of the power amplifier PA are improved, and the DPD 113 may compensate for distortion of the power amplifier PA in a digital domain so as to be linearized. The first delay 114 may correct a delay of the digital envelope signal D_ENV, and the second delay 115 may correct a delay of the baseband signal BB_T.

The digital transmission processing unit 110 having the above configuration may output the digital envelope signal D_ENV and the baseband signal BB_T. The digital envelope signal D_ENV may be converted into an analog envelope signal A_ENV through the first digital-to-analog converter DAC1, and the analog envelope signal A_ENV may be provided to the supply modulator 300; the baseband signal BB_T may be converted into a transmit signal TX through the second digital-to-analog converter DAC2, and the transmit signal TX may be provided to a transmission circuit TXC.

Although not illustrated in the drawings, the digital transmission processing unit 110 may further include an internal component to process the above operations (i.e., baseband signal processing, envelope extraction, and digital envelope signal generation). Also, the internal configuration of the digital transmission processing unit 110 illustrated in FIG. 2 is, but is not limited to, only an exemplary embodiment.

Returning to FIG. 1, the MODEM 100 may perform digital-to-analog conversion on the baseband signal BB_T and the digital envelope signal D_ENV by using the plurality of digital-to-analog converters DAC1 and DAC2 included therein and may generate the transmit signal TX and the analog envelope signal A_ENV as analog signals. Also, the average power signal D_REF output from the MODEM 100 may be a digital signal. As such, the average power signal D_REF may be provided to a digital-to-analog converter included in the supply modulator 300 through the MIPI 130 and may be converted into an analog signal, for example, the reference voltage signal through the digital-to-analog converter included in the supply modulator 300. In an embodiment, the digital-to-analog converters DAC1 and DAC2 included in the MODEM 100 may operate at a speed higher than the digital-to-analog converter included in the supply modulator 300.

Of course, the present disclosure is not limited thereto. For example, the MODEM 100 may convert the average power signal D_REF into an analog signal through a digital-to-analog converter included therein. In this case, the MODEM 100 may provide average power signal converted into the analog signal to the supply modulator 300 as a reference voltage signal.

However, for convenience of description, in the embodiment of the present disclosure the MODEM 100 provides the average power signal D_REF to the digital-to-analog converter included in the supply modulator 300 through the MIPI 130.

In an embodiment, each of the transmit signal TX and the analog envelope signal A_ENV may be implemented with differential signals including a positive signal and a negative signal.

Also, the MODEM 100 may be provided with a receive signal RX as an analog signal from the RFIC 200. The MODEM 100 may perform analog-to-digital conversion on the receive signal RX through the analog-to-digital converter ADC included therein and may extract the baseband signal BB_R as a digital signal. Here, the receive signal RX may be implemented with differential signals including a positive signal and a negative signal.

The RFIC 200 may generate an RF input signal RF_IN by performing frequency up-conversion on the transmit signal TX or may generate the receive signal RX by performing frequency down-conversion on an RF receive signal RF_R. In detail, the RFIC 200 may include a transmission circuit TXC for frequency up-conversion, a reception circuit RXC for frequency down-conversion, and a local oscillator LO.

Here, the transmission circuit TXC may include a first analog baseband filter ABF1, a first mixer MX1, and an amplifier 210. For example, the first analog baseband filter ABF1 may include a low pass filter.

The first analog baseband filter ABF1 may filter the transmit signal TX received from the MODEM 100 so as to be provided to the first mixer MX1. The first mixer MX1 may perform frequency up-conversion for converting a frequency of the transmit signal TX from a baseband to a high-frequency band through a frequency signal provided by the local oscillator LO. The transmit signal TX may be provided to the amplifier 210 as the RF input signal RF_IN through the frequency up-conversion, and the amplifier 210 may amplify a power of the RF input signal RF_IN so as to be provided to the power amplifier PA.

The power amplifier PA may be supplied with a power supply voltage (i.e., a dynamically variable output voltage) from the supply modulator 300, may amplify a power of the RF input signal RF_IN based on the supplied power supply voltage, and may generate an RF output signal RF_OUT. The power amplifier PA may provide the generated RF output signal RF_OUT thus generated to the duplexer 400.

The reception circuit RXC may include a second analog baseband filter ABF2, a second mixer MX2, and a low-noise amplifier 220. For example, the second analog baseband filter ABF2 may include a low pass filter.

The low-noise amplifier 220 may amplify the RF receive signal RF_R provided from the duplexer 400 so as to be provided to the second mixer MX2. The second mixer MX2 may perform frequency down-conversion for converting a frequency of the RF receive signal RF_R from a high-frequency band to a baseband through a frequency signal provided by the local oscillator LO. The RF receive signal RF_R may be provided to the second analog baseband filter ABF2 as the receive signal RX through the above frequency down-conversion, and the second analog baseband filter ABF2 may filter the receive signal RX so as to be provided to the MODEM 100.

In an embodiment, the wireless communication apparatus 1 may transmit a transmit signal through a plurality of frequency bands by using carrier aggregation (CA). Also, to this end, the wireless communication apparatus 1 may include a plurality of power amplifiers for amplifying powers of a plurality of RF input signals RF_IN respectively corresponding to a plurality of carriers. However, in the embodiment of the present disclosure, for convenience of description, the description will be given in which the number of power amplifiers is "1".

The supply modulator 300 may generate a modulated output voltage, the level of which varies dynamically, based on the analog envelope signal A_ENV and the average power signal D_REF and may provide the modulated output voltage to the power amplifier PA as a power supply voltage.

In detail, the MODEM 100 may provide the supply modulator 300 with the average power signal D_REF and the analog envelope signal A_ENV. The supply modulator 300 may be driven in a tracking mode corresponding to one of an ET mode and an APT mode based on the average power signal D_REF and the analog envelope signal A_ENV thus provided and may generate the dynamically variable output voltage. Also, the supply modulator 300 may supply the generated output voltage to the power amplifier PA as the power supply voltage.

In an embodiment, when the power supply voltage of a fixed level is applied to the power amplifier PA, power efficiency of the power amplifier PA decreases. Accordingly, to efficiently manage the power of the power amplifier PA, the power amplifier PA may modulate an input voltage (i.e., power provided from a battery) (e.g., VBAT of FIG. 5) based on at least one of the analog envelope signal A_ENV and the average power signal D_REF and may provide the modulated voltage to the power amplifier PA as the power supply voltage.

Meanwhile, the supply modulator 300 according to an embodiment of the present disclosure may include two or more capacitors that are charged/discharged before and after the tracking mode or a change time point of the output voltage. As such, the supply modulator 300 according to an embodiment of the present disclosure is higher in a change speed of an output voltage than a conventional supply modulator.

That is, in the conventional supply modulator, a load capacitor for the APT mode performs a role of a load capacitor for power supply of the ET mode. In this case, it is difficult to complete a magnitude change of an output voltage within a short time only by using a limited current amount of a single load capacitor (i.e., a limited charging/discharging speed), and a signal distortion phenomenon such as an output clipping phenomenon may also occur.

However, for a change of the tracking mode or a magnitude change of the output voltage, the supply modulator 300 according to an embodiment of the present disclosure may include two or more load capacitors that are changed/discharged before or after the tracking mode or a change time point of the output voltage, and thus, a signal distortion phenomenon such as an output clipping phenomenon may be prevented while completing a magnitude change of the output voltage within a short time.

The supply modulator 300 will be more fully described below.

The duplexer 400 may be connected with the antenna ANT and may separate a transmission frequency from a reception frequency. In detail, the duplexer 400 may separate the RF output signal RF_OUT provided from the power amplifier PA for each frequency band so as to be provided to the corresponding antenna ANT. Also, the duplexer 400 may provide an external signal provided from the antenna ANT to the low-noise amplifier 220 of the reception circuit RXC of the RFIC 200. For example, the duplexer 400 may include a front end module with integrated duplexer (FEMiD).

In an embodiment, the wireless communication apparatus 1 may include a switch structure capable of separating the transmission frequency and the reception frequency instead of the duplexer 400. Also, the wireless communication apparatus 1 may include a structure implemented with the duplexer 400 and a switch for the purpose of separating the transmission frequency and the reception frequency. However, for convenience of description, in an embodiment of the present disclosure, the description will be given as the duplexer 400 capable of separating the transmission frequency and the reception frequency is included in the wireless communication apparatus 1.

The antenna ANT may transmit the RF output signal RF_OUT frequency-separated by the duplexer 400 to the outside or may provide the RF receive signal RF_R received from the outside to the duplexer 400. For example, the antenna ANT may include, but is not limited to, an array antenna.

In an embodiment, each of the MODEM 100, the supply modulator 300, the RFIC 200, the power amplifier PA, and the duplexer 400 may be implemented with an integrated circuit, a chip, or a module. Also, the MODEM 100, the supply modulator 300, the RFIC 200, the power amplifier PA, and the duplexer 400 may be mounted together on a printed circuit board (PCB). However, the technical idea of the present disclosure is not limited thereto. In some embodiments, at least a part of the MODEM 100, the supply modulator 300, the RFIC 200, the power amplifier PA, and the duplexer 400 may be implemented with a single communication chip.

In addition, the wireless communication apparatus 1 illustrated in FIG. 1 may be included in a wireless communication system that uses a cellular network such as 5G, LTE and may also be included in a wireless local area network (WLAN) system or any other wireless communication system. In an embodiment, a configuration of the wireless communication apparatus 1 illustrated in FIG. 1 is, but is not limited to, an exemplary embodiment, and may be variously configured in compliance with a communication protocol or a communication scheme.

FIG. 3 is a block diagram illustrating a wireless communication apparatus according to another embodiment of the present disclosure.

A wireless communication apparatus 2 has the same configuration, function, and effect as the wireless communication apparatus 1 except for the description associated with the analog envelope signal A_ENV, and thus, a difference will be mainly described.

Referring to FIG. 3, a wireless communication apparatus 2 according to another embodiment of the present disclosure may include the MODEM 100, the RFIC 200, the supply modulator 300, the duplexer 400, the power amplifier PA, and the antenna ANT.

The MODEM 100 may process the baseband signal BB_T through the first digital transmission processing unit 110 in compliance with a given communication scheme. The MODEM 100 may provide the processed baseband signal BB_T to the RFIC 200 through a digital interface DI. Also, the MODEM 100 may extract an envelope of the baseband signal BB_T through the first digital transmission processing unit 110 and may generate the average power signal D_REF based on the extracted envelope.

Here, the average power signal D_REF may be provided to the supply modulator 300 as a reference voltage signal. That is, the average power signal D_REF output from the MODEM 100 may be a digital signal. As such, the average power signal D_REF may be provided to a digital-to-analog converter included in the supply modulator 300 through the MIPI 130 and may be converted into an analog signal, for example, the reference voltage signal through the digital-to-analog converter included in the supply modulator 300. In an embodiment, the digital-to-analog converters DAC1 and DAC2 included in the RFIC 200 may operate at a speed higher than the digital-to-analog converter included in the supply modulator 300.

The MODEM 100 may provide the RFIC 200 with the baseband signal BB_T through the digital interface DI. Also, the RFIC 200 may extract an envelope of the baseband signal BB_T through a second digital transmission processing unit 205 included therein and may generate the digital envelope signal D_ENV based on the extracted envelope.

The RFIC 200 may perform digital-to-analog conversion on the baseband signal BB_T and the digital envelope signal D_ENV by using the plurality of digital-to-analog converters DAC1 and DAC2 and may generate the transmit signal TX and the analog envelope signal A_ENV as analog signals. Also, the RFIC 200 may generate the RF input signal RF_IN by performing frequency up-conversion on the transmit signal TX through the transmission circuit TXC and may provide the analog envelope signal A_ENV to the supply modulator 300.

The supply modulator 300 may generate a modulated voltage, the level of which varies dynamically, based on the analog envelope signal A_ENV and the average power signal D_REF and may provide the modulated voltage to the power amplifier PA as the power supply voltage.

In detail, the MODEM 100 may provide the supply modulator 300 with the average power signal D_REF and the RFIC 200 may provide the supply modulator 300 with the analog envelope signal A_ENV. The supply modulator 300 may be driven in the tracking mode corresponding to one of the ET mode and the APT mode based on the average power signal D_REF and the analog envelope signal A_ENV thus provided and may generate the dynamically variable output voltage. Also, the supply modulator 300 may supply the generated output voltage to the power amplifier PA as the power supply voltage.

Here, the supply modulator 300 may be provided with the analog envelope signal A_ENV from the RFIC 200 when driven in the ET mode and may be provided with the average power signal D_REF from the MODEM 100 when the average power signal D_REF is updated at an internal register (not illustrated).

In an embodiment, a configuration of the wireless communication apparatus 2 illustrated in FIG. 3 is, but is not limited to, an exemplary embodiment, and may be variously configured in compliance with a communication protocol or a communication scheme.

The wireless communication apparatuses 1 and 2 according to some embodiments of the present disclosure have the above configurations and features. Below, a first example of a supply modulator included in each of the wireless communication apparatuses 1 and 2 according to some embodiments of the present disclosure will be described with reference to FIGS. 4 to 16B.

Figure 5:
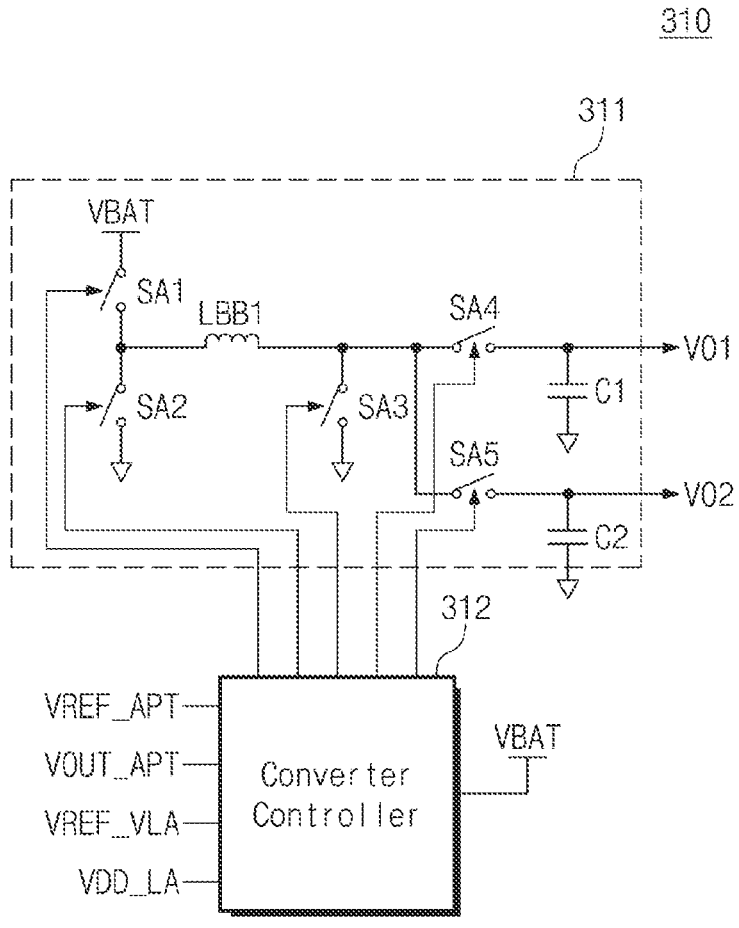
FIG. 5 is a circuit diagram illustrating a single inductor multiple output converter illustrated in FIG. 4.
Figure 6:
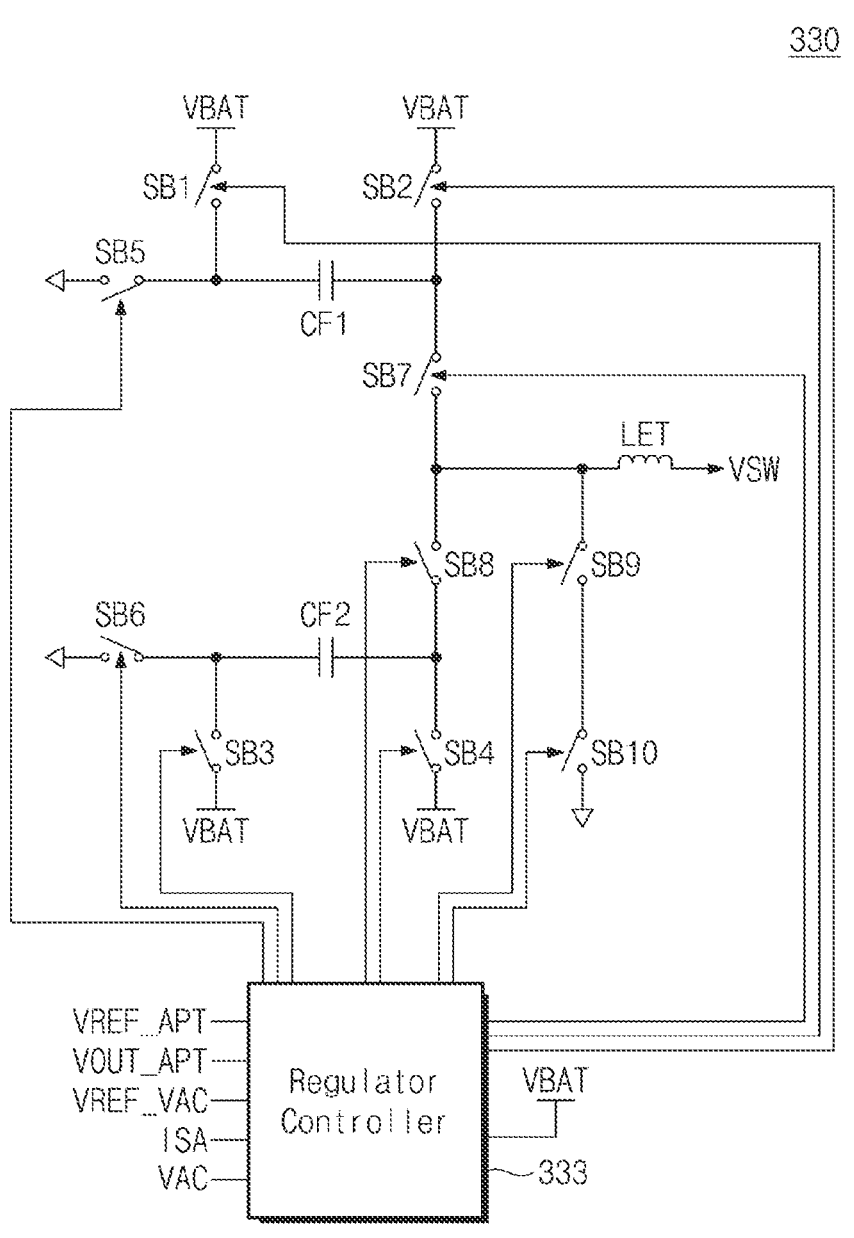
FIG. 6 is a circuit diagram illustrating a switching regulator illustrated in FIG. 4.
Figure 7:
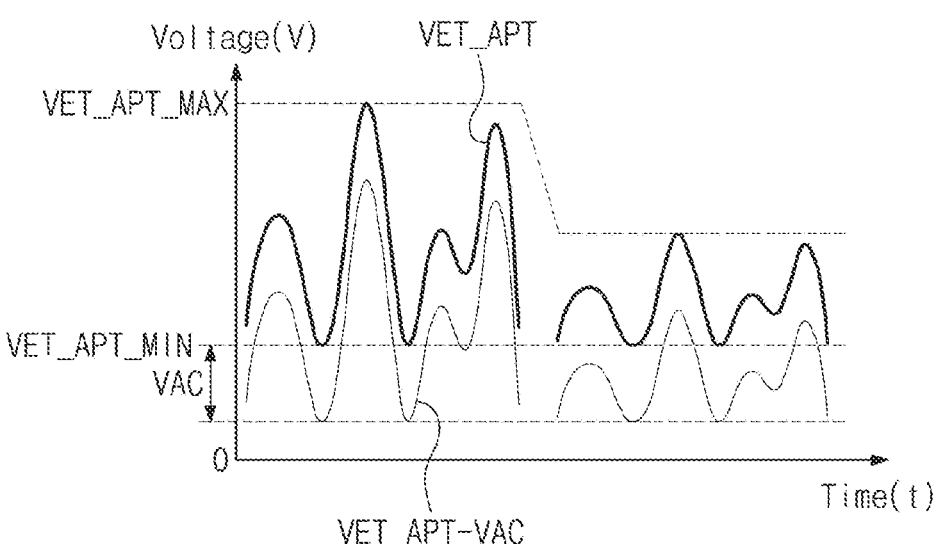
FIG. 7 is a graph illustrating a mechanism in which efficiency of a supply modulator is improved by an AC coupling capacitor illustrated in FIG. 4.
Figure 8:
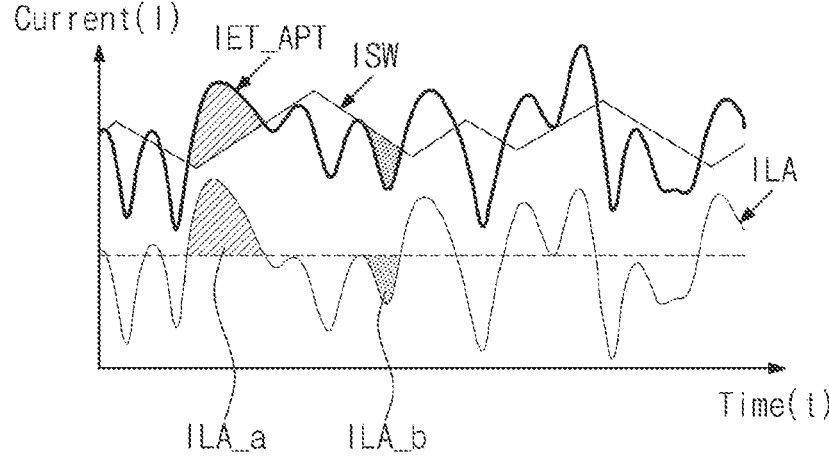
FIG. 8 is a graph illustrating a mechanism in which an output voltage is generated in an envelope tracking mode.
Figure 9A:
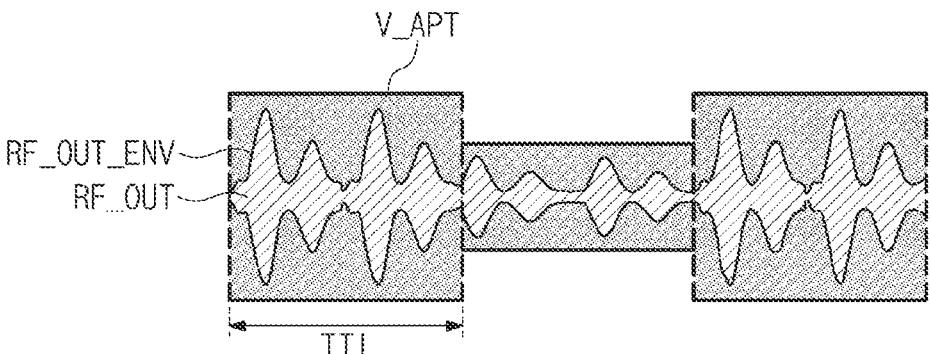
FIGS. 9A to 10 are diagrams illustrating waveform characteristics of an output voltage according to a tracking mode.
Figure 14A:
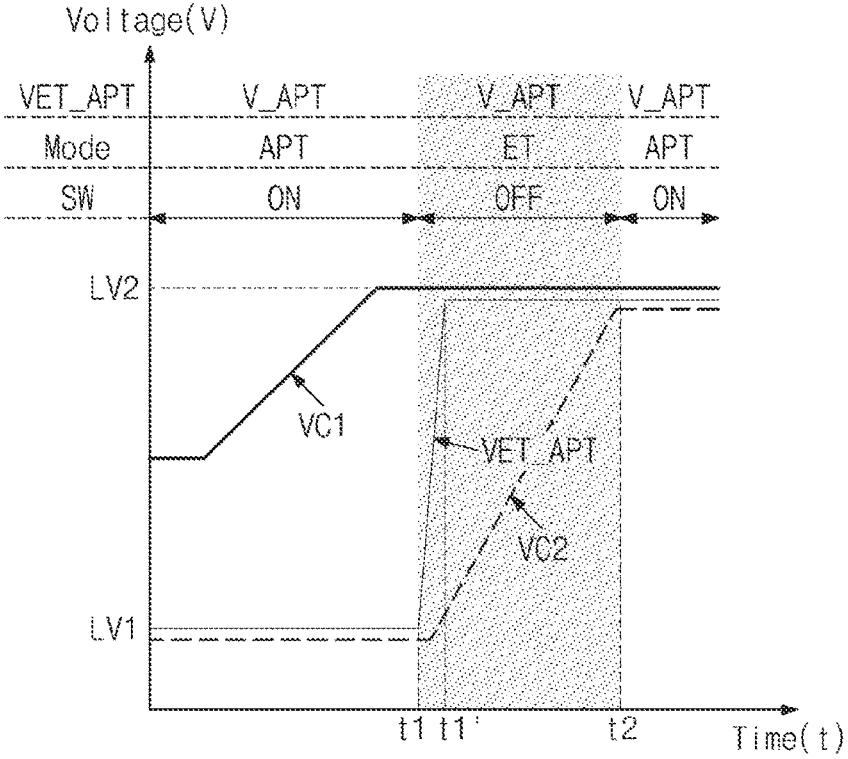
FIGS. 14A and 14B are graphs illustrating a mechanism in which a voltage level of a second modulation voltage varies.
Figure 14B:
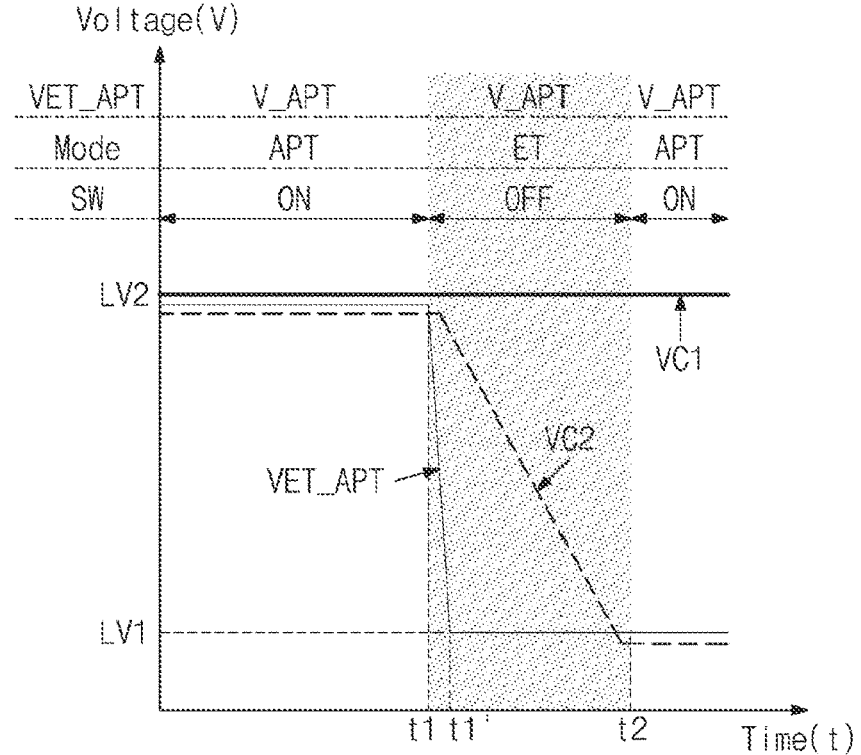
Figure 15A:
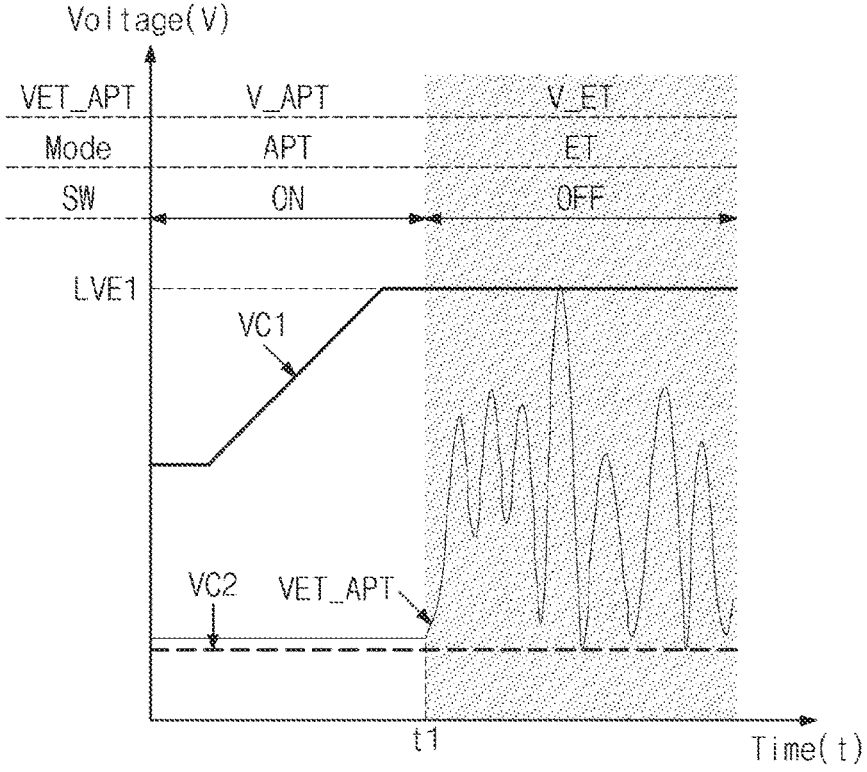
FIGS. 15A and 15B are graphs illustrating a mechanism in which an output voltage varies when a mode is switched from an average power tracking mode to an envelope tracking mode.
Figure 15B:
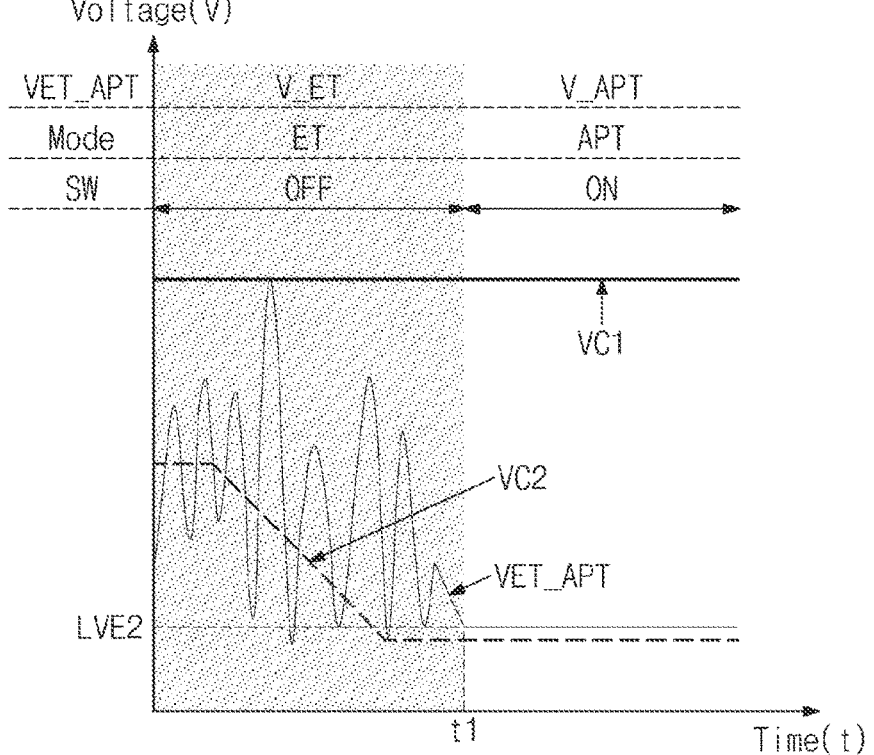
Figure 16A:
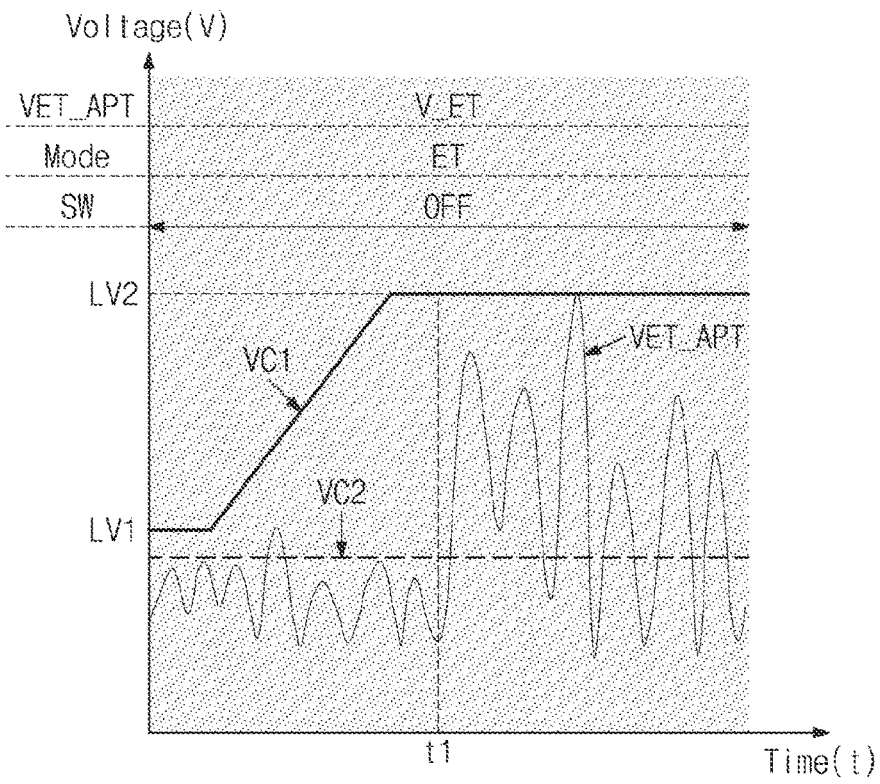
FIGS. 16A and 16B are graphs illustrating a mechanism in which an output voltage varies in an envelope tracking mode.
Figure 16B:
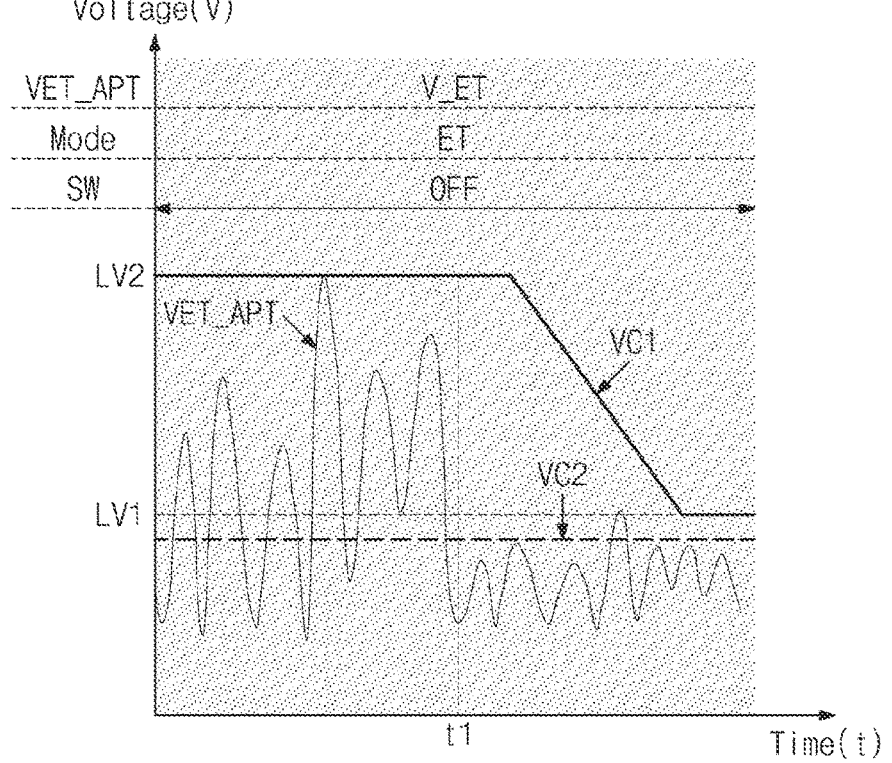

FIG. 4 is a circuit diagram illustrating a first example of a supply modulator included in a wireless communication apparatus according to some embodiments of the present disclosure. FIG. 5 is a circuit diagram illustrating a single inductor multiple output converter illustrated in FIG. 4. FIG. 6 is a circuit diagram illustrating a switching regulator illustrated in FIG. 4. FIG. 7 is a graph illustrating a mechanism in which efficiency of a supply modulator is improved by an alternating current (AC) coupling capacitor illustrated in FIG. 4. FIG. 8 is a graph illustrating a mechanism in which an output voltage is generated in an envelope tracking mode. FIGS. 9A to 10 are diagrams illustrating waveform characteristics of an output voltage according to a tracking mode. FIG. 11 is a diagram illustrating an average power tracking mode operation of a supply modulator of FIG. 4. FIG. 12 is a diagram illustrating an envelope tracking mode operation of a supply modulator of FIG. 4. FIG. 13 is a diagram illustrating a capacitor charging operation performed by a supply modulator of FIG. 4 to maintain a voltage level of a modulation voltage generated according to average power tracking. FIGS. 14A and 14B are graphs illustrating a mechanism in which a voltage level of a second modulation voltage varies. FIGS. 15A and 15B are graphs illustrating a mechanism in which an output voltage varies when a mode is switched from an average power tracking mode to an envelope tracking mode. FIGS. 16A and 16B are graphs illustrating a mechanism in which an output voltage varies in an envelope tracking mode.

In an embodiment, below, for convenience of description, it is assumed that a supply modulator 300-1 is implemented with the supply modulator 300 of the wireless communication apparatus 2 illustrated in FIG. 3.

Referring to FIG. 4, the first example 300-1 of a supply modulator according to an embodiment of the present disclosure may include a single inductor multiple output buck-boost converter (hereinafter referred to as an "SIMO converter") 310, a switching regulator 330, a linear regulator LA, a noise reduction unit 370, a feedback unit 390, an AC coupling capacitor CAC, a switch SW, a plurality of digital-to-analog converters DAC_a, DAC_b, and DAC_c, and a main controller 360.

The SIMO converter 310 may selectively operate with the switching regulator 330 for the purpose of generating an output voltage VET_APT in the APT mode and may operate to provide the power supply voltage to the linear regulator LA in the ET mode. Also, the SIMO converter 310 may include: (1) a first capacitor C1 that is connected with a power supply terminal of the linear regulator LA and is charged/discharged for a change of the tracking mode or a magnitude change of the output voltage VET_APT and (2) a second capacitor C2 that is selectively connected with an output terminal of the linear regulator LA through the switch SW and is charged/discharged for a change of the tracking mode or a magnitude change of the output voltage VET_APT. The SIMO converter 310 may be controlled by the main controller 360.

Here, that the SIMO converter 310 selectively operates with the switching regulator 330 means that only one of the SIMO converter 310 and the switching regulator 330 operates in the APT mode to generate the output voltage VET_APT.

Also, that the second capacitor C2 is selectively connected with the output terminal of the linear regulator LA through the switch SW means that the second capacitor C2 is connected with or disconnected from the output terminal of the linear regulator LA depending on a turn-on or a turn-off of the switch SW.

D1 and D_REF of digital signals provided from the MODEM 100 may be converted into reference voltage signals VREF_VLA and VREF_APT through the digital-to-analog converters DAC_a and DAC_b, respectively. Also, the reference voltage signals VREF_VLA and VREF_APT respectively converted through the digital-to-analog converters DAC_a and DAC_b may be provided to the SIMO converter 310.

In an embodiment, the digital signal D1 that forms the basis of the reference voltage signal VREF_VLA may indicate a reference power supply voltage value that is necessary for the linear regulator LA and is set in advance by the MODEM 100 based on an operation state of the supply modulator 300-1 and may be used for comparison with VDD_LA at the supply modulator 300. For example, the digital signal D1 may be provided from the MODEM 100 to the supply modulator 300-1 through an MIPI (e.g., 130 of FIG. 3).

An embodiment of the present disclosure will be described in which the plurality of digital signals D1, D2, and D_REF and the plurality of reference voltage signals VREF_VLA, VREF_APT, and VREF_VAC are used.

The SIMO converter 310 may generate and output a plurality of voltages VO1 and VO2 based on the plurality of reference voltage signals VREF_VLA and VREF_APT. That is, the SIMO converter 310 may step up or step down an input voltage (i.e., a power (e.g., VBAT of FIG. 5) provided from a battery) based on the plurality of reference voltage signals VREF_VLA and VREF_APT and may generate and output the plurality of voltages VO1 and VO2.

In detail, the SIMO converter 310 may provide one voltage (e.g., the first voltage VO1) to the linear regulator LA as a power supply voltage and may provide the other voltage (e.g., the second voltage VO2) to a power amplifier (e.g., PA of FIG. 3) as the output voltage VET_APT.

In an embodiment, the reference voltage signals VREF_VLA and VREF_APT may be generated every transmission time interval (hereinafter referred to as a "TTI") (e.g., a TTI unit of 4G and LTE being a sub-frame and a TTI unit of 5G being a slot) of a baseband signal (e.g., BB_T of FIG. 3). Accordingly, levels of the plurality of reference voltage signals VREF_VLA and VREF_APT may vary every TTI, and level of the plurality of voltages VO1 and VO2 that respectively correspond to the plurality of reference voltage signals VREF_VLA and VREF_APT may also vary every TTI. As such, the levels of the plurality of voltages VO1 and VO2 may dynamically vary.

Referring to FIG. 5, an exemplary configuration of the SIMO converter 310 is illustrated. In detail, the SIMO converter 310 may include a conversion circuit 311 and a converter controller 312.

The conversion circuit 311 may include one inductor LBB1, a plurality of conversion switches SA1, SA2 and SA3, a plurality of output switches SA4 and SA5, and a plurality of capacitors C1 and C2. As such, the conversion circuit 311 may be implemented with a buck-boosting converter that bucks (or steps down) or boosts (or steps up) the input voltage VBAT. Also, the conversion circuit 311 may generate the plurality of voltages VO1 and VO2 under control of the converter controller 312. The plurality of capacitors C1 and C2 may uniformly maintain voltage levels of the plurality of voltages VO1 and VO2.

For example, the plurality of capacitors C1 and C2 may be load capacitors and a capacity of each of the plurality of capacitors C1 and C2 may be from several to hundreds of uF (microfarads). Also, the plurality of capacitors C1 and C2 may not be included in the SIMO converter 310. That is, the plurality of capacitors C1 and C2 may be provided outside the SIMO converter 310. However, for convenience of description, an embodiment of the present disclosure will be described in which the plurality of capacitors C1 and C2 are provided within the SIMO converter 310.

The converter controller 312 may generate switching control signals for controlling the plurality of switches SA1 to SA5 based on the plurality of reference voltage signals VREF_APT and VREF_VLA. The plurality of voltages VO1 and VO2 may be generated as the plurality of switches SA1 to SA5 are turned on or turned off by the switching control signals.

In detail, the converter controller 312 may generate the switching control signals for controlling the plurality of switches SA1 to SA5 by using a pulse width modulation (PWM) or a pulse frequency modulation (PFM) scheme based on the plurality of reference voltage signals VREF_APT and VREF_VLA. The plurality of voltages VO1 and VO2 having a desired level may be generated as the plurality of switches SA1 to SA5 are turned on or turned off by the switching control signals. Also, as levels of the plurality of voltages VO1 and VO2 are fed back to the converter controller 312 (i.e., VO1 being fed back as VDD_LA and VO2 being fed back as VOUT_APT), the converter controller 312 may control the switching control signals such that each of the plurality of voltages VO1 and VO2 is set to a desired level.

In an embodiment, the configuration of the SIMO converter 310 illustrated in FIG. 5 is, but is not limited to, only an exemplary embodiment.

Returning to FIG. 4, the linear regulator LA may operate to generate the output voltage VET_APT in the ET mode. Also, the linear regulator LA may be controlled by the main controller 360.

In detail, the linear regulator LA may be provided with an analog envelope signal (e.g., A_ENV of FIG. 3) from an RFIC (e.g., 200 of FIG. 3) and may be provided with the first voltage VO1 from the SIMO converter 310 as a power supply voltage. Also, the linear regulator LA may amplify and output the provided analog envelope signal (e.g., A_ENV of FIG. 3). As such, in the ET mode, the linear regulator LA may operate in parallel with the switching regulator 330 to generate the output voltage VET_APT.

The linear regulator LA may be connected in parallel with the switching regulator 330 and, for example, may be implemented with a linear amplifier. Also, the linear regulator LA may be implemented with a differential amplifier as illustrated in FIG. 4 and may receive a positive signal ENV_P and a negative signal ENV_N of the analog envelope signal (e.g., A_ENV of FIG. 3) through a positive terminal (+) and a negative terminal (−), respectively. An output of the linear regulator LA may be fed back to the negative terminal (−) of the linear regulator LA through the feedback unit 390, and thus, an output level of the linear regulator LA may be adjusted to a desired level. That is, the feedback unit 390 may allow a voltage VLA output from the linear regulator LA and the voltage VO1 input to the linear regulator LA to have a linear relationship such that the output level of the linear regulator LA is set to a desired level.

The switching regulator 330 may operate together with the linear regulator LA for the purpose of generating the output voltage VET_APT in the ET mode and may selectively operate with the SIMO converter 310 for the purpose of generating the output voltage VET_APT in the APT mode. Also, the switching regulator 330 may be controlled by the main controller 360.

In detail, in the ET mode, the switching regulator 330 may operate in parallel with the linear regulator LA. That is, the switching regulator 330 may increase or decrease the output voltage VET_APT by controlling a turn-on or a turn-off of a switch (i.e., SB1 to SB10 of FIG. 6) included therein, based on the reference voltage signal VREF_VAC provided through the digital-to-analog converter DAC_c, a sensing signal ISA of a current ILA output from the linear regulator LA, and a voltage VAC of the AC coupling capacitor CAC.

Meanwhile, in the APT mode, when not the SIMO converter 310 but the switching regulator 330 operates, the switching regulator 330 may independently regulate an input voltage (i.e., a power (e.g., VBAT of FIG. 6) provided from a battery) to a target level. The switching regulator 330 may provide a regulated voltage VSW to the power amplifier (e.g., PA of FIG. 3) as the output voltage VET_APT.

In an embodiment, D_REF and D2 of the digital signals provided from the MODEM 100 may be converted into reference voltage signals VREF_APT and VREF_VAC through digital-to-analog converters DAC_b and DAC_c, respectively. The converted reference voltage signals VREF_APT and VREF_VAC may be provided to the switching regulator 330.

In an embodiment, the digital signal D2 that forms the basis of the reference voltage signal VREF_VAC may indicate a reference voltage value that is set in advance by the MODEM 100 based on an operation state of the supply modulator 300-1 and may be used for comparison with VAC at the switching regulator 330. For example, the digital signal D2 of VREF_VAC may be provided from the MODEM 100 to the supply modulator 300-1 through the MIPI (e.g., 130 of FIG. 3).

As such, the switching regulator 330 may generate the modulation voltage VSW by using the reference voltage signals VREF_APT and VREF_VAC when driven in the APT mode or the ET mode.

Meanwhile, for example, the switching regulator 330 may include, but is not limited to, a dual-phase hybrid buck-boost converter. That is, the switching regulator 330 may include a buck converter, a boost converter, a buck-boost converter, a ćuk converter, or any other DC-DC converter.

Referring to FIG. 6, an exemplary configuration of the switching regulator 330 is illustrated. The switching regulator 330 may include a regulator controller 333, a plurality of switches SB1 to SB10, an inductor LET, and a plurality of capacitors CF1 and CF2.

The plurality of switches SB1 to SB10, the inductor LET, and the plurality of capacitors CF1 and CF2 may constitute a buck-boost converter and may decrease or increase the input voltage VBAT.

For example, the plurality of capacitors CF1 and CF2 may be, but is not limited to, a flying capacitor. Also, the inductor LET may be a power inductor for supporting an ET mode operation of the switching regulator 330. As such, unlike an inductor (e.g., LBB1 of FIG. 5) of the SIMO converter 310, the inductor LET may be connected with an output terminal of a converter structure to perform a role of supporting a continuous current waveform.

In an embodiment, the inductor LET may not be included in the switching regulator 330. That is, the inductor LET may be provided outside the switching regulator 330. However, for convenience of description, an embodiment of the present disclosure will be described in which the inductor LET is included in the switching regulator 330.

The regulator controller 333 may generate switching control signals for controlling the plurality of switches SB1 to SB10 based on the plurality of reference voltage signals VREF_APT and VREF_VAC and the sensing signal ISA of the output current ILA of the linear regulator LA. As such, the modulation voltage VSW may be generated as the plurality of switches SB1 to SB10 are respectively turned on or turned off by the switching control signals.

In detail, as the regulator controller 333 controls signals for controlling the switches SB1 to SB10 by using the PWM or PFM scheme based on the plurality of reference voltage signals VREF_APT and VREF_VAC and the sensing signal ISA, the modulation voltage VSW of a desired level may be generated. Also, as a level of the modulation voltage VSW is fed back to the regulator controller 333 (i.e., VSW being fed back as VOUT_APT) in the APT mode and a level of the voltage VAC of the AC coupling capacitor CAC is fed back to the regulator controller 333 in the ET mode, the regulator controller 333 may control the switches SB1 to SB10 such that the level of the modulation voltage VSW is set to a desired level.

That is, in the APT mode, the regulator controller 333 may compare the reference voltage signal VREF_APT and a current modulation voltage VSW (i.e., VOUT_APT) to adjust a switching control signal. Also, in the ET mode, the regulator controller 333 may adjust a switching control signal based on the reference voltage signal VREF_VAC, the voltage VAC of the AC coupling capacitor CAC, and the sensing signal ISA.

In an embodiment, the case where the sensing signal ISA indicates that a direction of the output current ILA of the linear regulator LA has an output direction (e.g., that a current is output from the linear regulator LA) may mean that an output current amount of the switching regulator 330 is smaller than a necessary current amount for the power amplifier (e.g., PA of FIG. 3) and thus the linear regulator LA is supplying an additional current to the power amplifier (e.g., PA of FIG. 3).

In contrast, the case where the sensing signal ISA indicates that a direction of the output current ILA of the linear regulator LA has an input direction (e.g., that a current is applied to the linear regulator LA) may mean that an output current amount of the switching regulator 330 is greater than a necessary current amount for the power amplifier (e.g., PA of FIG. 3) and thus the linear regulator LA is draining (or absorbing) a surplus current. This will be more fully described below.

In an embodiment, the configuration of the switching regulator 330 illustrated in FIG. 6 is, but is not limited to, only an exemplary embodiment.

Returning to FIG. 4, the noise reduction unit 370 may be provided with the analog envelope signals ENV_P and ENV_N from the RFIC (e.g., 200 of FIG. 3) and may remove a noise of the provided analog envelope signals ENV_P and ENV_N so as to be provided to the linear regulator LA. Also, the noise reduction unit 370 may be controlled by the main controller 360. For example, the noise reduction unit 370 may include a low pass filter or an input buffer. In an embodiment, the low pass filter is characterized in that a specific gain value is obtained while removing a high-frequency noise of an image signal or a baseband of a digital-to-analog converter. The input buffer is characterized in that a wide band characteristic is implemented by a wide cover bandwidth even though noise reduction performance is lower than that of the low pass filter.

In addition, the noise reduction unit 370 may further include an average power tracking signal generator that controls the linear regulator LA such that the linear regulator LA outputs a voltage (i.e., a DC voltage) of a uniform level in the ET mode.

As such, to control the linear regulator LA such that the linear regulator LA outputs a voltage (i.e., a DC voltage) of a uniform level in the ET mode, the average power tracking signal generator in the noise reduction unit 370 may be provided with the reference voltage signal VREF_APT from the digital-to-analog converter DAC_b. The average power tracking signal generator in the noise reduction unit 370 may generate a control signal (e.g., a DC input voltage of a uniform level) for controlling the linear regulator LA based on the provided reference voltage signal VREF_APT. Of course, the average power tracking signal generator in the noise reduction unit 370 may provide the generated control signal to the linear regulator LA.

That is, in the case of removing a noise of the analog envelope signals ENV_P and ENV_N so as to be provided to the linear regulator LA, the noise reduction unit 370 may operate as a low pass filter or an input buffer. In contrast, in the case of controlling the linear regulator LA such that the linear regulator LA outputs a voltage of a uniform level in the ET mode, the noise reduction unit 370 may operate as the average power tracking signal generator. This operation of the noise reduction unit 370 may be controlled by the main controller 360.

Meanwhile, the main controller 360 may decide the tracking mode and may control at least one of the switch SW, the linear regulator LA, the switching regulator 330, the SIMO converter 310, and the noise reduction unit 370 based on the decided tracking mode. In detail, the main controller 360 may be provided with a tracking mode decision signal from the MODEM 100 through the MIPI (e.g., 130 of FIG. 3) and may decide the tracking mode of the supply modulator 300-1 based on the provided tracking mode decision signal.

As such, when the tracking mode is decided to be the ET mode, the main controller 360 may turn off the switch SW and may control a parallel operation of the linear regulator LA and the switching regulator 330. In this case, the linear regulator LA and the switching regulator 330 may together generate a modulation voltage (hereinafter referred to a "first modulation voltage") according to an ET and may provide the generated first modulation voltage to the power amplifier (e.g., PA of FIG. 3) as the output voltage VET_APT.

In contrast, when the tracking mode is decided to be the APT mode, the main controller 360 may turn on the switch SW and may control an output voltage generating operation of one of the SIMO converter 310 and the switching regulator 330. In this case, one of the linear regulator LA and the switching regulator 330 may generate a modulation voltage (hereinafter referred to a "second modulation voltage") according to an APT and may provide the generated second modulation voltage to the power amplifier (e.g., PA of FIG. 3) as the output voltage VET_APT.

The main controller 360 may be provided with various signals (e.g., various control signals such as an output voltage magnitude signal) from the MODEM 100 through the MIPI (e.g., 130 of FIG. 3) as well as the tracking mode decision signal and may control at least one of the switch SW, the linear regulator LA, the switching regulator 330, the SIMO converter 310, the noise reduction unit 370, and the feedback unit 390 based on the provided signals.

The AC coupling capacitor CAC may be connected between an output terminal of the linear regulator LA and an output terminal of the supply modulator 300-1 to decrease a necessary amount of a power supply voltage of the linear regulator LA.

In detail, as illustrated in FIG. 7, because an output voltage level of the linear regulator LA necessary to achieve a target output voltage is decreased by as much as the voltage VAC of the AC coupling capacitor CAC (i.e., because a necessary output voltage level of the linear regulator LA is "VET_APT-VAC"), a power supply voltage that the linear regulator LA requires may also be decreased. That is, as a necessary amount of the power supply voltage of the linear regulator LA is decreased through the AC coupling capacitor CAC, the overall power efficiency of the supply modulator 300-1 may be improved.

However, the AC coupling capacitor CAC may not be an essential component of the supply modulator 300-1 and may thus be omitted. However, an embodiment of the present disclosure will be described in which the supply modulator 300-1 includes the AC coupling capacitor CAC.

Meanwhile, the supply modulator 300-1 may further include an additional capacitor CET, an oscillator (not illustrated), and a bandgap reference circuit (not illustrated), etc. in addition to the above components.

In detail, the additional capacitor CET may be connected with a node between the output terminal of the linear regulator LA and the output terminal of the supply modulator 300-1 and may remove a high-frequency noise and a parasitic capacitance that may be present in a circuit of the supply modulator 300-1. Also, the oscillator is a circuit that may necessarily use an NMOS structure (i.e., a gate-boosted NMOS structure) for the purpose of improving a characteristic of the switch SW. The bandgap reference circuit is a circuit supplying a reference voltage or a reference current necessary for each component to operate and may have almost no influence of process, voltage, and temperature variations.

As such, the supply modulator 300-1 may have the above configuration and characteristic. Also, the supply modulator 300-1 may be driven in one tracking mode of the ET mode and the APT mode based on the above configuration and characteristic and may provide the output voltage VET_APT to the power amplifier (e.g., PA of FIG. 3).

A mechanism in which the supply modulator 300-1 generates the output voltage VET_APT in the ET mode is illustrated in FIG. 8.

Referring to FIGS. 4 and 8, in the ET mode the switching regulator 330 may supply an output current ISW based on the reference voltage signal VREF_APT. When a magnitude of the output current ISW of the switching regulator 330 is smaller than a magnitude of a current IET_APT that the power amplifier (e.g., PA of FIG. 3) requires, the linear regulator LA may supply an additional current ILA_a to the power amplifier (e.g., PA of FIG. 3). In contrast, when the magnitude of the output current ISW of the switching regulator 330 is greater than the magnitude of the current IET_APT that the power amplifier (e.g., PA of FIG. 3) requires, the linear regulator LA may drain (or absorb) a surplus current ILA_b. In an embodiment, the operation of the switching regulator 330 in the ET mode is more fully described with reference to FIG. 6 above.

Figure 9B:
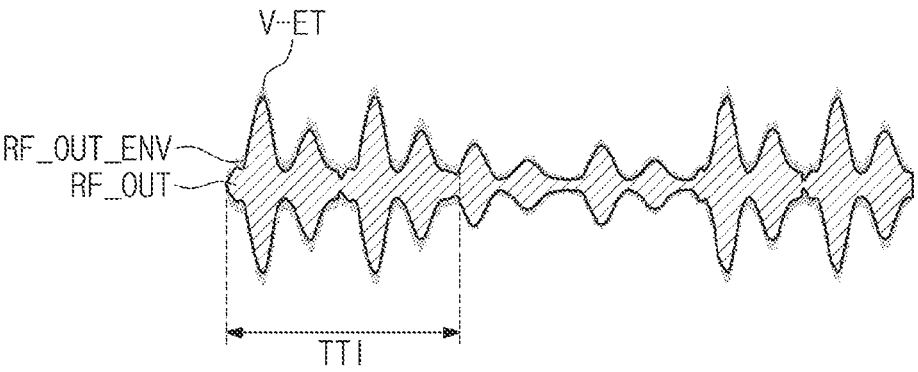
Figure 10:
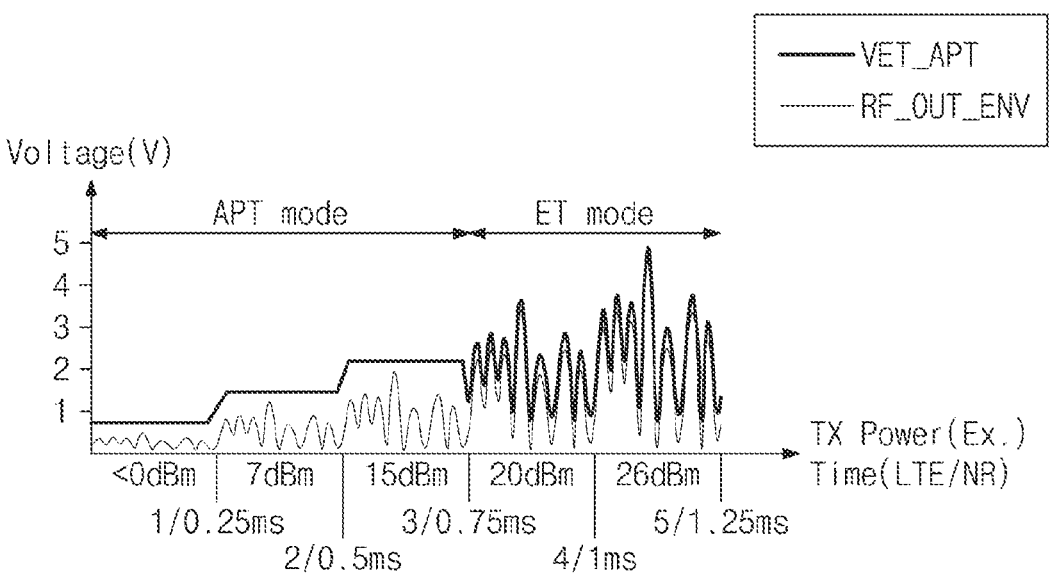

Waveform characteristics of an output voltage according to a tracking mode are illustrated in FIGS. 9A and 9B.

First, FIG. 9A conceptually illustrates the APT in which a modulation voltage, varying based on a peak level of an envelope RF_OUT_ENV of an RF output signal (e.g., RF_OUT of FIG. 3) every transmission time interval (TTI), is applied to the power amplifier (e.g., PA of FIG. 3). FIG. 9B conceptually illustrates the ET in which a modulation voltage transiently following a level of the envelope RF_OUT_ENV of the RF output signal (e.g., RF_OUT of FIG. 3) is applied to the power amplifier (e.g., PA of FIG. 3).

In an embodiment, the envelope RF_OUT_ENV of the RF output signal (e.g., RF_OUT of FIG. 3) may be generated based on an amplitude (or magnitude) of the RF output signal (e.g., RF_OUT of FIG. 3).

As illustrated in FIG. 9A, the supply modulator 300-1 according to an embodiment of the present disclosure may generate a modulation voltage V_APT variable depending on the APT and may provide the modulation voltage V_APT to the power amplifier (e.g., PA of FIG. 3) as a power supply voltage. In addition, as illustrated in FIG. 9B, the supply modulator 300-1 according to an embodiment of the present disclosure may generate the modulation voltage V_ET variable depending on the ET and may provide the modulation voltage V_ET to the power amplifier (e.g., PA of FIG. 3) as a power supply voltage. Because a voltage difference between the RF output signal RF_OUT of the power amplifier (e.g., PA of FIG. 3) and the modulation voltage (i.e., a voltage provided to the power amplifier (e.g., PA of FIG. 3)) of the supply modulator 300-1 is decreased based on the above characteristic, it is possible to minimize a waste of energy and to improve a lifetime of a battery.

Meanwhile, in the case of power efficiency of the power amplifier (e.g., PA of FIG. 3), power efficiency in the ET mode may be higher than power efficiency in the APT mode. In contrast, in the case of power efficiency of the supply modulator 300-1, power efficiency in the APT mode may be higher than power efficiency in the ET mode. In an embodiment, overall power efficiency of a system, for example, efficiency of the wireless communication apparatus 2 of FIG. 3 may be proportional to a product of the power efficiency of the supply modulator 300-1 and the power efficiency of the power amplifier (e.g., PA of FIG. 3).

For this reason, in a high power region where a power level of the RF output signal RF_OUT (in detail, a transmit power of an antenna (e.g., ANT of FIG. 3)) is high, overall power efficiency of a system is higher in the ET mode than in the APT mode. In contrast, in a low power region where the power level of the RF output signal RF_OUT (in detail, a transmit power of an antenna (e.g., ANT of FIG. 3) is low), overall power efficiency of a system is higher in the APT mode than in the ET mode.

As such, as illustrated in FIG. 10, the supply modulator 300-1 may be driven in one of the ET mode and the APT mode selectively depending on a transmit power TX Power of the antenna (e.g., ANT of FIG. 3) and may generate the output voltage VET_APT. As such, the supply modulator 300-1 may be driven in the APT mode or the ET mode based on the above principle to generate the output voltage VET_APT, and an operation of the supply modulator 300-1 according to the tracking mode will be described with reference to FIGS. 11 to 13.

In an embodiment, in FIGS. 11 to 13, a portion marked by a bold line represents an operation enable path in the corresponding drawing. Each drawing will be described with reference to FIG. 4 together.

First, referring to FIG. 11, an operation of the supply modulator 300-1 in the APT mode is illustrated.

The main controller 360 may be provided with an APT mode decision signal from the MODEM 100 and may decide the APT mode of the supply modulator 300-1 based on the provided APT mode decision signal.

In this case, the main controller 360 may turn on the switch SW based on the decided tracking mode. Also, one of the SIMO converter 310 and the switching regulator 330 may generate the second modulation voltage VO2 or VSW according to the APT under control of the main controller 360 and may provide the generated second modulation voltage VO2 or VSW to the power amplifier (e.g., PA of FIG. 3) as the output voltage VET_APT.

In detail, to generate the second modulation voltage VSW according to the APT, the switching regulator 330 may be provided with the reference voltage signal VREF_APT from the digital-to-analog converter DAC_b. The switching regulator 330 may compare the reference voltage signal VREF_APT and the current output voltage VOUT_APT. Here, the current output voltage VOUT_APT, which is a current voltage value of VSW, may be a voltage value of VET_APT according to a current tracking mode. The switching regulator 330 may generate the second modulation voltage VSW based on a comparison result. Also, the switching regulator 330 may provide the generated second modulation voltage VSW to the power amplifier (e.g., PA of FIG. 3) as the output voltage VET_APT. Of course, even when the switching regulator 330 generates the second modulation voltage VSW, the switch SW may be turned on.

Although not illustrated in the drawings, to generate the second modulation voltage VO2 according to the APT, the SIMO converter 310 may be provided with the reference voltage signal VREF_APT from the digital-to-analog converter DAC_b. The SIMO converter 310 may compare the reference voltage signal VREF_APT and the current output voltage VOUT_APT. Here, the current output voltage VOUT_APT, which is a current voltage value of VO2, may be a voltage value of VET_APT according to a current tracking mode. The SIMO converter 310 may generate the second modulation voltage VO2 based on a comparison result. Also, the SIMO converter 310 may provide the generated second modulation voltage VO2 to the power amplifier (e.g., PA of FIG. 3) as the output voltage VET_APT.

Next, referring to FIG. 12, an operation of the supply modulator 300-1 in the ET mode is illustrated.

The main controller 360 may be provided with an ET mode decision signal from the MODEM 100 and may decide the ET mode of the supply modulator 300-1 based on the provided ET mode decision signal.

In this case, the main controller 360 may turn off the switch SW based on the decided tracking mode. Also, the linear regulator LA and the switching regulator 330 may together generate the first modulation voltage according to the ET under control of the main controller 360 and may provide the generated first modulation voltage to the power amplifier (e.g., PA of FIG. 3) as the output voltage VET_APT.

In detail, the SIMO converter 310 may be provided with the reference voltage signal VREF_VLA from the digital-to-analog converter DAC_a. The SIMO converter 310 may compare the provided reference voltage signal VREF_VLA and a current output voltage (i.e., VO1 fed back as VDD_LA) of the SIMO converter 310. The SIMO converter 310 may generate the voltage VO1 to be provided to the linear regulator LA as a power supply voltage, based on a comparison result.

The linear regulator LA may be provided with the power supply voltage VO1 from the SIMO converter 310 and may be provided with the noise-free analog envelope signals ENV_P and ENV_N from the noise reduction unit 370. Also, the linear regulator LA may amplify and output the provided analog envelope signals ENV_P and ENV_N by using the power supply voltage VO1.

Here, an output of the linear regulator LA may be fed back to the negative terminal (−) of the linear regulator LA through the feedback unit 390, and thus, an output level of the linear regulator LA may be adjusted based on the feedback result.

The switching regulator 330 may be provided with the reference voltage signal VREF_VAC from the digital-to-analog converter DAC_c. Also, the switching regulator 330 may generate and output a current (e.g., ISW of FIG. 8) based on the provided reference voltage signal VREF_VAC, the sensing signal ISA of the current ILA output from the linear regulator LA, and the voltage VAC of the AC coupling capacitor CAC.

The output current (e.g., ISW of FIG. 8) of the switching regulator 330 and the output current (e.g., ILA) of the linear regulator LA, which are generated through the above procedure, may be combined, and the combined current may be provided to the power amplifier (e.g., PA of FIG. 3) as a current (e.g., IET_APT of FIG. 8) forming the power supply voltage VET_APT.

Finally, referring to FIG. 13, an operation of the supply modulator 300-1 for maintaining a voltage level of the output voltage VET_APT when the tracking mode is changed is illustrated. In detail, FIG. 13 illustrates an operation state of the supply modulator 300-1 before the tracking mode is changed from the ET mode to the APT mode while maintaining a voltage level of the second modulation voltage, in a state where the second modulation voltage (i.e., a modulation voltage according to the APT) is provided to the power amplifier (e.g., PA of FIG. 3) as the output voltage VET_APT in the ET mode.

Because the tracking mode is not yet changed to the APT mode, like the ET mode described above, the main controller

360 may maintain the switch SW in a turn-off state and may operate the switching regulator 330 and the linear regulator LA in parallel (or together). The main controller 360 may control the SIMO converter 310 such that the SIMO converter 310 provides the power supply voltage VO1 to the linear regulator LA.

However, because the second modulation voltage is being supplied to the power amplifier (e.g., PA of FIG. 3) in the ET mode, the main controller 360 may operate the noise reduction unit 370 as the average power tracking signal generator. As such, the noise reduction unit 370 may be provided with the reference voltage signal VREF_APT from the digital-to-analog converter DAC_b. The noise reduction unit 370 may control the linear regulator LA based on the provided reference voltage signal VREF_APT such that the voltage VLA output from the linear regulator LA is maintained at a voltage (i.e., a DC voltage) of a uniform level.

To allow a voltage level of the second modulation voltage to be maintained when the tracking mode is changed from the ET mode to the APT mode, the SIMO converter 310 may in advance charge the second capacitor C2 before a change of the tracking mode such that the voltage VO2 of the second capacitor C2 is set to a current voltage level of the second modulation voltage (i.e., a current voltage level of the output voltage VET_APT).

As such, afterward, when the tracking mode is changed from the ET mode to the APT mode, the switch SW may be turned on, and thus, the voltage VO2 of the second capacitor C2 may be applied to the power amplifier (e.g., PA of FIG. 3) as the second modulation voltage (i.e., the output voltage VET_APT).

As described above, the supply modulator 300-1 may operate in the APT mode or the ET mode based on the above principle, and a mechanism in which an output voltage varies in each tracking mode will be described with reference to FIGS. 14A to 16B.

In an embodiment, a mechanism in which a voltage level of the second modulation voltage varies is illustrated in FIGS. 14A and 14B, a mechanism in which an output voltage varies when a mode is switched from the APT mode to the ET mode is illustrated in FIGS. 15A and 15B, and a mechanism in which an output voltage varies in the ET mode is illustrated in FIGS. 16A and 16B. The description will be given sequentially. Also, in each drawing, the description will be given under the assumption that a time interval unit by which a level of an output voltage is changed is the transmission time interval (TTI).

First, FIG. 14A illustrates how a voltage level of a second modulation voltage V_APT (i.e., a voltage level of the output voltage VET_APT) increases from a first voltage level LV1 to a second voltage level LV2 higher than the first voltage level LV1 in a state where the switch SW is turned on and the second modulation voltage V_APT (e.g., a voltage VC2 of the second capacitor C2 charged to the first voltage level LV1) is being supplied to the power amplifier (e.g., PA of FIG. 3) as the output voltage VET_APT.

Referring to FIGS. 4 and 14A, the MODEM 100 may provide the main controller 360 with an output voltage magnitude signal for changing a voltage level of the output voltage VET_APT from the first voltage level LV1 to the second voltage level LV2. In response to the output voltage magnitude signal, the SIMO converter 310 may charge a voltage VC1 (i.e., VO1) of the first capacitor C1 to the second voltage level LV2 in advance before a time point t1 when the voltage level of the second modulation voltage V_APT starts to change. At the time point t1 at which the voltage level of the second modulation voltage V_APT starts to change, the main controller 360 may turn off the switch SW and may change the tracking mode from the APT mode to the ET mode.

At t1, when the tracking mode is changed to the ET mode, the switch SW may be turned off under control of the main controller 360, and the voltage VC1 charged to the first capacitor C1 may be provided to the linear regulator LA as a power supply voltage. As such, the voltage level of the second modulation voltage V_APT may be quickly increased from the first voltage level LV1 to the second voltage level LV2.

In detail, when the tracking mode is changed to the ET mode, the linear regulator LA that is provided with VC1 as a power supply voltage may operate in parallel with the switching regulator 330 under control of main controller 360, and thus, the voltage level of the second modulation voltage V_APT may be quickly increased to the second voltage level LV2. That is, the voltage level of the second modulation voltage V_APT may quickly increase through the switching from the APT mode to the ET mode.

Next, FIG. 14A illustrates how the tracking mode is again changed from the ET mode to the APT mode while the voltage level of the second modulation voltage V_APT is maintained at the second voltage level LV2.

Referring to FIGS. 4 and 14A, under control of the main controller 360, the SIMO converter 310 may charge the second capacitor C2 from the first voltage level LV1 to the second voltage level LV2 from the time point t1 when the voltage level of the second modulation voltage V_APT starts to change. At the time point t2 at which the second capacitor C2 is completely charged to the second voltage level LV2, the main controller 360 may again turn on the switch SW and may again change the tracking mode from the ET mode to the APT mode.

Here, a period t1' to t2 where the voltage level of the second modulation voltage V_APT is maintained in the ET mode may be implemented by the noise reduction unit 370 that operates as the average power tracking signal generator to control the linear regulator LA. Of course, the noise reduction unit 370 may be controlled by the main controller 360.

Also, when the tracking mode is again changed to the APT mode, the switch SW may be turned on, and a voltage VC2 (i.e., VO2) charged to the second capacitor C2 may be provided to the power amplifier (e.g., PA of FIG. 3) as the second modulation voltage V_APT. As such, the voltage level of the second modulation voltage V_APT may be maintained at the second voltage level LV2.

In an embodiment, from a specific time point after t2, instead of the second capacitor C2, the switching regulator 330 may generate the second modulation voltage V_APT (of course, a modulation voltage of the second voltage level LV2) and may provide the output voltage VET_APT to the power amplifier (e.g., PA of FIG. 3). That is, after t2 and before a next change time point (e.g., a tracking mode change or an output voltage magnitude change), the voltage VC2 of the second capacitor C2 may continue to be provided to the power amplifier (e.g., PA of FIG. 3) as the output voltage VET_APT, or a voltage generated by the switching regulator 330 may be provided to the power amplifier (e.g., PA of FIG. 3) instead of the voltage VC2 of the second capacitor C2. However, in an embodiment of the present disclosure, a situation after t2 will be omitted.

As a result, as the tracking mode is again changed from the ET mode to the APT mode after the voltage level of the second modulation voltage V_APT increases, the tracking mode may again return to an original tracking mode (i.e., the APT mode matched with the second modulation voltage V_APT) before a voltage level is changed. That is, the voltage level of the second modulation voltage V_APT (i.e., a voltage level of the output voltage VET_APT) may be quickly increased and stabilized through the mechanism described above.

Together with the output voltage magnitude signal, the MODEM 100 may provide the main controller 360 with the tracking mode decision signal for changing the tracking mode from the APT mode to the ET mode at t1 and changing the tracking mode from the ET mode to the APT mode at t2.

In response to the tracking mode decision signal, the main controller 360 may switch from the APT mode to the ET mode at the time point t1 and may switch from the ET mode to the APT mode at the time point t2. Alternatively, in response to the output voltage magnitude signal, the main controller 360 may recognize a magnitude difference (i.e., LV1-LV2) of a change voltage and may perform the switching from the APT mode to the ET mode at the time point t1 and the switching from the ET mode to the APT mode at the time point t2 automatically without separately receiving the tracking mode decision signal. Of course, the main controller 360 may include various components for recognizing a magnitude difference of a change voltage. That is, the main controller 360 may change the tracking mode in the situation of FIG. 14A by using one of the two methods described above, and which method is implemented may be set in advance by the user/manufacturer.

Although at least two of VC1, VET_APT, and VC2 have the same voltage value in a specific period, FIG. 14A represents each of VC1, VET_APT, and VC2 with non-overlapping lines for better illustration and understanding.

FIG. 14B illustrates how a voltage level of the second modulation voltage V_APT (i.e., a voltage level of the output voltage VET_APT) decreases from the second voltage level LV2 to the first voltage level LV1 lower than the second voltage level LV2 in a state where the switch SW is turned on and the second modulation voltage V_APT (e.g., the voltage VC2 of the second capacitor C2 charged to the second voltage level LV2) is being supplied to the power amplifier (e.g., PA of FIG. 3) as the output voltage VET_APT.

Referring to FIGS. 4 and 14B, the MODEM 100 may provide the main controller 360 with the output voltage magnitude signal, for changing a voltage level of the output voltage VET_APT from the second voltage level LV2 to the first voltage level LV1, and may change the tracking mode from the APT mode to the ET mode at t1.

Here, when the tracking mode is changed to the ET mode at t1, the switch SW may be turned off under control of the main controller 360, and thus, the voltage level of the second modulation voltage V_APT may be quickly decreased to the first voltage level LV1 based on an analog envelope signal input to the linear regulator (e.g., LA of FIG. 3).

In detail, when the tracking mode is changed to the ET mode, the linear regulator LA may operate in parallel with the switching regulator 330 under control of main controller 360, and thus, the voltage level of the second modulation voltage V_APT may be quickly decreased to the first voltage level LV1.

Next, FIG. 14B illustrates how the tracking mode is again changed from the ET mode to the APT mode while the voltage level of the second modulation voltage V_APT is maintained at the first voltage level LV1.

Referring to FIGS. 4 and 14B, under control of the main controller 360, the SIMO converter 310 may discharge the voltage VC2 (i.e., VO2) of the second capacitor C2 from the second voltage level LV2 to the first voltage level LV1 from the time point t1 when the voltage level of the second modulation voltage V_APT starts to change. At the time point t2 at which the second capacitor C2 is completely discharged to the first voltage level LV1, the main controller 360 may again turn on the switch SW and may again change the tracking mode from the ET mode to the APT mode.

Here, the period t1' to t2 where the voltage level of the second modulation voltage V_APT is maintained in the ET mode may be implemented by the noise reduction unit 370 that operates as the average power tracking signal generator to control the linear regulator LA. Of course, the noise reduction unit 370 may be controlled by the main controller 360.

Also, when the tracking mode is again changed to the APT mode, the switch SW may be turned on under control of the main controller 360, and the voltage VC2 of the second capacitor C2 may be provided to the power amplifier (e.g., PA of FIG. 3) as the second modulation voltage V_APT. As such, the voltage level of the second modulation voltage V_APT may be maintained at the first voltage level LV1.

In an embodiment, from a specific time point after t2, instead of the second capacitor C2, the switching regulator 330 may generate the second modulation voltage V_APT (of course, a modulation voltage of the first voltage level LV1) and may provide the output voltage VET_APT to the power amplifier (e.g., PA of FIG. 3). That is, after t2 and before a next change time point (e.g., a tracking mode change or an output voltage magnitude change), the voltage VC2 of the second capacitor C2 may continue to be provided to the power amplifier (e.g., PA of FIG. 3) as the output voltage VET_APT, or a voltage generated by the switching regulator 330 may be provided to the power amplifier (e.g., PA of FIG. 3) instead of the voltage VC2 of the second capacitor C2. However, in an embodiment of the present disclosure, a situation after t2 will be omitted.

As a result, as the tracking mode is again changed from the ET mode to the APT mode after the voltage level of the second modulation voltage V_APT decreases, the tracking mode may again return to an original tracking mode (i.e., the APT mode matched with the second modulation voltage V_APT) before a voltage level is changed. That is, the voltage level of the second modulation voltage V_APT (i.e., a voltage level of the output voltage VET_APT) may be quickly decreased and stabilized through the mechanism described above.

In an embodiment, together with the output voltage magnitude signal, the MODEM 100 may provide the main controller 360 with the tracking mode decision signal for changing the tracking mode from the APT mode to the ET mode at t1 and changing the tracking mode from the ET mode to the APT mode at t2.

In response to the tracking mode decision signal, the main controller 360 may switch from the APT mode to the ET mode at the time point t1 and may switch from the ET mode to the APT mode at the time point t2. Alternatively, in response to the output voltage magnitude signal, the main controller 360 may recognize a magnitude difference (i.e., LV2-LV1) of a change voltage and may perform the switching from the APT mode to the ET mode at the time point t1 and the switching from the ET mode to the APT mode at the time point t2 automatically without separately receiving the tracking mode decision signal. That is, the main controller 360 may change the tracking mode in the situation of FIG.

14B by using one of the two methods described above, and which method is implemented may be set in advance by the user/manufacturer.

Although at least two of VC1, VET_APT, and VC2 have the same voltage value in a specific period, FIG. 14B represents each of VC1, VET_APT, and VC2 with non-overlapping lines for better illustration and understanding.

FIG. 15A illustrates the case where a voltage level of the first capacitor C1, in the APT mode, is lower than an expected voltage level of the first modulation voltage V_ET, according to the ET mode, in a state where the APT mode has to be switched to the ET mode. This is associated with the case where the voltage VC2 of the second capacitor C2 is provided as the output voltage VET_APT through the switch SW.

Referring to FIGS. 4 and 15A, the MODEM 100 may provide the main controller 360 with the tracking mode decision signal, for switching from the APT mode to the ET mode, and the output voltage magnitude signal indicating that the expected voltage level of the output voltage VET_APT after a mode change is "LVE1". As such, after the SIMO converter 310 charges the voltage VC1 of the first capacitor C1 to the expected voltage level LVE1 of the first modulation voltage V_ET in advance before the tracking mode change time point t1 under control of the main controller 360, the main controller 360 may switch from the APT mode to the ET mode. In an embodiment, the expected voltage level LVE1 of the first modulation voltage V_ET may be a peak level within the corresponding TTI (e.g., a TTI starting from t1).

Here, when the tracking mode is changed to the ET mode at t1, the switch SW may be turned off under control of the main controller 360, and the voltage VC1 charged to the first capacitor C1 may be provided to the linear regulator LA as a power supply voltage. Under control of the main controller 360, the linear regulator LA may operate in parallel with the switching regulator 330 to generate the first modulation voltage V_ET. As such, a modulation voltage that is provided as the output voltage VET_APT may be quickly changed from the second modulation voltage V_APT to the first modulation voltage V_ET. That is, through the above mechanism, a modulation voltage may be quickly changed upon switching from the APT mode to the ET mode.

Although at least two of VC1, VET_APT, and VC2 have the same voltage value in a specific period, FIG. 15A represents each of VC1, VET_APT, and VC2 with non-overlapping lines for better illustration and understanding.

Meanwhile, FIG. 15B illustrates the case where a voltage level of the second capacitor C2 in the ET mode is higher than an expected voltage level LVE2 of the second modulation voltage V_APT, according to the APT mode, in a state where the ET mode has to be switched to the APT mode. In an embodiment, this is associated with the case where the voltage VC2 charged to the second capacitor C2 is higher than the expected voltage level LVE2.

Referring to FIGS. 4 and 15B, the MODEM 100 may provide the main controller 360 with the tracking mode decision signal, for switching from the ET mode to the APT mode, and the output voltage magnitude signal indicating that the expected voltage level of the output voltage VET_APT after a mode change is "LVE2". As such, after the SIMO converter 310 discharges the voltage VC2 of the second capacitor C2 to the expected voltage level LVE2 of the second modulation voltage V_APT in advance before the tracking mode change time point t1 under control of the main controller 360, the main controller 360 may switch from the ET mode to the APT mode.

Here, when the tracking mode is changed to the APT mode at t1, the switch SW may be turned on under control of the main controller 360, and the voltage VC2 of the second capacitor C2 may be provided to the power amplifier (e.g., PA of FIG. 3) as the output voltage VET_APT. As such, a modulation voltage that is provided as the output voltage VET_APT may be quickly changed from the first modulation voltage V_ET to the second modulation voltage V_APT. That is, through the above mechanism, a modulation voltage may be quickly changed upon switching from the ET mode to the APT mode.

In an embodiment, from a specific time point after t1, instead of the second capacitor C2, the switching regulator 330 may generate the second modulation voltage V_APT (of course, a modulation voltage of the expected voltage level LVE2) and may provide the output voltage VET_APT to the power amplifier (e.g., PA of FIG. 3). That is, after t1 and before a next change time point (e.g., a tracking mode change or an output voltage magnitude change), the voltage VC2 of the second capacitor C2 may continue to be provided to the power amplifier (e.g., PA of FIG. 3) as the output voltage VET_APT, or a voltage generated by the switching regulator 330 may be provided to the power amplifier (e.g., PA of FIG. 3) instead of the voltage VC2 of the second capacitor C2. However, in an embodiment of the present disclosure, a situation after t1 will be omitted.

Although at least two of VC1, VET_APT, and VC2 have the same voltage value in a specific period, FIG. 15B represents each of VC1, VET_APT, and VC2 with non-overlapping lines for better illustration and understanding.

FIG. 16A illustrates how to increase a maximum voltage level of the first modulation voltage V_ET, in a next period (e.g., a next TTI) belonging to the ET mode, to the second voltage level LV2 higher than the first voltage level LV1 in a state where a maximum voltage level of the first modulation voltage V_ET in a current period (e.g., a current TTI) belonging to the ET mode is the first voltage level LV1.

Referring to FIGS. 4 and 16A, the MODEM 100 may provide the main controller 360 with the output voltage magnitude signal for changing a maximum voltage level of the output voltage VET_APT from the first voltage level LV1 to the second voltage level LV2. In response to the output voltage magnitude signal, the SIMO converter 310 may charge the voltage VC1 of the first capacitor C1 to the second voltage level LV2 in advance in a current period. Under control of the main controller 360, the SIMO converter 310 may provide the voltage VC1 of the first capacitor C1, which is charged to the second voltage level LV2 in advance before entering a next period, to the linear regulator LA as a power supply voltage. Of course, because the ET mode is maintained without changing the tracking mode, the switch SW maintains a turn-off state.

Here, when the switching from a current period to a next period is made at t1 in the ET mode, under control of the main controller 360, the voltage VC1 charged to the first capacitor C1 may be provided to the linear regulator LA as a power supply voltage in advance before entering the next period. As such, a voltage level of the first modulation voltage V_ET may be stably increased without a clipping phenomenon (i.e., a phenomenon where a partial period of the output voltage VET_APT is clipped when a power supply voltage of the linear regulator LA is insufficient). That is, through the above mechanism, the voltage level of the first modulation voltage V_ET may be stably increased without the clipping phenomenon.

Meanwhile, FIG. 16B illustrates how to decrease a maximum voltage level of the first modulation voltage V_ET, in a next period (e.g., a next TTI) belonging to the ET mode, to the first voltage level LV1 lower than the second voltage level LV2 in a state where a maximum voltage level of the first modulation voltage V_ET, in a current period (e.g., a current TTI) belonging to the ET mode, is the second voltage level LV2.

Referring to FIGS. 4 and 16B, the MODEM 100 may provide the main controller 360 with the output voltage magnitude signal for changing a maximum voltage level of the output voltage VET_APT from the second voltage level LV2 to the first voltage level LV1. First, the SIMO converter 310 may maintain the voltage VC1 of the first capacitor C1 at the second voltage level LV2 in a current period under control of the main controller 360. Afterwards, when a next period starts (i.e., after the next period starts), in response to the output voltage magnitude signal, the SIMO converter 310 may discharge the voltage VC1 of the first capacitor C1 charged to the second voltage level LV2 to the first voltage level LV1. Of course, because the ET mode is maintained without changing the tracking mode, the switch SW maintains a turn-off state.

At t1, when the switching from the current period to the next period in the ET mode is made, under control of the main controller 360, the voltage VC1 of the first capacitor C1 may be provided to the linear regulator LA as a power supply voltage after entering the next period. As such, the voltage level of the first modulation voltage V_ET may be stably decreased without a clipping phenomenon. That is, through the above mechanism, the voltage level of the first modulation voltage V_ET may be stably decreased without the clipping phenomenon.

As described above, through two or more capacitors that are charged/discharged at a time point when the tracking mode is changed from the ET/APT mode to the APT/ET mode or before or after an output voltage changes, the supply modulator 300-1 according to an embodiment of the present disclosure may improve a speed at which the output voltage changes and may also prevent the output voltage from being distorted due to a clipping phenomenon.

The first example 300-1 of a supply modulator according to an embodiment of the present disclosure is described above. Below, a second example of a supply modulator according to an embodiment of the present disclosure will be described with reference to FIGS. 17 to 22.

Figure 17:
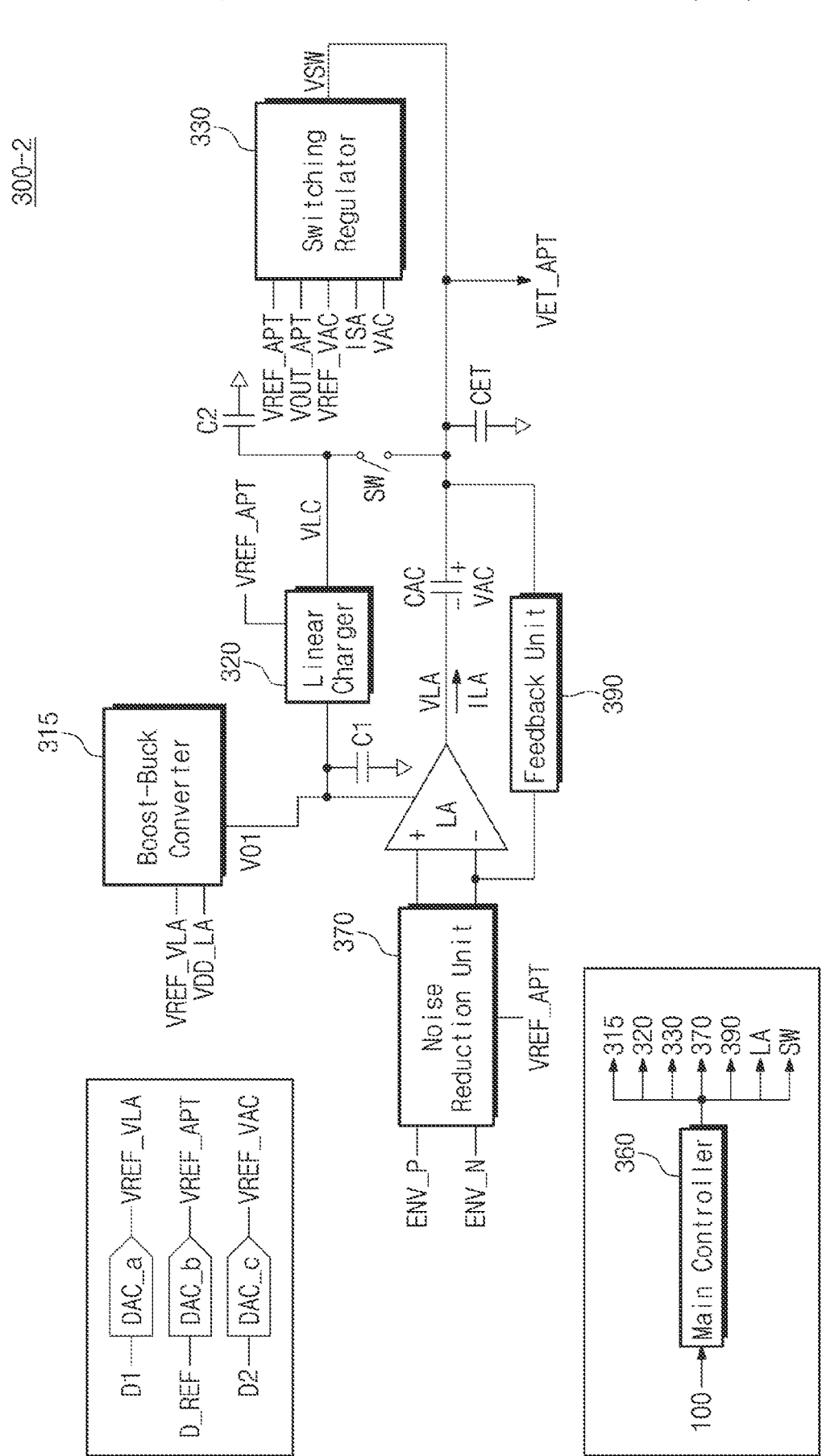
FIG. 17 is a circuit diagram illustrating a second example of a supply modulator included in a wireless communication apparatus according to some embodiments of the present disclosure.
Figure 18:
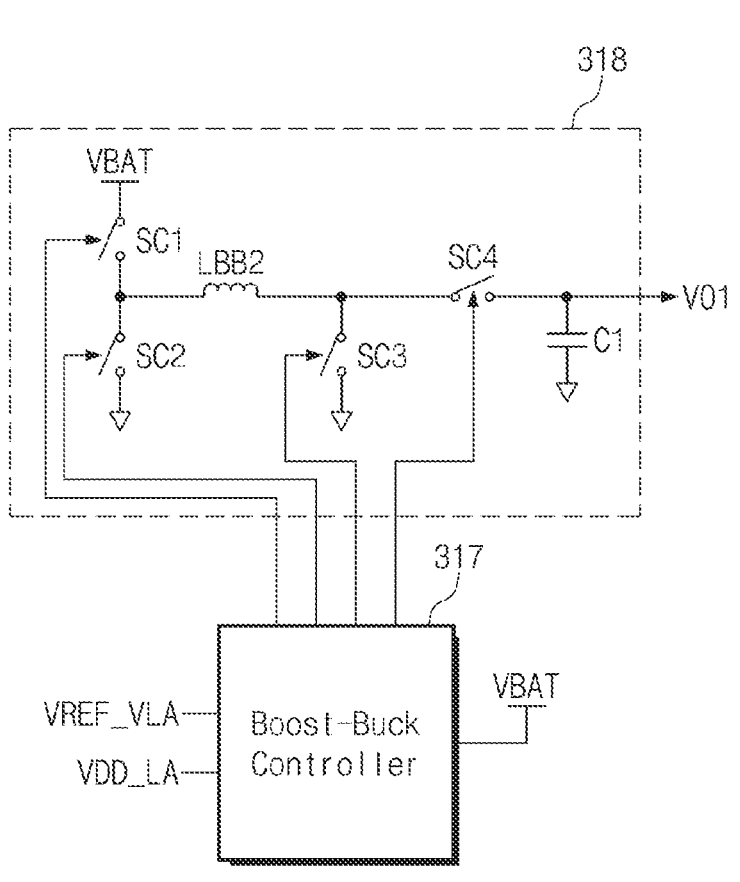
FIG. 18 is a circuit diagram illustrating a boost-buck converter illustrated in FIG. 17.
Figure 19:
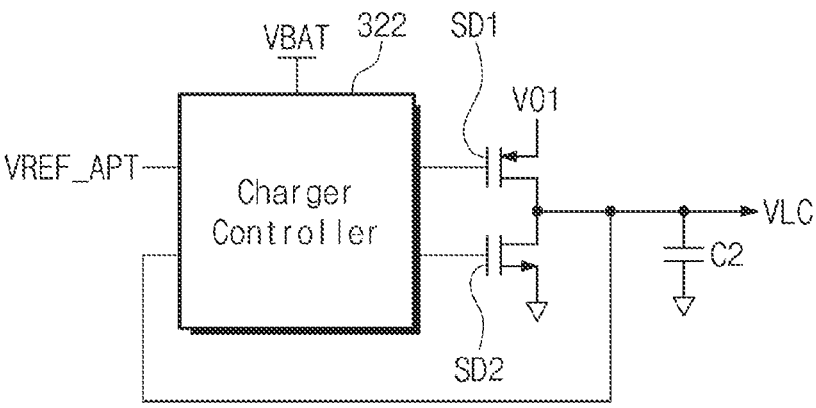
FIG. 19 is a circuit diagram illustrating a linear charger illustrated in FIG. 17.
Figure 20:
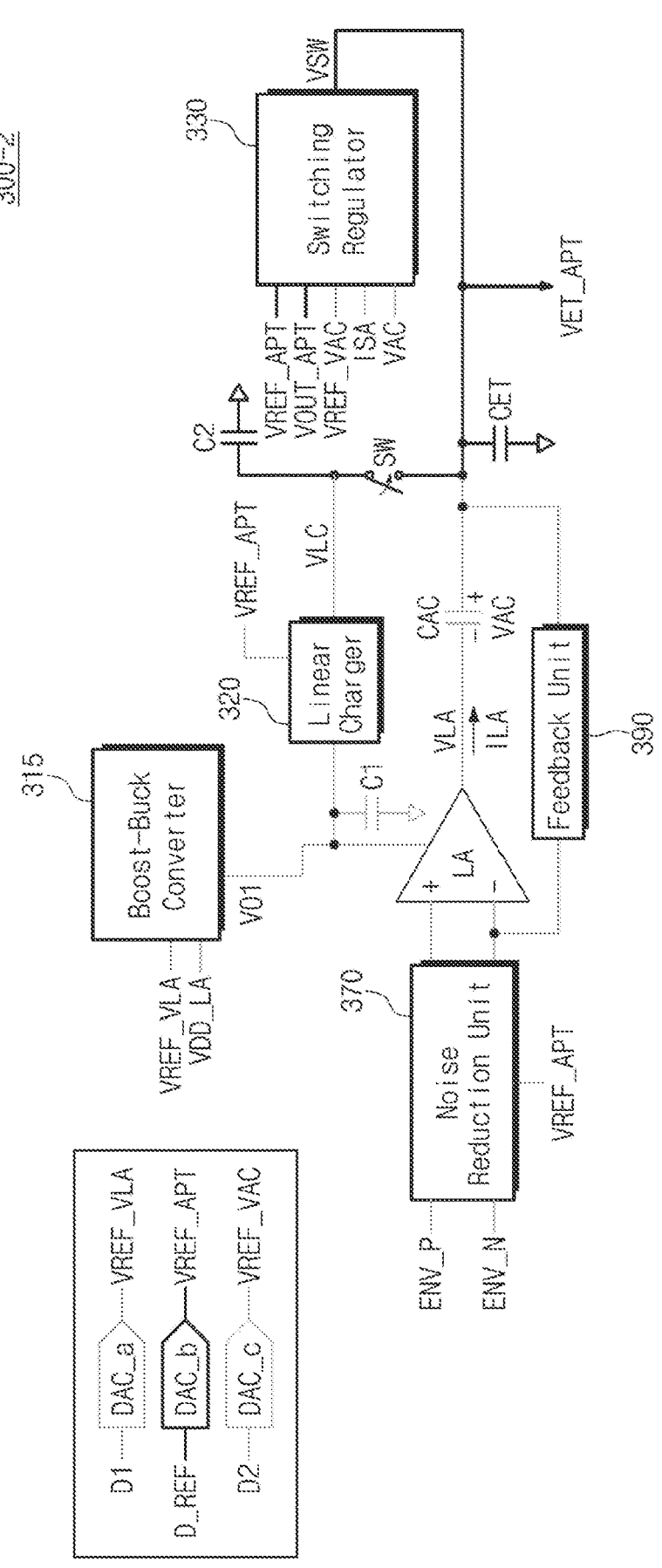
FIG. 20 is a diagram illustrating an average power tracking mode operation of a supply modulator of FIG. 17.
Figure 21:
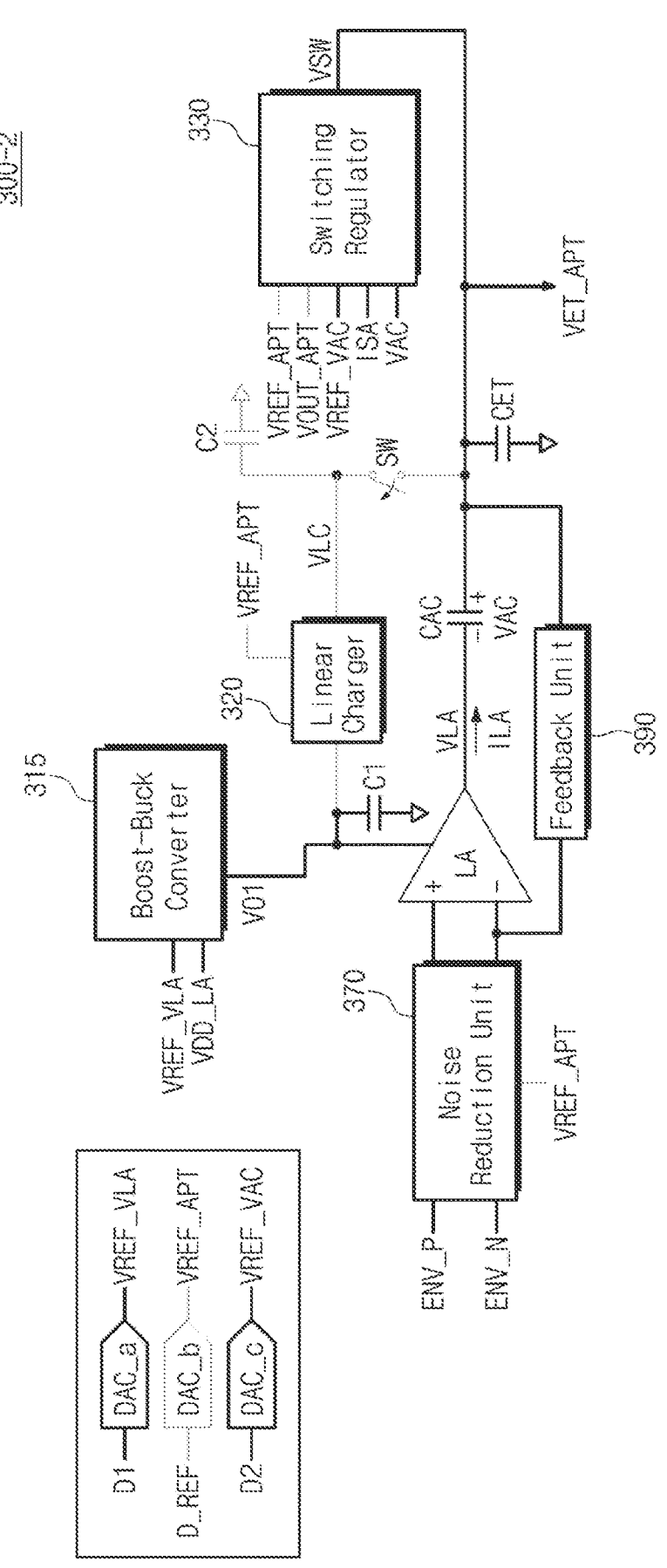
FIG. 21 is a diagram illustrating an envelope tracking mode operation of a supply modulator of FIG. 17.
Figure 22:
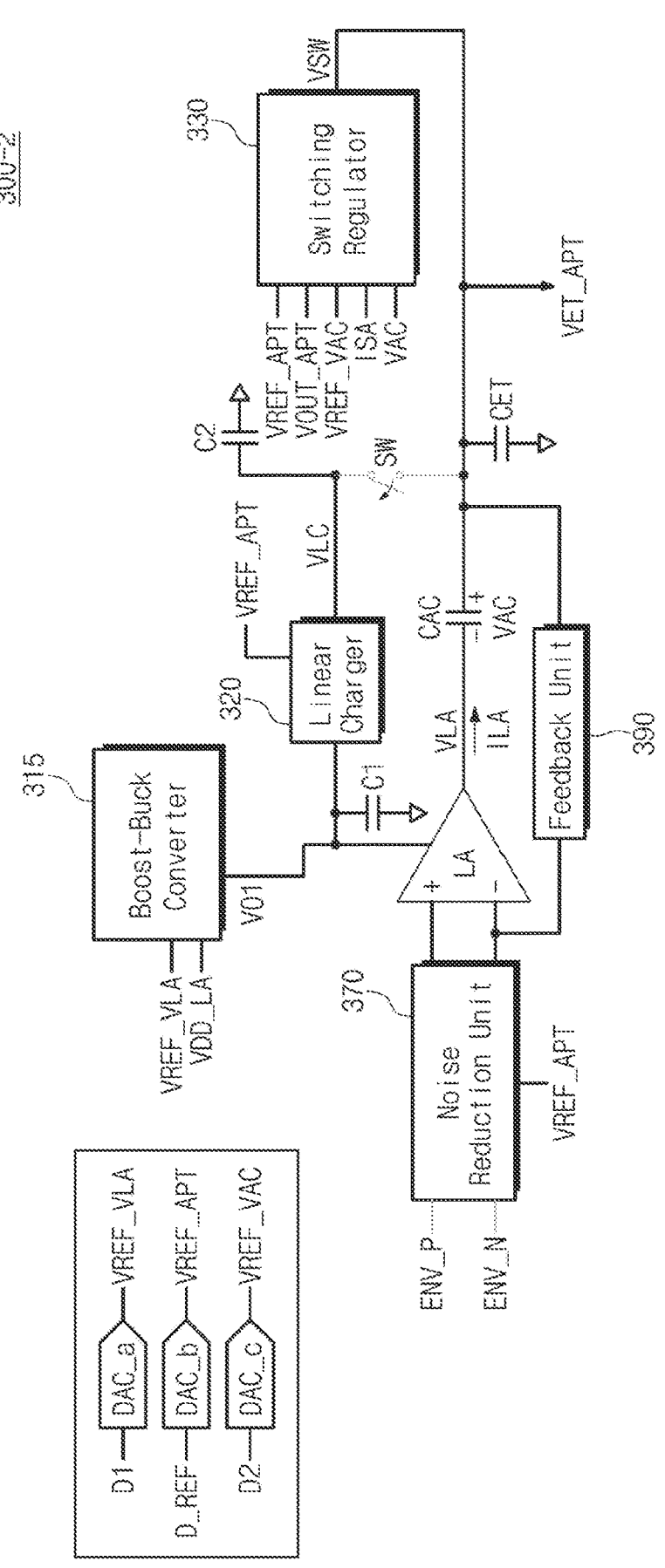
FIG. 22 is a diagram illustrating a capacitor charging operation performed by a supply modulator of FIG. 17 to maintain a voltage level of a modulation voltage generated according to average power tracking.

FIG. 17 is a circuit diagram illustrating a second example of a supply modulator included in a wireless communication apparatus according to some embodiments of the present disclosure. FIG. 18 is a circuit diagram illustrating a boost-buck converter illustrated in FIG. 17. FIG. 19 is a circuit diagram illustrating a linear charger illustrated in FIG. 17. FIG. 20 is a diagram illustrating an average power tracking mode operation of a supply modulator of FIG. 17. FIG. 21 is a diagram illustrating an envelope tracking mode operation of a supply modulator of FIG. 17. FIG. 22 is a diagram illustrating a capacitor charging operation performed by a supply modulator of FIG. 17 to maintain a voltage level of a modulation voltage generated according to average power tracking.

Below, for convenience of description, it is assumed that a supply modulator 300-2 is implemented with the supply modulator 300 of the wireless communication apparatus 2 illustrated in FIG. 3. Also, the supply modulator 300-2 of FIG. 17 and the supply modulator 300 of FIG. 4 are identical except for some components and a mechanism, and thus, a difference will be mainly described.

Referring to FIG. 17, a second example 300-2 of a supply modulator according to an embodiment of the present disclosure may include a boost-buck converter 315, a linear charger 320, the switching regulator 330, the linear regulator LA, the noise reduction unit 370, the feedback unit 390, the AC coupling capacitor CAC, the switch SW, the plurality of digital-to-analog converters DAC_a, DAC_b, and DAC_c, and the main controller 360.

In detail, unlike the supply modulator 300-1 of FIG. 4, the supply modulator 300-2 of FIG. 17 may not include a SIMO converter and may further include the boost-buck converter 315 and the linear charger 320.

First, the boost-buck converter 315 may operate to provide a power supply voltage to the linear regulator LA in the ET mode. The boost-buck converter 315 may operate to provide a power supply voltage to the linear charger 320 in the APT mode and may include the first capacitor C1 that is connected with a power supply terminal of each of the linear regulator LA and the linear charger 320 and is charged/discharged for a change of the tracking mode or a magnitude change of the output voltage VET_APT. Also, the boost-buck converter 315 may be controlled by the main controller 360.

In an embodiment, a part D1 of digital signals provided from the MODEM 100 may be converted into an analog signal, that is, the reference voltage signal VREF_VLA through the digital-to-analog converter DAC_a. Also, the reference voltage signal VREF_VLA converted through the digital-to-analog converter DAC_a may be provided to the boost-buck converter 315.

The boost-buck converter 315 may generate and output the voltage VO1 based on the reference voltage signal VREF_VLA. That is, the boost-buck converter 315 may step up or step down an input voltage (i.e., a power (e.g., VBAT of FIG. 18) provided from a battery) based on the reference voltage signal VREF_VLA and may generate and output the voltage VO1.

Referring to FIG. 18, an exemplary configuration of the boost-buck converter 315 is illustrated. In detail, the boost-buck converter 315 may include a conversion circuit 318 and a boost-buck controller 317.

The conversion circuit 318 may include one inductor LBB2, a plurality of conversion switches SC1, SC2 and SC3, an output switch SC4, and a capacitor C1. As such, the conversion circuit 318 may be implemented with a buck-boosting converter that bucks (or steps down) or boosts (or steps up) the input voltage VBAT. Also, the conversion circuit 318 may generate the voltage VO1 under control of the boost-buck controller 317.

For example, the first capacitor C1 may be a load capacitor, and a capacity of the first capacitor C1 may be from several to hundreds of uF (microfarads). Also, the first capacitor C1 may not be included in the boost-buck converter 315. That is, the first capacitor C1 may be provided outside the boost-buck converter 315. However, for convenience of description, an embodiment of the present disclosure will be described in which the first capacitor C1 is included in the boost-buck converter 315.

The boost-buck controller 317 may generate switching control signals based on the reference voltage signal VREF_VLA and may control a turn-on or a turn-off of the plurality of switches SC1 to SC4. As such, the voltage VO1 may be generated as the plurality of switches SC1 to SC4 are respectively turned on or turned off by the switching control signals.

In detail, the boost-buck controller 317 may generate the switching control signals for controlling the plurality of switches SC1 to SC4 by using a PWM or PFM scheme based on the reference voltage signal VREF_VLA. The voltage VO1 of a desired level may be generated as the plurality of switches SC1 to SC4 are controlled by the switching control signals. Also, as a level of the voltage VO1 is fed back to the boost-buck controller 317 (i.e., VO1 being fed back as VDD_LA), the converter controller 312 may control the switching control signals such that a level of the generated voltage VO1 is set to a desired level.

In an embodiment, the configuration of the boost-buck converter 315 illustrated in FIG. 18 is, but is not limited to, only an exemplary embodiment.

Returning to FIG. 17, the linear charger 320 may operate selectively with the switching regulator 330 for the purpose of generating the output voltage VET_APT in the APT mode. Also, the linear charger 320 may include a second capacitor C2 that is selectively connected with an output terminal of the linear regulator LA through the switch SW and is charged/discharged for a change of the tracking mode or a magnitude change of the output voltage VET_APT. The linear charger 320 may be controlled by the main controller 360.

In an embodiment, a part D_REF of the digital signals provided from the MODEM 100 may be converted into an analog signal, that is, the reference voltage signals VREF_APT through the digital-to-analog converter DAC_b. Also, the reference voltage signal VREF_APT converted through the digital-to-analog converter DAC_b may be provided to the linear charger 320.

The linear charger 320 may generate and output a voltage VLC based on the reference voltage signal VREF_APT. That is, the linear charger 320 may step up or step down an input voltage (i.e., the voltage VO1 provided from the boost-buck converter 315) based on the reference voltage signal VREF_APT and may generate and output the voltage VLC.

Referring to FIG. 19, an exemplary configuration of the linear charger 320 is illustrated. In detail, the linear charger 320 may include a plurality of switches SD1 and SD2, a second capacitor C2, and a charger controller 322.

For example, each of the plurality of switches SD1 and SD2 may include a transistor. In detail, one (e.g., SD1) of the plurality of switches SD1 and SD2 may include a p-channel metal oxide semiconductor (PMOS) transistor, and the other (e.g., SD2) thereof may include an n-channel metal oxide semiconductor (NMOS) transistor. As such, the linear charger 320 may perform charging on the second capacitor C2 through the switch SD1 being a PMOS transistor and may perform discharging on the second capacitor C2 through the switch SD2 being an NMOS transistor.

For example, the second capacitor C2 may be a load capacitor, and a capacity of the second capacitor C2 may be from several to hundreds of uF (microfarads). Also, the second capacitor C2 may not be included in the linear charger 320. That is, the second capacitor C2 may be provided outside the linear charger 320. However, for convenience of description, an embodiment of the present disclosure will be described in which the second capacitor C2 is included in the linear charger 320.

The charger controller 322 may generate switching control signals based on the reference voltage signal VREF_APT and may control a turn-on or a turn-off of each of the plurality of switches SD1 and SD2. As such, the voltage VLC may be generated based on a turn-on or a turn-off of each of the plurality of switches SD1 and SD2.

In detail, the charger controller 322 may control the switching control signals for controlling the plurality of switches SD1 and SD2 by using a PWM or PFM scheme based on the reference voltage signal VREF_APT such that the voltage VLC of a desired level is generated. Also, as a level of the generated voltage VLC is fed back to the charger controller 322, the charger controller 322 may control the switching control signals such that a level of the generated voltage VLC is set to a desired level.

In an embodiment, the configuration of the linear charger 320 illustrated in FIG. 19 is, but is not limited to, only an exemplary embodiment.

Returning to FIG. 17, the main controller 360 may decide the tracking mode and may control at least one of the switch SW, the linear regulator LA, the switching regulator 330, the boost-buck converter 315, the linear charger 320, the noise reduction unit 370, and the feedback unit 390 based on the decided tracking mode.

In detail, the MODEM 100 may provide the main controller 360 with the tracking mode decision signal and may decide the tracking mode of the supply modulator 300-2 based on the provided tracking mode decision signal.

As such, when the tracking mode is decided to be the ET mode, the main controller 360 may turn off the switch SW and may control a parallel operation of the linear regulator LA and the switching regulator 330. In this case, the linear regulator LA and the switching regulator 330 may together generate the first modulation voltage according to the ET and may provide the generated first modulation voltage to the power amplifier (e.g., PA of FIG. 3) as the output voltage VET_APT.

In contrast, when the tracking mode is decided to be the APT mode, the main controller 360 may turn on the switch SW and may control an output voltage generating operation of one of the linear charger 320 and the switching regulator 330. In this case, one of the linear charger 320 and the switching regulator 330 may generate the second modulation voltage according to the APT and may provide the generated second modulation voltage to the power amplifier (e.g., PA of FIG. 3) as the output voltage VET_APT.

In an embodiment, when the tracking mode is decided to be the APT mode, the main controller 360 may control the boost-buck converter 315 such that the boost-buck converter 315 supplies a power supply voltage to the linear charger 320.

As such, the supply modulator 300-2 of FIG. 17 may have the above configuration and characteristic, and an operation of the supply modulator 300-2 according to the tracking mode will be described with reference to FIGS. 20 to 22.

In an embodiment, in FIGS. 20 to 22, a portion marked by a bold line represents an operation enable path in the corresponding drawing. Each drawing will be described with reference to FIG. 17 together.

First, referring to FIG. 20, an operation of the supply modulator 300-2 in the APT mode is illustrated.

The MODEM 100 may provide the main controller 360 with the APT mode decision signal and may decide the APT mode of the supply modulator 300-2 based on the provided APT mode decision signal. In this case, the main controller 360 may turn on the switch SW based on the decided tracking mode. Also, one of the linear charger 320 and the switching regulator 330 may generate the second modulation voltage VLC or VSW according to the APT under control of the main controller 360 and may provide the generated second modulation voltage VLC or VSW to the power amplifier (e.g., PA of FIG. 3) as the output voltage VET_APT.

In detail, to generate the second modulation voltage VSW according to the APT, the switching regulator 330 may be provided with the reference voltage signal VREF_APT from the digital-to-analog converter DAC_b. The switching regulator 330 may compare the reference voltage signal VREF_APT and the current output voltage VOUT_APT. Here, the current output voltage VOUT_APT, which is a current voltage value of VSW, may be a voltage value of VET_APT according to a current tracking mode. The switching regulator 330 may generate the second modulation voltage VSW based on a comparison result. Also, the switching regulator 330 may provide the generated second modulation voltage VSW to the power amplifier (e.g., PA of FIG. 3) as the output voltage VET_APT. Of course, even when the switching regulator 330 generates the second modulation voltage VSW, the switch SW may be turned on.

Although not illustrated in the drawings, in the case where the linear charger 320 generates the second modulation voltage VLC according to the APT under control of the main controller 360, the linear charger 320 may be provided with the reference voltage signal VREF_APT from the digital-to-analog converter DAC_b. The linear charger 320 may generate the second modulation voltage VLC based on a result of comparing the provided reference voltage signal VREF_APT and a current output voltage (e.g., a current voltage value of VLC) of the linear charger 320. Here, the current voltage value of VLC may be a voltage value of VET_APT according to a current tracking mode. Also, the linear charger 320 may provide the generated second modulation voltage VLC to the power amplifier (e.g., PA of FIG. 3) as the output voltage VET_APT. Of course, in this case, the linear charger 320 may be supplied with a power supply voltage from the boost-buck converter 315.

Next, referring to FIG. 21, an operation of the supply modulator 300-2 in the ET mode is illustrated.

The MODEM 100 may provide the main controller 360 with the ET mode decision signal and may decide the ET mode of the supply modulator 300-2 based on the provided ET mode decision signal. In this case, the main controller 360 may turn off the switch SW based on the decided tracking mode. Also, the linear regulator LA and the switching regulator 330 may together generate the first modulation voltage according to the ET through a parallel operation under control of the main controller 360 and may provide the generated first modulation voltage to the power amplifier (e.g., PA of FIG. 3) as the output voltage VET_APT.

In detail, as illustrated in FIG. 21, the boost-buck converter 315 may be provided with the reference voltage signal VREF_VLA from the digital-to-analog converter DAC_a. The boost-buck converter 315 may generate the voltage VO1 to be provided to the linear regulator LA as a power supply voltage, based on a result of comparing the provided reference voltage signal VREF_VLA and a current output voltage VO1 (i.e., VDD_LA) of the boost-buck converter 315.

The linear regulator LA may be provided with the power supply voltage VO1 from the boost-buck converter 315 and may be provided with the noise-free analog envelope signals ENV_P and ENV_N from the noise reduction unit 370. Also, the linear regulator LA may amplify and output the provided analog envelope signals ENV_P and ENV_N by using the power supply voltage VO1. Here, an output of the linear regulator LA may be fed back to the negative terminal (−) of the linear regulator LA through the feedback unit 390, and thus, an output level of the linear regulator LA may be adjusted based on the feedback result.

Meanwhile, the switching regulator 330 may be provided with the reference voltage signal VREF_VAC from the digital-to-analog converter DAC_c. Also, the switching regulator 330 may generate and output a current (e.g., ISW of FIG. 8) based on the provided reference voltage signal VREF_VAC, the sensing signal ISA of the current ILA output from the linear regulator LA, and the voltage VAC of the AC coupling capacitor CAC.

The output current (e.g., ISW of FIG. 8) of the switching regulator 330 and the output current (e.g., ILA) of the linear regulator LA, which are generated through the above procedure, may be combined, and the combined current may be provided to the power amplifier (e.g., PA of FIG. 3) as a current (e.g., IET_APT of FIG. 8) forming a power supply voltage (i.e., the output voltage VET_APT). Finally, referring to FIG. 22, an operation of the supply modulator 300-2 for maintaining a voltage level of the output voltage VET_APT when the tracking mode is changed is illustrated. In detail, FIG. 22 illustrates an operation state of the supply modulator 300-2 before the tracking mode is changed from the ET mode to the APT mode while maintaining a voltage level of the second modulation voltage, in a state where the second modulation voltage (i.e., a modulation voltage according to the APT) is provided to the power amplifier (e.g., PA of FIG. 3) as the output voltage VET_APT in the ET mode.

Because the tracking mode is not yet changed to the APT mode, like the ET mode described above, the main controller 360 may maintain the switch SW in a turn-off state and may operate the switching regulator 330 and the linear regulator LA in parallel (or together). The main controller 360 may control the boost-buck converter 315 such that the boost-buck converter 315 provides the power supply voltage VO1 to the linear regulator LA. However, because the second modulation voltage is being supplied to the power amplifier (e.g., PA of FIG. 3) in the ET mode, the main controller 360 may operate the noise reduction unit 370 as the average power tracking signal generator. As such, the noise reduction unit 370 may be provided with the reference voltage signal VREF_APT from the digital-to-analog converter DAC_b. The noise reduction unit 370 may control the linear regulator LA based on the provided reference voltage signal VREF_APT such that the voltage VLA output from the linear regulator LA is maintained at a voltage (i.e., a DC voltage) of a uniform level.

The linear charger 320 may be provided with a power supply voltage from the boost-buck converter 315 for the purpose of allowing the voltage level of the second modulation voltage to be maintained when the tracking mode is changed from the ET mode to the APT mode. Also, before a change of the tracking mode, the linear charger 320 may charge the second capacitor C2 by using the provided power supply voltage such that the voltage VLC of the second capacitor C2 is set to a current voltage level of the second modulation voltage (i.e., a current voltage level of the output voltage VET_APT).

As such, afterward, when the tracking mode is changed from the ET mode to the APT mode, the switch SW may be turned on, and thus, the voltage VLC of the second capacitor C2 may be applied to the power amplifier (e.g., PA of FIG. 3) as the second modulation voltage (i.e., the output voltage VET_APT).

As described above, the supply modulator 300-2 may operate in the APT mode or the ET mode based on the above principle, and a mechanism in which an output voltage varies in each tracking mode will be described.

In an embodiment, because the mechanism in which an output voltage varies in each tracking mode of the supply modulator 300-2 is capable of being described with reference to FIGS. 14A to 16B, the description will be given with reference to FIGS. 14A to 16B described above, not new drawings.

FIG. 14A illustrates how a voltage level of the second modulation voltage V_APT (i.e., a voltage level of the output voltage VET_APT) increases from the first voltage level LV1 to the second voltage level LV2 higher than the first voltage level LV1 in a state where the switch SW is turned on and the second modulation voltage (i.e., V_APT) is being supplied to the power amplifier (e.g., PA of FIG. 3) as the output voltage VET_APT.

Referring to FIGS. 17 and 14A, the MODEM 100 may provide the main controller 360 with the output voltage magnitude signal for changing a magnitude of the output voltage VET_APT from the first voltage level LV1 to the second voltage level LV2. In response to the output voltage magnitude signal, the boost-buck converter 315 may charge the voltage VC1 (i.e., VO1) of the first capacitor C1 to the second voltage level LV2 in advance before the time point t1 when the voltage level of the second modulation voltage V_APT starts to change. At the time point t1 at which the voltage level of the second modulation voltage V_APT starts to change, the main controller 360 may turn off the switch SW and may change the tracking mode from the APT mode to the ET mode.

Here, when the tracking mode is changed to the ET mode at t1, the switch SW may be turned off under control of the main controller 360, and the voltage VC1 charged to the first capacitor C1 may be provided to the linear regulator LA as a power supply voltage. As such, the voltage level of the second modulation voltage V_APT may be quickly increased from the first voltage level LV1 to the second voltage level LV2.

In detail, when the tracking mode is changed to the ET mode, the linear regulator LA that is provided with VC1 as a power supply voltage may operate in parallel with the switching regulator 330 under control of the main controller 360, and thus, the voltage level of the second modulation voltage V_APT may be quickly increased to the second voltage level LV2. That is, the voltage level of the second modulation voltage V_APT may quickly increase through the switching from the APT mode to the ET mode.

Next, FIG. 14A illustrates how the tracking mode is again changed from the ET mode to the APT mode while the voltage level of the second modulation voltage V_APT is maintained at the second voltage level LV2.

Referring to FIGS. 17 and 14A, from the time point t1 when the voltage level of the second modulation voltage V_APT starts to change, the linear charger 320 may charge the second capacitor C2 from the first voltage level LV1 to the second voltage level LV2 by using the power supply voltage VO1 provided from the boost-buck converter 315 under control of the main controller 360. At the time point t2 at which the second capacitor C2 is completely charged to the second voltage level LV2, the main controller 360 may again turn on the switch SW and may again change the tracking mode from the ET mode to the APT mode.

Here, the period t1' to t2 where the voltage level of the second modulation voltage V_APT is maintained in the ET mode may be implemented by the noise reduction unit 370 that operates as the average power tracking signal generator to control the linear regulator LA. Of course, the noise reduction unit 370 may be controlled by the main controller 360.

Also, when the tracking mode is again changed to the APT mode, the switch SW may be turned on, and the voltage VC2 charged to the second capacitor C2 may be provided to the power amplifier (e.g., PA of FIG. 3) as the second modulation voltage V_APT. As such, the voltage level of the second modulation voltage V_APT may be maintained at the second voltage level LV2.

In an embodiment, from a specific time point after t2, instead of the second capacitor C2, the switching regulator 330 may generate the second modulation voltage V_APT (of course, a modulation voltage of the second voltage level LV2) and may provide the output voltage VET_APT to the power amplifier (e.g., PA of FIG. 3). That is, after t2 and before a next change time point (e.g., a tracking mode change or an output voltage magnitude change), the voltage VC2 of the second capacitor C2 may continue to be provided to the power amplifier (e.g., PA of FIG. 3) as the output voltage VET_APT, or a voltage generated by the switching regulator 330 may be provided to the power amplifier (e.g., PA of FIG. 3) instead of the voltage VC2 of the second capacitor C2. However, in an embodiment of the present disclosure, a situation after t2 will be omitted.

As a result, as the tracking mode is again changed from the ET mode to the APT mode after the voltage level of the second modulation voltage V_APT increases, the tracking mode may again return to an original tracking mode (i.e., the APT mode matched with the second modulation voltage V_APT) before a voltage level is changed. That is, the voltage level of the second modulation voltage V_APT (i.e., a voltage level of the output voltage VET_APT) may be quickly increased and stabilized through the mechanism described above.

In an embodiment, together with the output voltage magnitude signal, the MODEM 100 may provide the main controller 360 with the tracking mode decision signal for changing the tracking mode from the APT mode to the ET mode at t1 and changing the tracking mode from the ET mode to the APT mode at t2.

In response to the tracking mode decision signal, the main controller 360 may switch from the APT mode to the ET mode at the time point t1 and may switch from the ET mode to the APT mode at the time point t2. Alternatively, when provided with the output voltage magnitude signal from the MODEM 100, the main controller 360 may recognize a magnitude difference (i.e., LV1-LV2) of a change voltage and may perform the switching from the APT mode to the ET mode at the time point t1 and the switching from the ET mode to the APT mode at the time point t2 automatically without separately receiving the tracking mode decision signal.

That is, the main controller 360 may change the tracking mode in the situation of FIG. 14A by using one of the two methods described above, and whether any method is implemented may be in advance set by the user/manufacturer.

Meanwhile, FIG. 14B illustrates how a voltage level of the second modulation voltage V_APT (i.e., a voltage level of the output voltage VET_APT) decreases from the second voltage level LV2 to the first voltage level LV1 lower than the second voltage level LV2 in a state where the switch SW is turned on and the second modulation voltage (i.e., V_APT) is being supplied to the power amplifier (e.g., PA of FIG. 3) as the output voltage VET_APT.

In this case, referring to FIGS. 17 and 14B, the MODEM 100 may provide the main controller 360 with the output voltage magnitude signal, for changing a magnitude of the output voltage VET_APT from the second voltage level LV2 to the first voltage level LV1, and may change the tracking mode from the APT mode to the ET mode at t1.

Here, when the tracking mode is changed to the ET mode at t1, the switch SW may be turned off under control of the main controller 360, and thus, the voltage level of the second modulation voltage V_APT may be quickly decreased to the first voltage level LV1 based on an analog envelope signal input to the linear regulator (e.g., LA of FIG. 3).

In detail, when the tracking mode is changed to the ET mode, the linear regulator LA may operate in parallel with the switching regulator 330 under control of the main controller 360, and thus, the voltage level of the second modulation voltage V_APT may be quickly decreased to the first voltage level LV1.

Next, FIG. 14B illustrates how the tracking mode is again changed from the ET mode to the APT mode while the voltage level of the second modulation voltage V_APT is maintained at the first voltage level LV1.

Referring to FIGS. 17 and 14B, under control of the main controller 360, the linear charger 320 may discharge the voltage VC2 of the second capacitor C2 from the second voltage level LV2 to the first voltage level LV1 from the time point t1 when the voltage level of the second modulation voltage V_APT starts to change. At the time point t2 at which the second capacitor C2 is completely discharged to the first voltage level LV1, the main controller 360 may again turn on the switch SW and may again change the tracking mode from the ET mode to the APT mode.

Here, the period t1' to t2 where the voltage level of the second modulation voltage V_APT is maintained in the ET mode may be implemented by the noise reduction unit 370 that operates as the average power tracking signal generator to control the linear regulator LA. Of course, the noise reduction unit 370 may be controlled by the main controller 360.

Also, when the tracking mode is again changed to the APT mode, the switch SW may be turned on under control of the main controller 360, and the voltage VC2 of the second capacitor C2 may be provided to the power amplifier (e.g., PA of FIG. 3) as the second modulation voltage V_APT. As such, the voltage level of the second modulation voltage V_APT may be maintained at the first voltage level LV1.

In an embodiment, from a specific time point after t2, instead of the second capacitor C2, the switching regulator 330 may generate the second modulation voltage V_APT (of course, a modulation voltage of the first voltage level LV1) and may provide the output voltage VET_APT to the power amplifier (e.g., PA of FIG. 3). That is, after t2 and before a next change time point (e.g., a tracking mode change or an output voltage magnitude change), the voltage VC2 of the second capacitor C2 may continue to be provided to the power amplifier (e.g., PA of FIG. 3) as the output voltage VET_APT, or a voltage generated by the switching regulator 330 may be provided to the power amplifier (e.g., PA of FIG. 3) instead of the voltage VC2 of the second capacitor C2. However, in an embodiment of the present disclosure, a situation after t2 will be omitted.

As a result, as the tracking mode is again changed from the ET mode to the APT mode after the voltage level of the second modulation voltage V_APT decreases, the tracking mode may again return to an original tracking mode (i.e., the APT mode matched with the second modulation voltage V_APT) before a voltage level is changed. That is, the voltage level of the second modulation voltage V_APT (i.e., a voltage level of the output voltage VET_APT) may be quickly decreased and stabilized through the mechanism described above.

In an embodiment, together with the output voltage magnitude signal, the MODEM 100 may provide the main controller 360 with the tracking mode decision signal for changing the tracking mode from the APT mode to the ET mode at t1 and changing the tracking mode from the ET mode to the APT mode at t2.

In response to the tracking mode decision signal, the main controller 360 may switch from the APT mode to the ET mode at the time point t1 and may switch from the ET mode to the APT mode at the time point t2. Alternatively, in response to the output voltage magnitude signal, the main controller 360 may recognize a magnitude difference (i.e., LV2-LV1) of a change voltage and may perform the switching from the APT mode to the ET mode at the time point t1 and the switching from the ET mode to the APT mode at the time point t2 automatically without separately receiving the tracking mode decision signal.

That is, the main controller 360 may change the tracking mode in the situation of FIG. 14B by using one of the two methods described above, and whether any method is implemented may be in advance set by the user/manufacturer.

FIG. 15A illustrates the case in which a voltage level of the first capacitor C1 in the APT mode is lower than an expected voltage level of the first modulation voltage V_ET, according to the ET mode, in a state where the APT mode has to be switched to the ET mode.

Referring to FIGS. 17 and 15A, the MODEM 100 may provide the main controller 360 with the tracking mode decision signal, for switching from the APT mode to the ET mode, and the output voltage magnitude signal indicating that the expected voltage level of the output voltage VET_APT after a mode change is "LVE1". As such, after the boost-buck converter 315 charges the voltage VC1 of the first capacitor C1 to the expected voltage level LVE1 of the first modulation voltage V_ET in advance before the tracking mode change time point t1 under control of the main controller 360, the main controller 360 may switch from the APT mode to the ET mode. In an embodiment, the expected voltage level LVE1 of the first modulation voltage V_ET may be a peak level within the corresponding TTI (e.g., a TTI starting from t1).

Here, when the tracking mode is changed to the ET mode at t1, the switch SW may be turned off under control of the main controller 360, and the voltage VC1 charged to the first capacitor C1 may be provided to the linear regulator LA as a power supply voltage. Under control of the main controller 360, the linear regulator LA may generate the first modulation voltage V_ET with the switching regulator 330. As such, a modulation voltage that is provided as the output voltage VET_APT may be quickly changed from the second modulation voltage V_APT to the first modulation voltage V_ET. That is, through the above mechanism, a modulation voltage may be quickly changed upon switching from the APT mode to the ET mode.

Meanwhile, FIG. 15B illustrates the case where a voltage level of the second capacitor C2 in the ET mode is higher than an expected voltage level LVE2 of the second modulation voltage V_APT, according to the APT mode, in a state where the ET mode has to be switched to the APT mode.

Referring to FIGS. 17 and 15B, the MODEM 100 may provide the main controller 360 with the tracking mode decision signal, for switching from the ET mode to the APT mode, and the output voltage magnitude signal indicating that the expected voltage level of the output voltage VET_APT after a mode change is "LVE2". As such, after the linear charger 320 discharges the voltage VC2 of the second capacitor C2 to the expected voltage level LVE2 of the second modulation voltage V_APT in advance before the tracking mode change time point t1 under control of the main controller 360, the main controller 360 may switch from the ET mode to the APT mode.

Here, when the tracking mode is changed to the APT mode at t1, the switch SW may be turned on under control of the main controller 360, and the voltage VC2 of the second capacitor C2 may be provided to the power amplifier (e.g., PA of FIG. 3) as the output voltage VET_APT. As such, a modulation voltage that is provided as the output voltage VET_APT may be quickly changed from the first modulation voltage V_ET to the second modulation voltage V_APT. That is, through the above mechanism, a modulation voltage may be quickly changed upon switching from the ET mode to the APT mode.

In an embodiment, from a specific time point after t1, instead of the second capacitor C2, the switching regulator 330 may generate the second modulation voltage V_APT (of course, a modulation voltage of the expected voltage level LVE2) and may provide the output voltage VET_APT to the power amplifier (e.g., PA of FIG. 3). That is, after t1 and before a next change time point (e.g., a tracking mode change or an output voltage magnitude change), the voltage VC2 of the second capacitor C2 may continue to be provided to the power amplifier (e.g., PA of FIG. 3) as the output voltage VET_APT, or a voltage generated by the switching regulator 330 may be provided to the power amplifier (e.g., PA of FIG. 3) instead of the voltage VC2 of the second capacitor C2. However, in an embodiment of the present disclosure, a situation after t1 will be omitted.

FIG. 16A illustrates how to increase a maximum voltage level of the first modulation voltage V_ET, in a next period (e.g., a next TTI) belonging to the ET mode, to the second voltage level LV2 higher than the first voltage level LV1 in a state where a maximum voltage level of the first modulation voltage V_ET in a current period (e.g., a current TTI) belonging to the ET mode is the first voltage level LV1.

Referring to FIGS. 17 and 16A, the MODEM 100 may provide the main controller 360 with the output voltage magnitude signal for changing a maximum voltage level of the output voltage VET_APT from the first voltage level LV1 to the second voltage level LV2. First, in response to the output voltage magnitude signal, the boost-buck converter 315 may charge the voltage VC1 of the first capacitor C1 to the second voltage level LV2 in advance in a current period. Under control of the main controller 360, the boost-buck converter 315 may provide the voltage VC1 of the first capacitor C1, which is charged to the second voltage level LV2 in advance before entering a next period, to the linear regulator LA as a power supply voltage. Of course, because the ET mode is maintained without changing the tracking mode, the switch SW maintains a turn-off state.

At t1, when the switching from a current period to a next period is made in the ET mode, under control of the main controller 360, the voltage VC1 charged to the first capacitor C1 may be provided to the linear regulator LA as a power supply voltage in advance before entering the next period (i.e., a time point before t1). As such, the voltage level of the first modulation voltage V_ET may be stably increased without a clipping phenomenon. That is, through the above mechanism, the voltage level of the first modulation voltage V_ET may be stably increased without the clipping phenomenon.

Meanwhile, FIG. 16B illustrates how to decrease a maximum voltage level of the first modulation voltage V_ET, in a next period (e.g., a next TTI) belonging to the ET mode, to the first voltage level LV1 lower than the second voltage level LV2 in a state where a maximum voltage level of the first modulation voltage V_ET, in a current period (e.g., a current TTI) belonging to the ET mode, is the second voltage level LV2.

Referring to FIGS. 17 and 16B, the MODEM 100 may provide the main controller 360 with the output voltage magnitude signal for changing a maximum voltage level of the output voltage VET_APT from the second voltage level LV2 to the first voltage level LV1. First, the boost-buck converter 315 may maintain the voltage VC1 of the first capacitor C1 at the second voltage level LV2 in a current period under control of the main controller 360. Afterwards, when a next period starts (i.e., after the next period starts), in response to the output voltage magnitude signal, the boost-buck converter 315 may discharge the voltage VC1 of the first capacitor C1, charged to the second voltage level LV2, to the first voltage level LV1. Of course, because the ET mode is maintained without changing the tracking mode, the switch SW maintains a turn-off state.

Here, when the switching from the current period to the next period in the ET mode is made at t1, under control of the main controller 360, the voltage VC1 of the first capacitor C1 may be provided to the linear regulator LA as a power supply voltage after entering the next period. As such, the voltage level of the first modulation voltage V_ET may be stably decreased without a clipping phenomenon. That is, through the above mechanism, the voltage level of the first modulation voltage V_ET may be stably decreased without the clipping phenomenon.

The second example 300-2 of a supply modulator according to an embodiment of the present disclosure is described above. Below, a third example of a supply modulator according to an embodiment of the present disclosure will be described with reference to FIGS. 23 to 30B.

Figure 23:
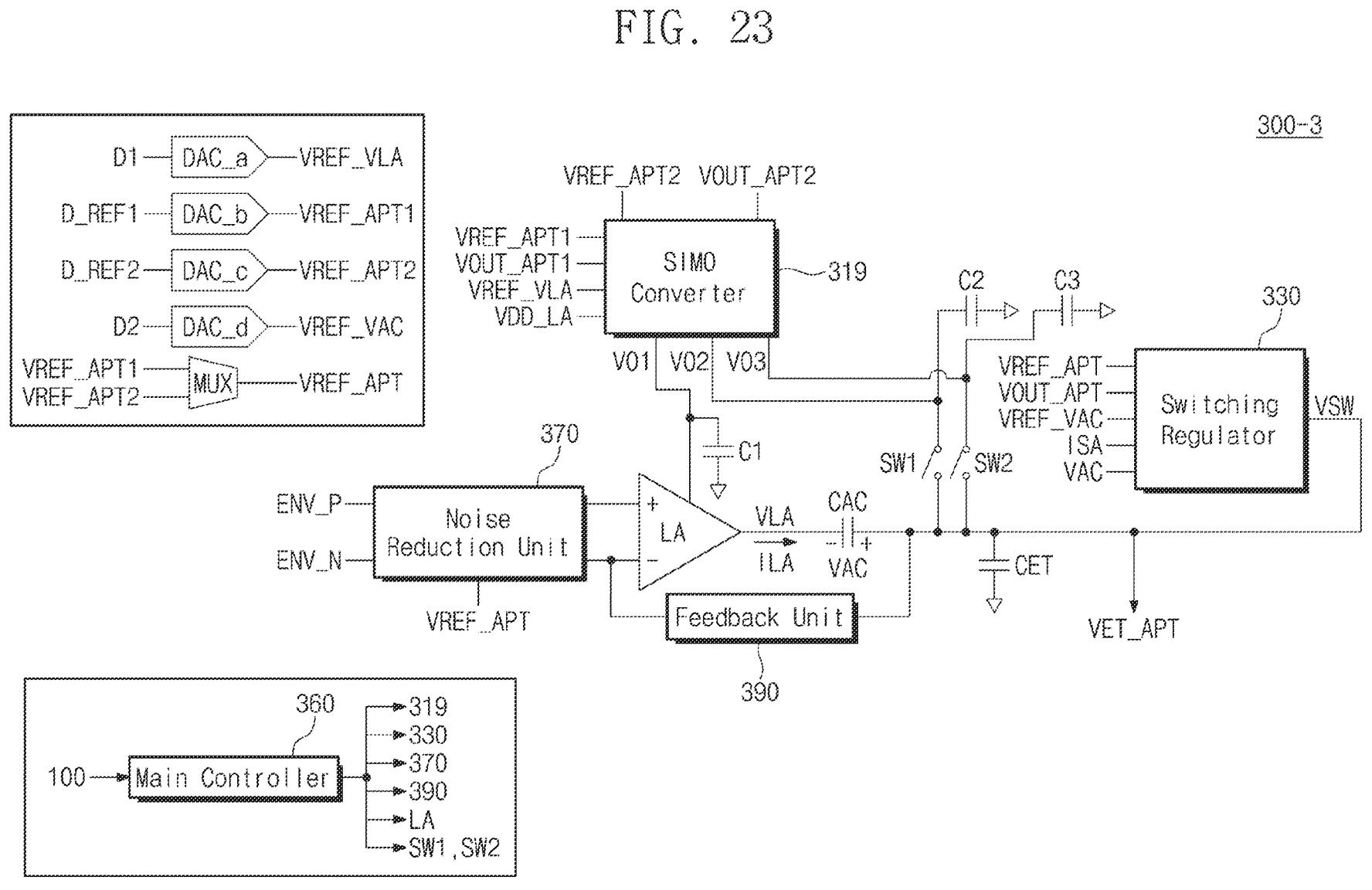
Figure 24:
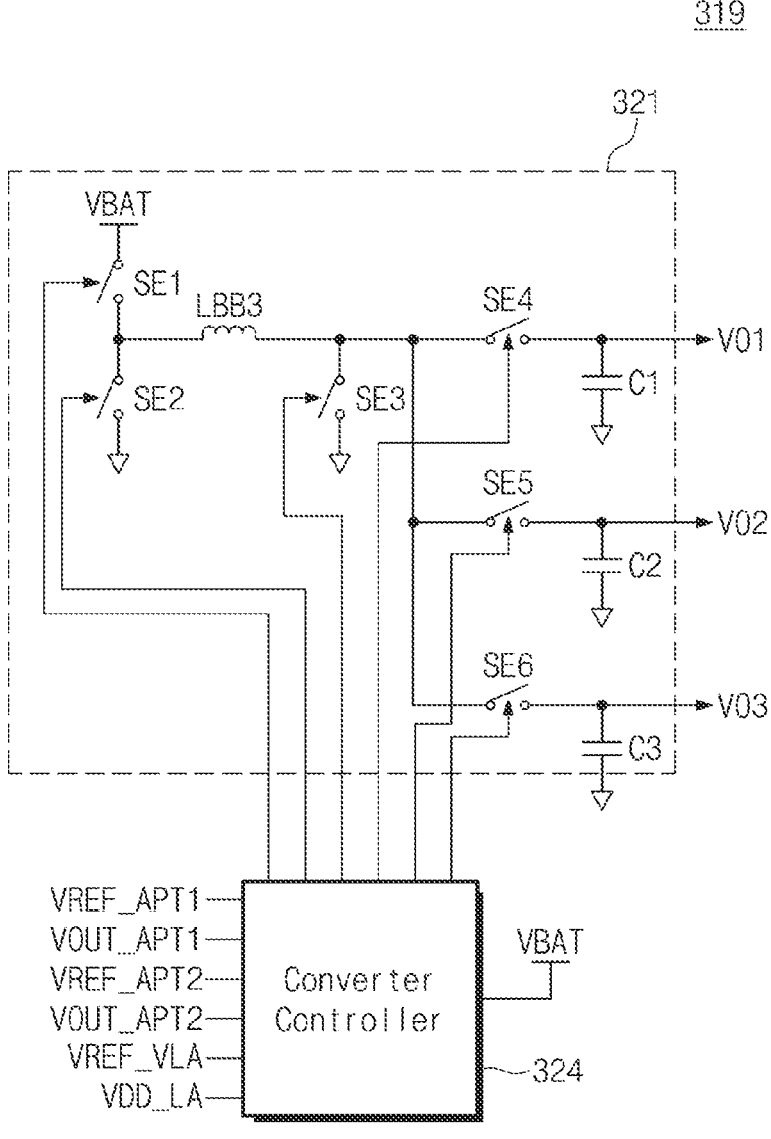
FIG. 24 is a circuit diagram illustrating a single inductor multiple output converter illustrated in FIG. 23.
Figure 25:
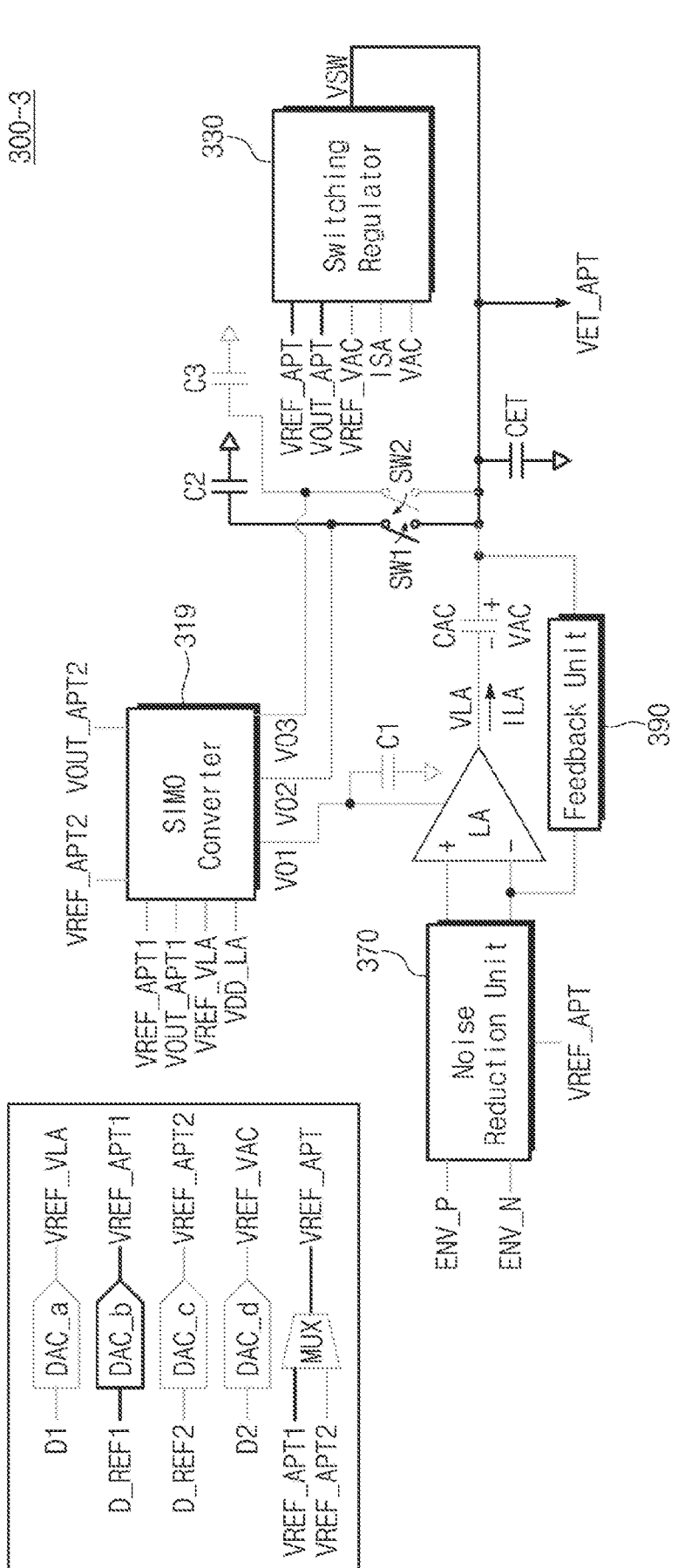
FIG. 25 is a diagram illustrating an average power tracking mode operation of a supply modulator of FIG. 23.
Figure 26:
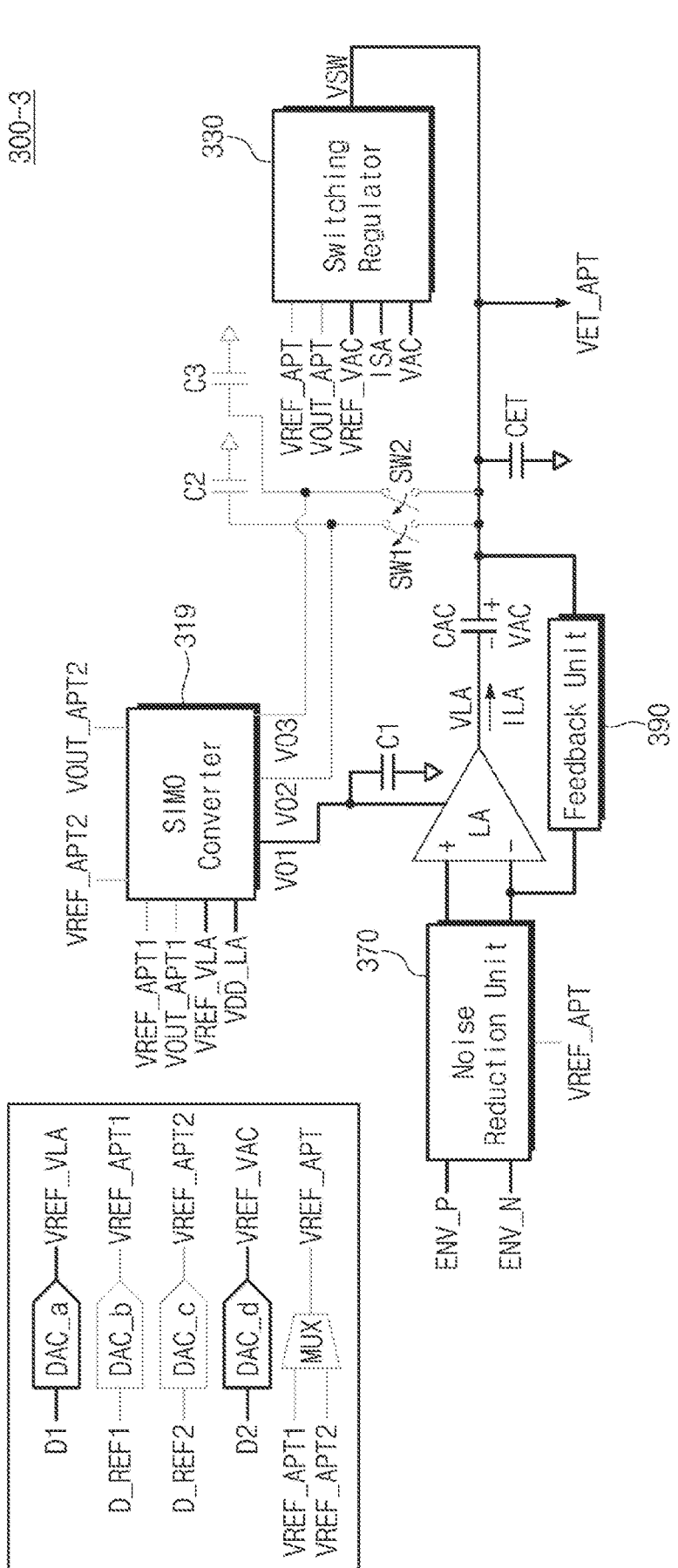
FIG. 26 is a diagram illustrating an envelope tracking mode operation of a supply modulator of FIG. 23.
Figure 27:
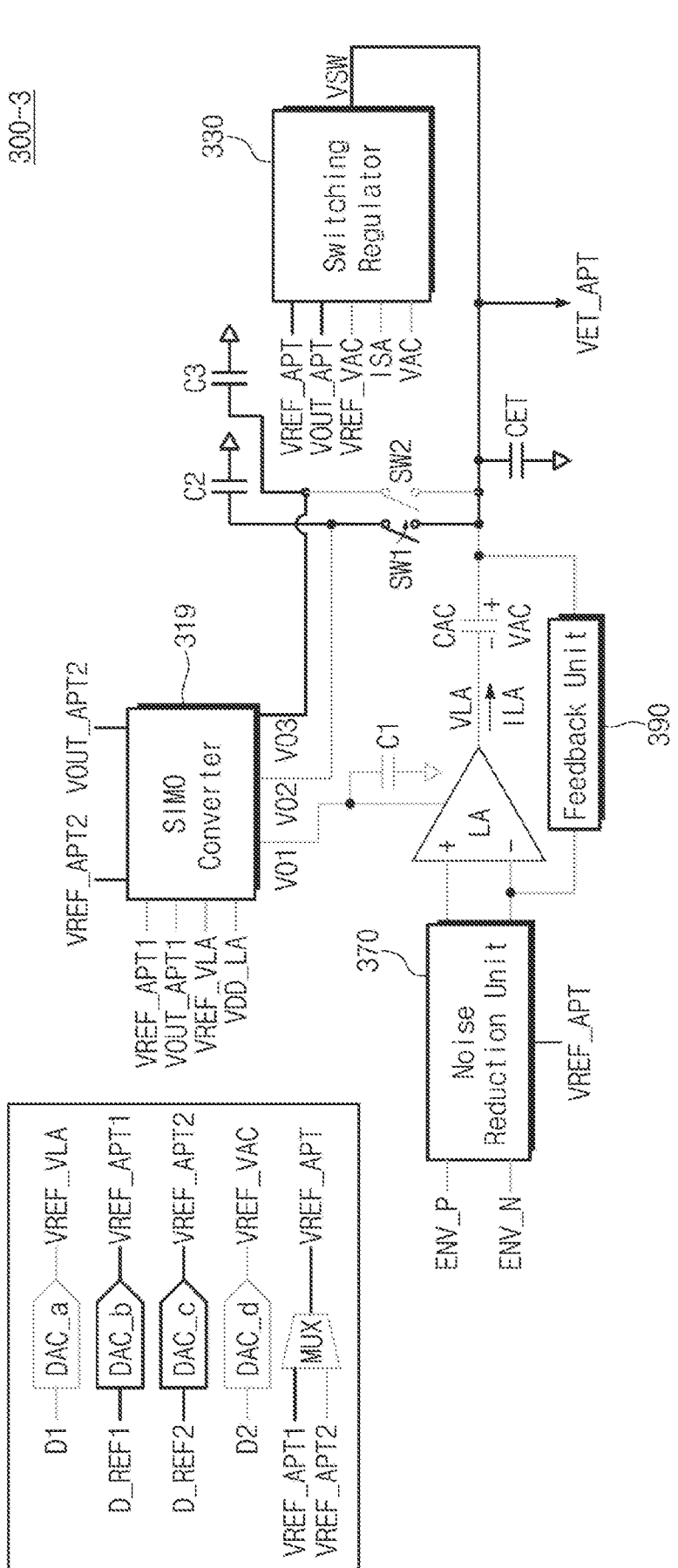
FIG. 27 is a diagram illustrating a capacitor charging operation performed by a supply modulator of FIG. 23 to change a voltage level of a modulation voltage generated according to average power tracking.
Figure 28A:
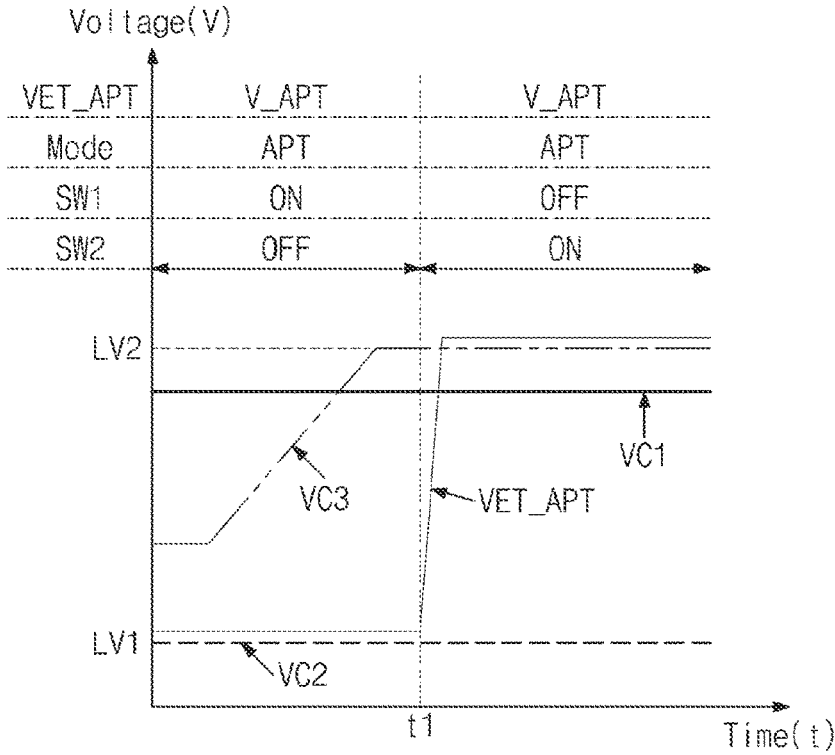
FIGS. 28A and 28B are graphs illustrating a mechanism in which a voltage level of a second modulation voltage varies.
Figure 28B:
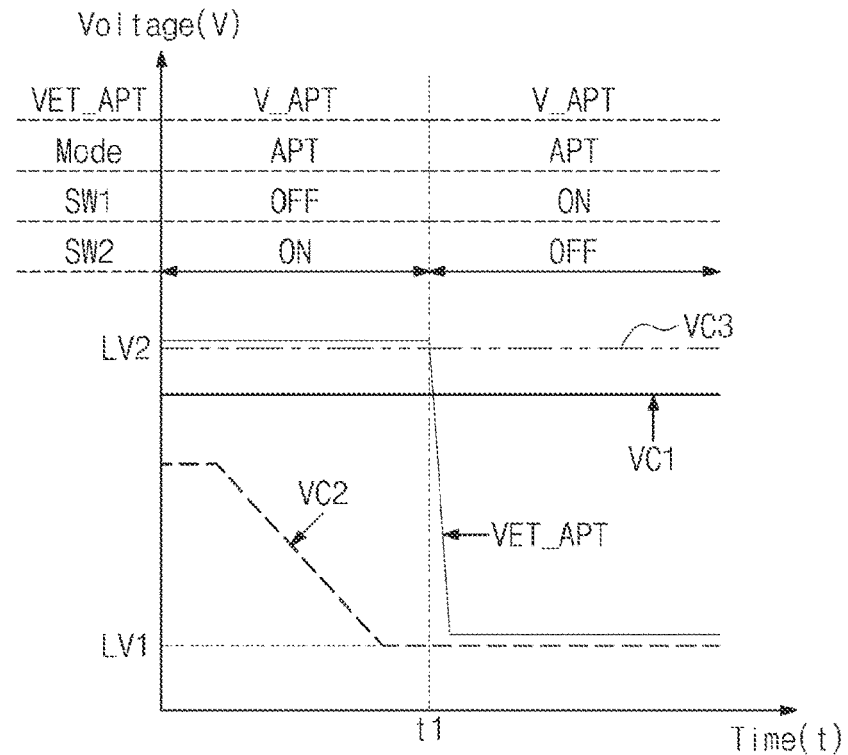
Figure 29A:
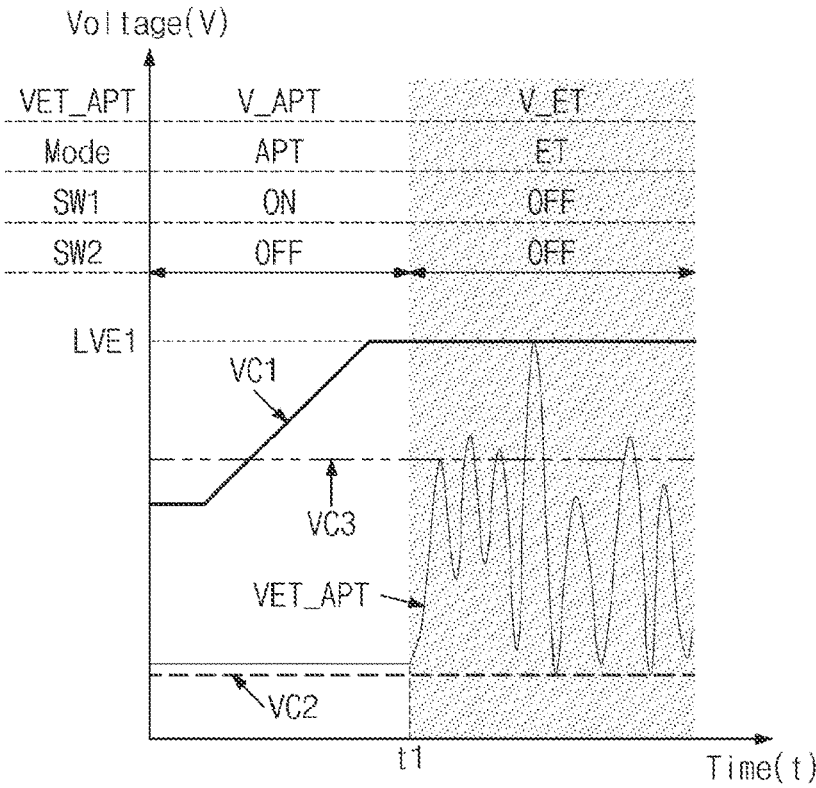
FIGS. 29A and 29B are graphs illustrating a mechanism in which an output voltage varies when a mode is switched from an average power tracking mode to an envelope tracking mode.
Figure 29B:
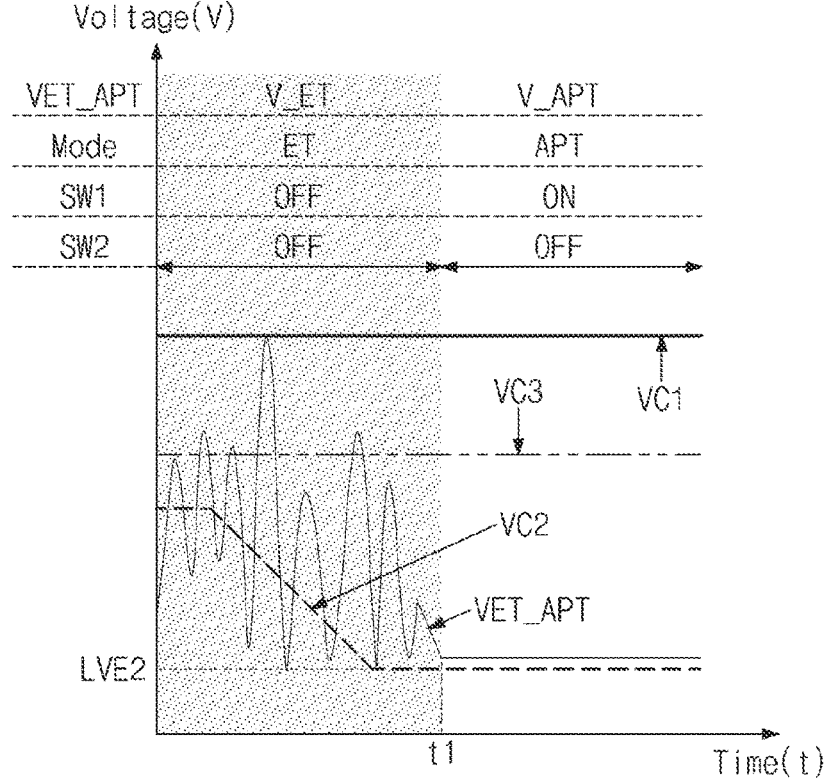
Figure 30A:
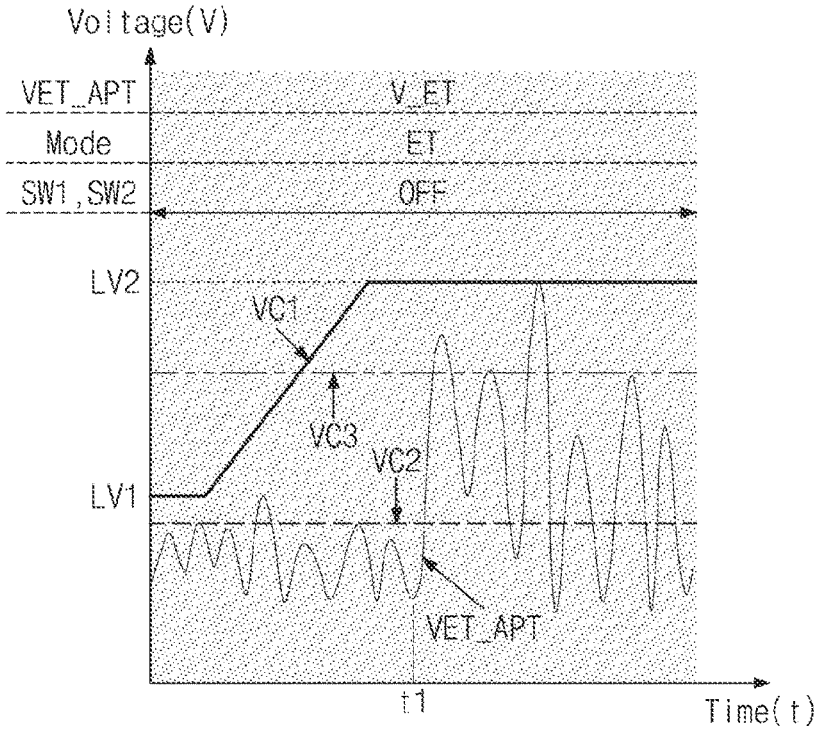
FIGS. 30A and 30B are graphs illustrating a mechanism in which an output voltage varies in an envelope tracking mode.
Figure 30B:
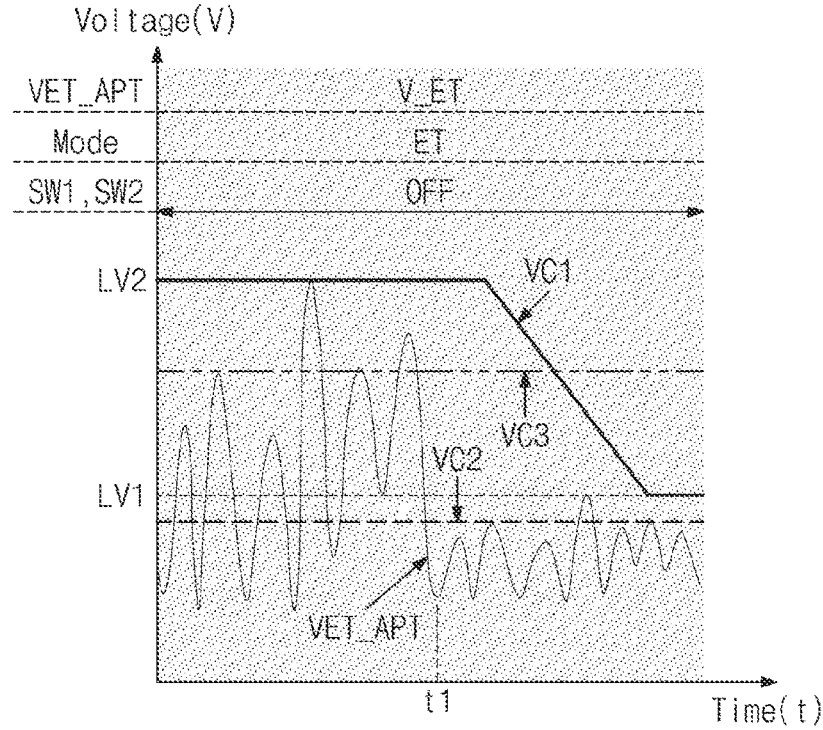

FIG. 23 is a circuit diagram illustrating a third example of a supply modulator included in a wireless communication apparatus according to some embodiments of the present disclosure. FIG. 24 is a circuit diagram illustrating a single inductor multiple output converter illustrated in FIG. 23. FIG. 25 is a diagram illustrating an average power tracking mode operation of a supply modulator of FIG. 23. FIG. 26 is a diagram illustrating an envelope tracking mode operation of a supply modulator of FIG. 23. FIG. 27 is a diagram illustrating a capacitor charging operation performed by a supply modulator of FIG. 23 to change a voltage level of a modulation voltage generated according to average power tracking. FIGS. 28A and 28B are graphs illustrating a mechanism in which a voltage level of a second modulation voltage varies. FIGS. 29A and 29B are graphs illustrating a mechanism in which an output voltage varies when a mode is switched from an average power tracking mode to an envelope tracking mode. FIGS. 30A and 30B are graphs illustrating a mechanism in which an output voltage varies in an envelope tracking mode.

Below, for convenience of description, it is assumed that a supply modulator 300-3 that is illustrated is implemented with the supply modulator 300 of the wireless communication apparatus 2 illustrated in FIG. 3. Also, the supply modulator 300-3 of FIG. 23 and the supply modulator 300-1 of FIG. 4 are identical except for some components and a mechanism, and thus, a difference will be mainly described.

Referring to FIG. 23, the third example 300-3 of a supply modulator according to an embodiment of the present disclosure may include a SIMO converter 319, the switching regulator 330, the linear regulator LA, the noise reduction unit 370, the feedback unit 390, the AC coupling capacitor CAC, first and second switches SW1 and SW2, the plurality of digital-to-analog converters DAC_a, DAC_b and DAC_c, a multiplexer MUX, and the main controller 360. In detail, unlike the supply modulator 300-1 of FIG. 4, in the case of the supply modulator 300-3 of FIG. 23, the SIMO converter 319 may include three capacitors C1 to C3, and thus, two switches SW1 and SW2 may exist.

That is, the SIMO converter 310 may include the first capacitor C1 that is connected with a power supply terminal of the linear regulator LA and is charged/discharged for a change of the tracking mode or a magnitude change of the output voltage VET_APT, the second capacitor C2 that is selectively connected with an output terminal of the linear regulator LA through the first switch SW1 and is charged/discharged for a change of the tracking mode or a magnitude change of the output voltage VET_APT, and the third capacitor C3 (for example, the third capacitor C3 being a load capacitor) that is selectively connected with the output terminal of the linear regulator LA through the second switch SW2 different from the first switch SW1 and is charged/discharged for a change of the tracking mode or a magnitude change of the output voltage VET_APT.

Also, the supply modulator 300-3 may include more digital-to-analog converters than the supply modulator 300-1 of FIG. 4 and thus may use more reference voltage signals.

That is, in the supply modulator 300-3 of FIG. 23, some D1, D_REF1, and D_REF2 of digital signals provided from the MODEM 100 may be respectively converted into analog signals, that is, reference voltage signals VREF_VLA, VREF_APT1, and VREF_APT2 through the digital-to-analog converters DAC_a, DAC_b, and DAC_c. Also, the reference voltage signals VREF_VLA, VREF_APT1, and VREF_APT2 respectively converted through the digital-to-analog converters DAC_a, DAC_b, and DAC_c may be provided to the SIMO converter 319.

As such, the SIMO converter 319 may generate and output a plurality of voltages VO1, VO2, and VO3 based on the plurality of reference voltage signals VREF_VLA, VREF_APT1, and VREF_APT2. That is, the SIMO converter 319 may step up or step down an input voltage (i.e., a power (e.g., VBAT of FIG. 5) provided from a battery) based on the plurality of reference voltage signals VREF_VLA, VREF_APT1, and VREF_APT2 and may generate and output the plurality of voltages VO1, VO2, and VO3.

In detail, the SIMO converter 319 may provide one voltage, for example, the first voltage VO1 to the linear regulator LA as a power supply voltage and may provide one of the remaining two voltages, for example, the second voltage VO2 or the third voltage VO3, to the power amplifier (e.g., PA of FIG. 3) as the output voltage VET_APT.

Referring to FIG. 24, an exemplary configuration of the SIMO converter 319 is illustrated. In detail, the SIMO converter 319 may include a conversion circuit 321 and a converter controller 324.

The conversion circuit 321 may include one inductor LBB3, a plurality of conversion switches SE1, SE2, and SE3, a plurality of output switches SE4, SE5, and SE6, and a plurality of capacitors C1, C2, and C3. As such, the conversion circuit 321 may be implemented with a buck-boosting converter that bucks (or steps down) or boosts (or steps up) the input voltage VBAT. Also, the conversion circuit 321 may generate the plurality of voltages VO1, VO2, and VO3 under control of the converter controller 324. The plurality of capacitors C1, C2, and C3 may uniformly maintain voltage levels of the plurality of voltages VO1, VO2, and VO3, respectively.

For example, the plurality of capacitors C1, C2, and C3 may be load capacitors, and a capacity of each of the plurality of capacitors C1, C2, and C3 may be from several to hundreds of uF (microfarads). Also, the plurality of capacitors C1, C2, and C3 may not be included in the SIMO converter 319. That is, the plurality of capacitors C1, C2, and C3 may be provided outside the SIMO converter 319. However, for convenience of description, an embodiment of the present disclosure will be described in which the plurality of capacitors C1, C2, and C3 are provided within the SIMO converter 319.

The converter controller 324 may generate switching control signals based on the reference voltage signals VREF_APT1, VREF_APT2, and VREF_VLA and may control a turn-on or a turn-off of the plurality of switches SA1 to SA5. As such, the plurality of voltages VO1, VO2, and VO3 may be generated based on a turn-on or a turn-off of each of the plurality of switches SA1 to SA5.

In detail, the converter controller 324 may generate the plurality of voltages VO1, VO2, and VO3 having desired levels by controlling the switching control signals by using a PWM or PFM scheme based on the plurality of reference voltage signals VREF_APT1, VREF_APT2, and VREF_VLA. Also, as levels of the plurality of voltages VO1, VO2, and VO3 are fed back to the converter controller 324 (i.e., VO1 being fed back as VDD_LA, VO2 being fed back as VOUT_APT1, and VO3 being fed back as VOUT_APT2), the converter controller 324 may control the switching control signals such that a level of each of the plurality of voltages VO1, VO2, and VO3 is set to a desired level.

In an embodiment, the configuration of the SIMO converter 319 illustrated in FIG. 24 is, but is not limited to, only an exemplary embodiment.

Returning to FIG. 23, the switching regulator 330 may operate together with the linear regulator LA for the purpose of generating the output voltage VET_APT in the ET mode and may selectively operate with the SIMO converter 319 for the purpose of generating the output voltage VET_APT in the APT mode. Also, the switching regulator 330 may be controlled by the main controller 360.

In detail, in the ET mode, the switching regulator 330 may operate in parallel with the linear regulator LA. That is, the switching regulator 330 may increase or decrease the output voltage VET_APT by controlling a turn-on or a turn-off of a switch (i.e., SB1 to SB10 of FIG. 6) included therein, based on the reference voltage signal VREF_VAC provided through the digital-to-analog converter DAC_d, the sensing signal ISA of the current ILA output from the linear regulator LA, and the voltage VAC of the AC coupling capacitor CAC.

Meanwhile, in the APT mode, when the SIMO converter 319 does not operate but the switching regulator 330 does, the switching regulator 330 may independently regulate an input voltage (i.e., a power (e.g., VBAT of FIG. 6) provided from a battery) to a target level. The switching regulator 330 may provide the regulated voltage VSW to the power amplifier (e.g., PA of FIG. 3) as the output voltage VET_APT.

In an embodiment, some D_REF1, D_REF2, and D2 of digital signals provided from the MODEM 100 may be respectively converted into reference voltage signals VREF_APT1, VREF_APT2, and VREF_VAC through digital-to-analog converters DAC_b, DAC_c, and DAC_d, and the converted reference voltage signals VREF_APT1, VREF_APT2, and VREF_VAC may be provided to the switching regulator 330. Only one of the converted reference voltage signals VREF_APT1 and VREF_APT2 may be selected through the multiplexer MUX so as to be provided to the switching regulator 330 as VREF_APT. Of course, an operation of the multiplexer MUX may be controlled by the main controller 360.

As such, when operating in the APT mode, the switching regulator 330 may be provided with one of the two reference voltage signals VREF_APT1 and VREF_APT2 through the multiplexer MUX. The switching regulator 330 may generate the modulation voltage VSW based on the provided reference voltage signal VREF_APT1 or VREF_APT2.

In detail, in the APT mode, when the first switch SW1 is turned on and the second switch SW2 is turned off, the reference voltage signal VREF_APT1 may be selected through the multiplexer MUX and may be provided to the switching regulator 330. In contrast, in the APT mode, when the first switch SW1 is turned off and the second switch SW2 is turned on, the reference voltage signal VREF_APT2 may be selected through the multiplexer MUX and may be provided to the switching regulator 330. As such, when driven in the APT mode or the ET mode, the switching regulator 330 may generate the modulation voltage VSW by using the reference voltage signals VREF_APT1, VREF_APT2, and VREF_VAC.

The main controller 360 may decide the tracking mode and may control at least one of the first switch SW1, the second switch SW2, the linear regulator LA, the switching regulator 330, the SIMO converter 319, the multiplexer MUX, the noise reduction unit 370, and the feedback unit 390 based on the decided tracking mode. In detail, the MODEM 100 may provide the main controller 360 with the tracking mode decision signal and may decide the tracking mode of the supply modulator 300-3 based on the provided tracking mode decision signal.

As such, when the tracking mode is decided to be the ET mode, the main controller 360 may turn off the first and second switches SW1 and SW2 and may control a parallel operation of the linear regulator LA and the switching regulator 330. In this case, the linear regulator LA and the switching regulator 330 may together generate the first modulation voltage according to the ET and may provide the generated first modulation voltage to the power amplifier (e.g., PA of FIG. 3) as the output voltage VET_APT.

In contrast, when the tracking mode is decided to be the APT mode, the main controller 360 may turn on at least one of the first and second switches SW1 and SW2 and may control an output voltage generating operation of one of the SIMO converter 319 and the switching regulator 330. In this case, one of the SIMO converter 319 and the switching regulator 330 may generate the second modulation voltage according to the APT and may provide the generated second modulation voltage to the power amplifier (e.g., PA of FIG. 3) as the output voltage VET_APT.

In an embodiment, in the case where the SIMO converter 319 generates the second modulation voltage according to the APT in the APT mode, under control of the main controller 360, a voltage charged to one of the second and third capacitors C2 and C3 of the SIMO converter 319 may be supplied to the power amplifier (e.g., PA of FIG. 3) as the output voltage VET_APT.

As such, the supply modulator 300-3 of FIG. 23 may have the above configuration and characteristic, and an operation of the supply modulator 300-3 according to the tracking mode will be described with reference to FIGS. 25 to 27.

In an embodiment, in FIGS. 25 to 27, a portion marked by a bold line represents an operation enable path in the corresponding drawing. Each drawing will be described with reference to FIG. 23 together.

First, referring to FIG. 25, an operation of the supply modulator 300-3 in the APT mode is illustrated.

The MODEM 100 may provide the main controller 360 with the APT mode decision signal and may decide the APT mode of the supply modulator 300-3 based on the provided APT mode decision signal. In this case, the main controller 360 may turn on at least one of the first and second switches SW1 and SW2 based on the decided tracking mode. Also, one of the SIMO converter 319 and the switching regulator 330 may generate the second modulation voltage VO2, VO3, or VSW according to the APT, under control of the main controller 360, and may provide the generated second modulation voltage VO2, VO3, or VSW to the power amplifier (e.g., PA of FIG. 3) as the output voltage VET_APT.

In detail, to generate the second modulation voltage VSW according to the APT, the switching regulator 330 may be provided with the reference voltage signal VREF_APT (in FIG. 25, an example illustrated as VREF_APT1 is selected as VREF_APT) through the multiplexer MUX. The switching regulator 330 may compare the reference voltage signal VREF_APT and the current output voltage VOUT_APT. Here, the current output voltage VOUT_APT, which is a current voltage value of VSW, may be a voltage value of VET_APT according to a current tracking mode. The switching regulator 330 may generate the second modulation voltage VSW based on a comparison result. Also, the switching regulator 330 may provide the generated second modulation voltage VSW to the power amplifier (e.g., PA of FIG. 3) as the output voltage VET_APT. Of course, even in the case where the switching regulator 330 generates the second modulation voltage VSW, at least one of the first and second switches SW1 and SW2 may be turned on (in FIG. 25, an example illustrated as the first switch SW1 is turned on and the second switch SW2 is turned off).

Although not illustrated in the drawings, in the case where the SIMO converter 319 generates the second modulation voltage VO2 according to the APT under control of the main controller 360, the SIMO converter 319 may be provided with the reference voltage signal VREF_APT1 or VREF_APT2 from the digital-to-analog converter DAC_b or DAC_c. The SIMO converter 319 may generate the second modulation voltage VO2 or VO3 based on a result of comparing the provided reference voltage signal VREF_APT1 or VREF_APT2 and a current output voltage VOUT_APT1 or VOUT_APT2. Here, the current output voltage VOUT_APT1 or VOUT_APT2, which is a current voltage value of VO2 or VO3, may be a voltage value of VET_APT according to a current tracking mode. Also, the SIMO converter 319 may provide the generated second modulation voltage VO2 or VO3 to the power amplifier (e.g., PA of FIG. 3) as the output voltage VET_APT.

Next, referring to FIG. 26, an operation of the supply modulator 300-3 in the ET mode is illustrated.

The MODEM 100 may provide the main controller 360 with the ET mode decision signal and may decide the ET mode of the supply modulator 300-3 based on the provided ET mode decision signal. In this case, the main controller 360 may turn off the first and second switches SW1 and SW2 based on the decided tracking mode. Also, the linear regulator LA and the switching regulator 330 may together generate the first modulation voltage according to the ET through a parallel operation under control of the main controller 360 and may provide the generated first modulation voltage to the power amplifier (e.g., PA of FIG. 3) as the output voltage VET_APT.

In detail, as illustrated in FIG. 26, the SIMO converter 319 may be provided with the reference voltage signal VREF_VLA from the digital-to-analog converter DAC_a. The SIMO converter 319 may generate the voltage VO1 to be provided to the linear regulator LA as a power supply voltage, based on a result of comparing the provided reference voltage signal VREF_VLA and a current output voltage VO1 (i.e., VDD_LA) of the SIMO converter 319.

The linear regulator LA may be provided with the power supply voltage VO1 from the SIMO converter 319 and may be provided with the noise-free analog envelope signals ENV_P and ENV_N from the noise reduction unit 370. Also, the linear regulator LA may amplify and output the provided analog envelope signals ENV_P and ENV_N by using the power supply voltage VO1.

Here, an output of the linear regulator LA may be fed back to the negative terminal (−) of the linear regulator LA through the feedback unit 390, and thus, an output level of the linear regulator LA may be adjusted based on the feedback result.

Meanwhile, the switching regulator 330 may be provided with the reference voltage signal VREF_VAC from the digital-to-analog converter DAC_d. Also, the switching regulator 330 may generate and output a current (e.g., ISW of FIG. 8) based on the provided reference voltage signal VREF_VAC, the sensing signal ISA of the current ILA output from the linear regulator LA, and the voltage VAC of the AC coupling capacitor CAC.

The output current (e.g., ISW of FIG. 8) of the switching regulator 330 and the output current (e.g., ILA) of the linear regulator LA, which are generated through the above procedure, may be combined, and the combined current may be provided to the power amplifier (e.g., PA of FIG. 3) as a current (e.g., IET_APT of FIG. 8) forming the power supply voltage VET_APT.

Finally, referring to FIG. 27, an operation of the supply modulator 300-3 for changing a voltage level of the second modulation voltage (e.g., a modulation voltage according to the APT mode) is illustrated. In an embodiment, FIG. 27 illustrates how to change a voltage level of the second modulation voltage in a state in which the second modulation voltage supplied by the second capacitor C2 or the second modulation voltage supplied by the switching regulator 330 is provided to the power amplifier (e.g., PA of FIG. 3) as the output voltage VET_APT.

In detail, in a current period (i.e., a current TTI), under control of the main controller 360, the first switch SW1 may be turned on, and the second switch SW2 may be turned off. In the current period, the switching regulator 330 may be provided with the reference voltage signal VREF_APT (i.e., the reference voltage signal VREF_APT1 being selected through the multiplexer MUX) through the multiplexer MUX. Also, the switching regulator 330 may generate the second modulation voltage VSW based on a result of comparing the reference voltage signal VREF_APT and the current output voltage VOUT_APT. Here, the current output voltage VOUT_APT, which is a current voltage value of VSW, may be a voltage value of VET_APT according to a current tracking mode. As such, the second modulation voltage VSW supplied by the second capacitor C2 or the second modulation voltage supplied by the switching regulator 330 may be provided to the power amplifier (e.g., PA of FIG. 3) as the output voltage VET_APT.

In this situation, to change a voltage level of the second modulation voltage in a next period (i.e., a next TTI), the SIMO converter 319 may in advance charge or discharge the third capacitor C3 to an expected voltage level in the current period such that a voltage of the third capacitor C3 is set to an expected voltage level of the second modulation voltage (i.e., an expected voltage level of the output voltage VET_APT) before the next period starts. Here, the expected voltage level may be a voltage level that the second modulation voltage is intended to reach through a voltage change.

Here, the SIMO converter 319 may be provided with the reference voltage signal VREF_APT2 from the digital-to-analog converter DAC_c. The SIMO converter 319 may in advance charge or discharge the third capacitor C3 based on a result of comparing the provided reference voltage signal VREF_APT2 and the current output voltage VOUT_APT2 (i.e., meaning a current voltage value of VO3).

In this case, in a next period, under control of the main controller 360, the first switch SW1 may be turned off, and the second switch SW2 may be turned on. As such, a voltage of the third capacitor C3 may be applied to the power amplifier (e.g., PA of FIG. 3) as the second modulation voltage (i.e., the output voltage VET_APT). That is, a voltage level of the second modulation voltage may be quickly changed by charging/discharging a capacitor(s) in advance.

As described above, the supply modulator 300-3 may operate in the APT mode or the ET mode based on the above principle, and a mechanism in which an output voltage varies in each tracking mode will be described with reference to FIGS. 28A to 30B.

In an embodiment, a mechanism in which a voltage level of the second modulation voltage varies is illustrated in FIGS. 28A and 28B, a mechanism in which an output voltage varies when a mode is switched from the APT mode to the ET mode is illustrated in FIGS. 29A and 29B, and a mechanism in which an output voltage varies in the ET mode is illustrated in FIGS. 30A and 30B. The description will be given sequentially. Also, in each drawing, the description will be given under the assumption that a time interval unit by which a level of an output voltage is changed is the transmission time interval (TTI).

First, FIG. 28A illustrates how a voltage level of the second modulation voltage V_APT (i.e., a voltage level of the output voltage VET_APT) increases from the first voltage level LV1 to the second voltage level LV2 higher than the first voltage level LV1 in a state where the first switch SW1 is turned on, the second switch SW2 is turned off, and the second modulation voltage V_APT (e.g., the voltage VC2 of the second capacitor C2 charged to the first voltage level LV1) is being supplied to the power amplifier (e.g., PA of FIG. 3) as the output voltage VET_APT.

Referring to FIGS. 23 and 28A, the MODEM 100 may provide the main controller 360 with the output voltage magnitude signal for changing a voltage level of the output voltage VET_APT from the first voltage level LV1 to the second voltage level LV2. In response to the output voltage magnitude signal, the SIMO converter 319 may charge a voltage VC3 of the third capacitor C3 to the second voltage level LV2 in advance before the time point t1 (i.e., a start time point of a next period (e.g., a next TTI)) when the voltage level of the second modulation voltage V_APT starts to change. At the time point t1 at which the voltage level of the second modulation voltage V_APT starts to change, the main controller 360 may turn off the first switch SW1 and may turn on the second switch SW2.

As such, when the first switch SW1 is turned off and the second switch SW2 is turned on, the voltage VC3 charged to the third capacitor C3 may be provided to the power amplifier (e.g., PA of FIG. 3) as the second modulation voltage V_APT. As such, the voltage level of the second modulation voltage V_APT may be quickly increased to the second voltage level LV2 from the first voltage level LV1. That is, the voltage level of the second modulation voltage V_APT (i.e., a voltage level of the output voltage VET_APT) may be quickly increased through the mechanism described above. In addition, unlike FIG. 14A, stabilization is possible after quickly reaching a target voltage level (i.e., the second voltage level LV2) without switching to APT mode-ET mode-APT mode and a standby period (i.e., t1' to t2 of FIG. 14A) necessary to switch from the ET mode to the APT mode.

In an embodiment, from a specific time point after t1, instead of the third capacitor C3, the switching regulator 330 may generate the second modulation voltage V_APT (of course, a modulation voltage of the second voltage level LV2) and may provide the output voltage VET_APT to the power amplifier (e.g., PA of FIG. 3). That is, after t1 and before a next change time point (e.g., a tracking mode change or an output voltage magnitude change), the voltage VC3 of the third capacitor C3 may continue to be provided to the power amplifier (e.g., PA of FIG. 3) as the output voltage VET_APT, or a voltage generated by the switching regulator 330 may be provided to the power amplifier (e.g., PA of FIG. 3) instead of the voltage VC3 of the third capacitor C3. However, in an embodiment of the present disclosure, a situation after t1 will be omitted.

Although at least two of VC1, VC2, VC3, and VET_APT have the same voltage value in a specific period, FIG. 28A represents each of VC1, VC2, VC3, and VET_APT with non-overlapping lines for better illustration and understanding.

Meanwhile, FIG. 28B illustrates how a voltage level of the second modulation voltage V_APT (i.e., a voltage level of the output voltage VET_APT) decreases from the second voltage level LV2 to the first voltage level LV1 lower than the second voltage level LV2 in a state where the second switch SW2 is turned on, the first switch SW1 is turned off, and the second modulation voltage V_APT (e.g., the voltage VC3 of the third capacitor C3 charged to the second voltage level LV2) is being supplied to the power amplifier (e.g., PA of FIG. 3) as the output voltage VET_APT.

Referring to FIGS. 23 and 28B, the MODEM 100 may provide the main controller 360 with the output voltage magnitude signal for changing a voltage level of the output voltage VET_APT from the second voltage level LV2 to the first voltage level LV1. In response to the output voltage magnitude signal, the SIMO converter 319 may discharge the voltage VC2 of the second capacitor C2 to the first voltage level LV1 in advance before the time point t1 (i.e., a start time point of a next period (e.g., a next TTI)) when the voltage level of the second modulation voltage V_APT starts to change. At the time point t1 at which the voltage level of the second modulation voltage V_APT starts to change, the main controller 360 may turn on the first switch SW1 and may turn off the second switch SW2.

As such, when the first switch SW1 is turned on and the second switch SW2 is turned off, the voltage VC2 of the second capacitor C2 may be provided to the power amplifier (e.g., PA of FIG. 3) as the second modulation voltage V_APT. As such, the voltage level of the second modulation voltage V_APT may be quickly decreased from the second voltage level LV2 to the first voltage level LV1.

That is, the voltage level of the second modulation voltage V_APT (i.e., a voltage level of the output voltage VET_APT) may be quickly decreased through the mechanism described above. In addition, unlike FIG. 14B, stabilization is possible after quickly reaching a target voltage level (i.e., the first voltage level LV1) without switching to APT mode-ET mode-APT mode and a standby period (i.e., t1' to t2 of FIG. 14B) necessary to switch from the ET mode to the APT mode.

In an embodiment, from a specific time point after t1, instead of the second capacitor C2, the switching regulator 330 may generate the second modulation voltage V_APT (of course, a modulation voltage of the first voltage level LV1) and may provide the output voltage VET_APT to the power amplifier (e.g., PA of FIG. 3). That is, after t1 and before a next change time point (e.g., a tracking mode change or an output voltage magnitude change), the voltage VC2 of the second capacitor C2 may continue to be provided to the power amplifier (e.g., PA of FIG. 3) as the output voltage VET_APT, or a voltage generated by the switching regulator 330 may be provided to the power amplifier (e.g., PA of FIG. 3) instead of the voltage VC2 of the second capacitor C2. However, in an embodiment of the present disclosure, a situation after t1 will be omitted.

Although at least two of VC1, VC2, VC3, and VET_APT have the same voltage value in a specific period, FIG. 28B represents each of VC1, VC2, VC3, and VET_APT with non-overlapping lines for better illustration and understanding.

FIG. 29A illustrates the case where a voltage level of the first capacitor C1 in the APT mode is lower than an expected voltage level of the first modulation voltage V_ET according to the ET mode in a state where the first switch SW1 is turned on, the second switch SW2 is turned off, and the APT mode has to be switched to the ET mode. FIG. 29A is associated with the case where the voltage VC2 of the second capacitor C2 is provided as the output voltage VET_APT through the first switch SW1.

Referring to FIGS. 23 and 29A, the MODEM 100 may provide the main controller 360 with the tracking mode decision signal, for switching from the APT mode to the ET mode, and the output voltage magnitude signal indicating that the expected voltage level of the output voltage VET_APT after a mode change is "LVE1". As such, after the SIMO converter 319 charges the voltage VC1 of the first capacitor C1 to the expected voltage level LVE1 of the first modulation voltage V_ET in advance before the tracking mode change time point t1 under control of the main controller 360, the main controller 360 may switch from the APT mode to the ET mode. In an embodiment, the expected voltage level LVE1 of the first modulation voltage V_ET may be a peak level within the corresponding TTI (e.g., a TTI starting from t1).

Here, when the tracking mode is changed to the ET mode at t1, the first switch SW1 may be turned off under control of the main controller 360, and the voltage VC1 charged to the first capacitor C1 may be provided to the linear regulator LA as a power supply voltage. Under control of the main controller 360, the linear regulator LA may operate in parallel with the switching regulator 330 to generate the first modulation voltage V_ET. As such, a modulation voltage that is provided as the output voltage VET_APT may be quickly changed from the second modulation voltage V_APT to the first modulation voltage V_ET. That is, through the above mechanism, a modulation voltage may be quickly changed upon switching from the APT mode to the ET mode.

Although at least two of VC1, VC2, VC3, and VET_APT have the same voltage value in a specific period, FIG. 29A represents each of VC1, VC2, VC3, and VET_APT with non-overlapping lines for better illustration and understanding.

Meanwhile, FIG. 29B illustrates the case where a voltage level of the second capacitor C2 in the ET mode is higher than an expected voltage level LVE2 of the second modulation voltage V_APT according to the APT mode in a state where the first and second switches SW1 and SW2 are turned off and the ET mode has to be switched to the APT mode. This is associated with the case where the voltage VC2 charged to the second capacitor C2 is higher than the expected voltage level LVE2.

In this case, referring to FIGS. 23 and 29B, the MODEM 100 may provide the main controller 360 with the tracking mode decision signal (i.e., a signal directing a switch from the ET mode to the APT mode) and the output voltage magnitude signal (i.e., indicating that the expected voltage level of the output voltage VET_APT after a mode change is "LVE2"). As such, after the SIMO converter 319 discharges the voltage VC2 of the second capacitor C2 to the expected voltage level LVE2 of the second modulation voltage V_APT in advance before the tracking mode change time point t1 under control of the main controller 360, the main controller 360 may turn on the first switch SW1 and may switch from the ET mode to the APT mode.

Here, when the tracking mode is changed to the APT mode at t1, the first switch SW1 may be turned on under control of the main controller 360, and the voltage VC2 of the second capacitor C2 may be provided to the power amplifier (e.g., PA of FIG. 3) as the output voltage VET_APT. As such, a modulation voltage that is provided as the output voltage VET_APT may be quickly changed from the first modulation voltage V_ET to the second modulation voltage V_APT. That is, through the above mechanism, a modulation voltage may be quickly changed upon switching from the ET mode to the APT mode.

In an embodiment, from a specific time point after t1, instead of the second capacitor C2, the switching regulator 330 may generate the second modulation voltage V_APT (of course, a modulation voltage of the expected voltage level LVE2) and may provide the output voltage VET_APT to the power amplifier (e.g., PA of FIG. 3). That is, after t1 and before a next change time point (e.g., a tracking mode change or an output voltage magnitude change), the voltage VC2 of the second capacitor C2 may continue to be provided to the power amplifier (e.g., PA of FIG. 3) as the output voltage VET_APT, or a voltage generated by the switching regulator 330 may be provided to the power amplifier (e.g., PA of FIG. 3) instead of the voltage VC2 of the second capacitor C2. However, in an embodiment of the present disclosure, a situation after t1 will be omitted.

Although at least two of VC1, VC2, VC3, and VET_APT have the same voltage value in a specific period, FIG. 29B represents each of VC1, VC2, VC3, and VET_APT with non-overlapping lines for better illustration and understanding.

FIG. 30A illustrates how to increase a maximum voltage level of the first modulation voltage V_ET, in a next period (e.g., a next TTI) belonging to the ET mode, to the second voltage level LV2 higher than the first voltage level LV1 in a state in which a maximum voltage level of the first modulation voltage V_ET in a current period (e.g., a current TTI) belonging to the ET mode is the first voltage level LV1.

Referring to FIGS. 23 and 30A, the MODEM 100 may provide the main controller 360 with the output voltage magnitude signal for changing a maximum voltage level of the output voltage VET_APT from the first voltage level LV1 to the second voltage level LV2. In response to the output voltage magnitude signal, the SIMO converter 319 may charge the voltage VC1 of the first capacitor C1 to the second voltage level LV2 in advance in a current period. Under control of the main controller 360, the voltage VC1 of the first capacitor C1, which is charged to the second voltage level LV2 in advance before entering a next period, may be provided to the linear regulator LA as a power supply voltage. Of course, because the ET mode is maintained without changing the tracking mode, all the first and second switches SW1 and SW2 maintain a turn-off state.

Here, when the switching from a current period to a next period is made at t1 in the ET mode, under control of the main controller 360, the voltage VC1 charged to the first capacitor C1 may be provided to the linear regulator LA as a power supply voltage in advance before entering the next period. As such, the voltage level of the first modulation voltage V_ET may be stably increased without a clipping phenomenon. That is, through the above mechanism, the voltage level of the first modulation voltage V_ET may be stably increased without the clipping phenomenon.

Meanwhile, FIG. 30B illustrates how to decrease a maximum voltage level of the first modulation voltage V_ET, in a next period (e.g., a next TTI) belonging to the ET mode, to the first voltage level LV1 lower than the second voltage level LV2 in a state where a maximum voltage level of the first modulation voltage V_ET in a current period (e.g., a current TTI) belonging to the ET mode is the second voltage level LV2.

Referring to FIGS. 23 and 30B, the MODEM 100 may provide the main controller 360 with the output voltage magnitude signal for changing a maximum voltage level of the output voltage VET_APT from the second voltage level LV2 to the first voltage level LV1. The SIMO converter 319 may maintain the voltage VC1 of the first capacitor C1 at the second voltage level LV2 in a current period under control of the main controller 360. Afterwards, when a next period starts (i.e., after the next period starts), in response to the output voltage magnitude signal, the SIMO converter 319 may discharge the voltage VC1 of the first capacitor C1, charged to the second voltage level LV2, to the first voltage level LV1. Of course, because the ET mode is maintained without changing the tracking mode, the first and second switches SW1 and SW2 maintain a turn-off state.

At t1, when the switching from the current period to the next period in the ET mode is made, under control of the main controller 360, the voltage VC1 of the first capacitor C1 may be provided to the linear regulator LA as a power supply voltage after entering the next period. As such, the voltage level of the first modulation voltage V_ET may be stably decreased without a clipping phenomenon. That is, through the above mechanism, the voltage level of the first modulation voltage V_ET may be stably decreased without the clipping phenomenon.

The third example 300-3 of a supply modulator according to an embodiment of the present disclosure is described above. Below, a fourth example of a supply modulator according to an embodiment of the present disclosure will be described with reference to FIG. 31.

Figure 31:
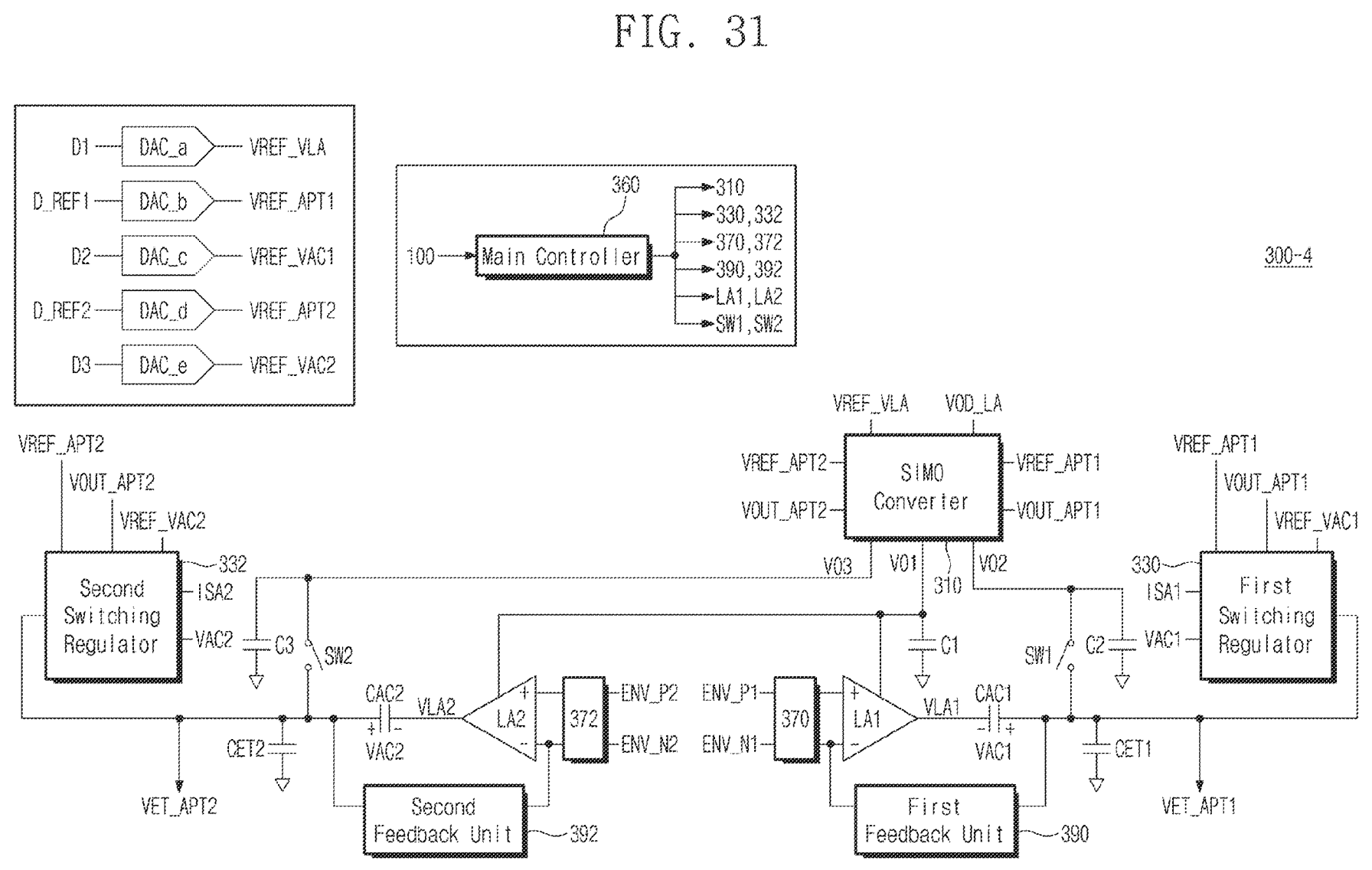

FIG. 31 is a circuit diagram illustrating a fourth example of a supply modulator included in a wireless communication apparatus according to some embodiments of the present disclosure.

In an embodiment, below, for convenience of description, it is assumed that a supply modulator 300-4 is implemented with the supply modulator 300 of the wireless communication apparatus 2 illustrated in FIG. 3. Also, the supply modulator 300-4 of FIG. 31 and the supply modulator 300-1 of FIG. 4 are identical except for some components and a mechanism, and thus, a difference will be mainly described.

Referring to FIG. 31, a fourth example 300-4 of a supply modulator according to an embodiment of the present disclosure may include the SIMO converter 310, first and second switching regulators 330 and 332, first and second linear regulators LA1 and LA2, first and second noise reduction units 370 and 372, first and second feedback units 390 and 392, first and second AC coupling capacitors CAC1 and CAC2, first and second switches SW1 and SW2, a plurality of digital-to-analog converters DAC_a to DAC_e, and the main controller 360.

In detail, the supply modulator 300-4 of FIG. 31 may be intended to supply output voltages VET_APT1 and VET_APT2 to a plurality of power amplifiers (e.g., in the case where PA of FIG. 3 is provided in plurality, for example, first and second power amplifiers), respectively. As such, the supply modulator 300-4 of FIG. 31 may further include one switching regulator, one linear regulator, one noise reduction unit, one feedback unit, one AC coupling capacitor, and one switch compared to the supply modulator 300-1 of FIG. 4.

Also, because the supply modulator 300-4 of FIG. 31 requires more reference voltage signals than the supply modulator 300-1 of FIG. 4, the number of digital-to-analog converters included in the supply modulator 300-4 may be two more than that included in the supply modulator 300-1. As such, the supply modulator 300-4 of FIG. 31 may use five reference voltage signals VREF_VLA, VREF_APT1, VREF_VAC1, VREF_APT2, and VREF_VAC2 respectively converted through the five digital-to-analog converters DAC_a to DAC_e. VREF_VAC2 is converted by digital-to-analog converter DAC_e from digital signal D3.

As in the supply modulator 300-1 of FIG. 4, the supply modulator 300-4 of FIG. 31 may include one SIMO converter; however, unlike the SIMO converter 310 of FIG. 4, the SIMO converter 310 of FIG. 31 may include three capacitors C1 to C3 (the capacitors C1 to C3 being capable of being implemented as external elements of the SIMO converter 310) and may generate and output three voltages VO1, VO2, and VO3 through three output terminals. As such, in the supply modulator 300-4 of FIG. 31, the first voltage VO1 of the SIMO converter 310 may be provided to at least one of the first and second linear regulators LA1 and LA2, and the second and third voltages VO2 and VO3 of the SIMO converter 310 may be provided to the second and third capacitors C2 and C3, respectively.

For convenience of description, assuming that the first linear regulator LA1 and the first switching regulator 330 constitute a first modulation circuit and the second linear regulator LA2 and the second switching regulator 332 constitute a second modulation circuit, each component of the supply modulator 300-4 will be simply described below.

The first modulation circuit may include the first linear regulator LA1, which operates to generate the first output voltage VET_APT1 in the ET mode, and the first switching regulator 330, which operates together with the first linear regulator LA1 to generate the first output voltage VET_APT1 in the ET mode and selectively operates to generate the first output voltage VET_APT1 in the APT mode, and may provide the first output voltage VET_APT1 to a first power amplifier (e.g., PA of FIG. 3).

The second modulation circuit may include the second linear regulator LA2, which operates to generate the second output voltage VET_APT2 in the ET mode, and the second switching regulator 332, which operates together with the second linear regulator LA2 to generate the second output voltage VET_APT2 in the ET mode and selectively operates to generate the second output voltage VET_APT2 in the APT mode, and may provide the second output voltage VET_APT2 to a second power amplifier (e.g., PA of FIG. 3).

The SIMO converter 310 may selectively operate with a switching regulator operating in the APT mode from among the first and second switching regulators 330 and 332, and may operate to provide a power supply voltage to a linear regulator operating in the ET mode from among the first and second linear regulators LA1 and LA2. The SIMO converter 310 may include the first capacitor C1 that is connected with a power supply terminal of each of the first and second linear regulators LA1 and LA2 and is charged/discharged for a change of the tracking mode or a magnitude change of the first or second output voltage VET_APT1 or VET_APT2, the second capacitor C2 that is selectively connected with an output terminal of the first linear regulator LA1 through the first switch SW1 and is charged/discharged for a change of the tracking mode or a magnitude change of the first output voltage VET_APT1, and the third capacitor C3 that is selectively connected with an output terminal of the second linear regulator LA2 through the second switch SW2 different from the first switch SW1 and is charged/discharged for a change of the tracking mode or a magnitude change of the second output voltage VET_APT2.

The main controller 360 may decide the tracking mode for each of the first and second power amplifiers and may control at least one of the first switch SW1, the second switch SW2, the first modulation circuit, the second modulation circuit, and the SIMO converter 310 based on the decided tracking mode. Of course, the main controller 360 may also control the first and second feedback units 390 and 392 and the first and second noise reduction units 370 and 372.

The first AC coupling capacitor CAC1 may be connected between the output terminal of the first linear regulator LA1 and a first output terminal (i.e., a portion from which VET_APT1 is output) of the supply modulator 300-4 to decrease a necessary amount of a power supply voltage of the first linear regulator LA1.

The second AC coupling capacitor CAC2 may be connected between the output terminal of the second linear regulator LA2 and a second output terminal (i.e., a portion from which VET_APT2 is output) of the supply modulator 300-4 to decrease a necessary amount of a power supply voltage of the second linear regulator LA2.

Here, the first output terminal of the supply modulator 300-4 may be connected with the first power amplifier, and the second output terminal of the supply modulator 300-4 may be connected with the second power amplifier. That is, the supply modulator 300-4 may be driven in at least one tracking mode of the ET mode and the APT mode in the same principle as the supply modulator 300-1 of FIG. 4 based on the above configuration and characteristic and may provide the first and second output voltages VET_APT1 and VET_APT2 to the first and second power amplifiers, respectively.

In an embodiment, the supply modulator 300-4 is illustrated as components that are bilaterally symmetrical with respect to the SIMO converter 310. However, the supply modulator 300-4 of FIG. 31 may include components that are bilaterally asymmetrical with respect to the SIMO converter 310. For example, one load capacitor C3 and one switch SW2 may be provided on the left of drawing, but in addition to the load capacitor C2 and the switch SW1, one load capacitor and one switch may be further provided on the right of drawing. However, for convenience of description, the case where components of the supply modulator 300-4 are bilaterally symmetrical with respect to the SIMO converter 310 is described above as an example.

Figure 32:
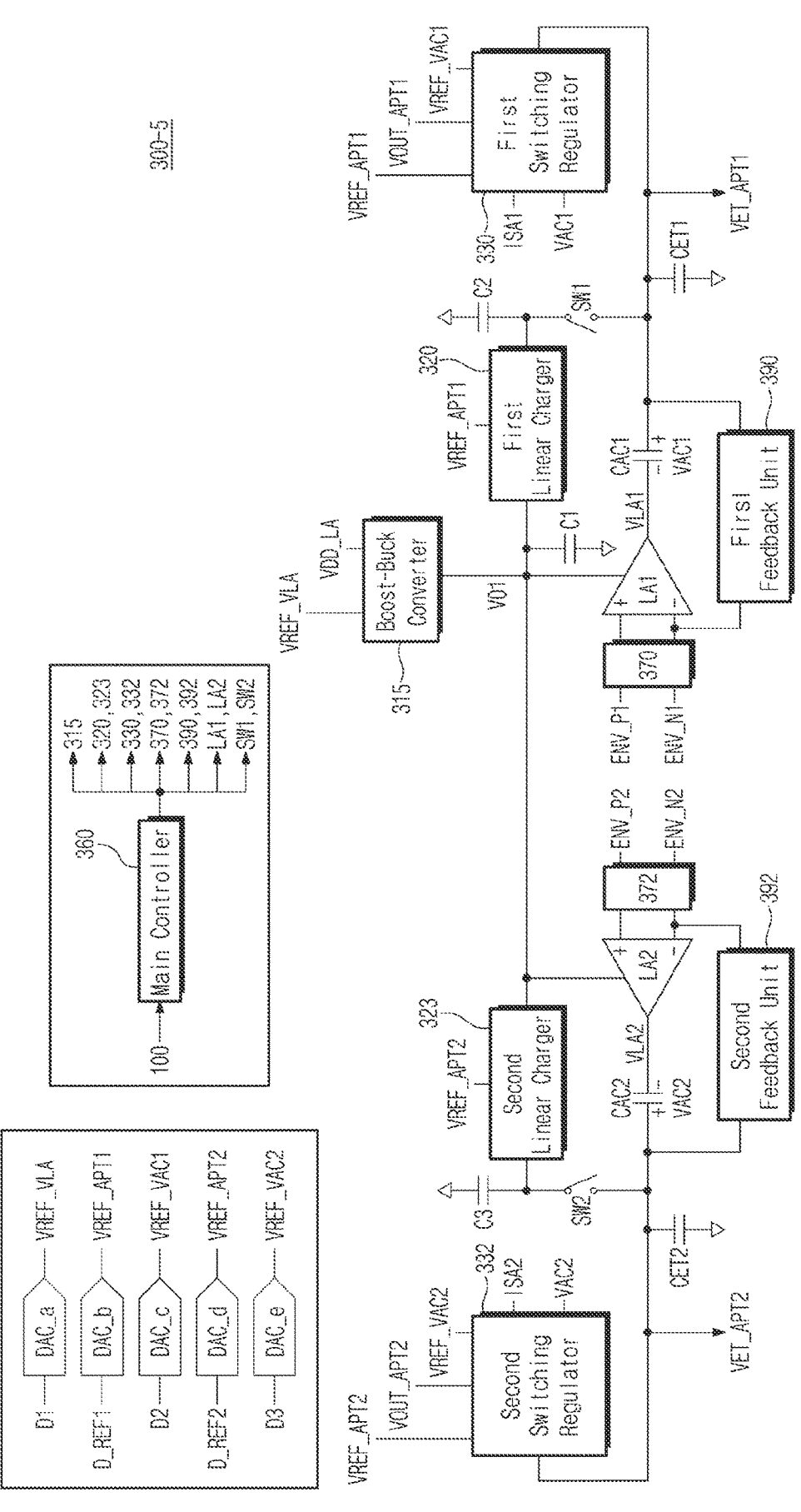
FIG. 32 is a circuit diagram illustrating a fifth example of a supply modulator included in a wireless communication apparatus according to some embodiments of the present disclosure.
Figure 33:
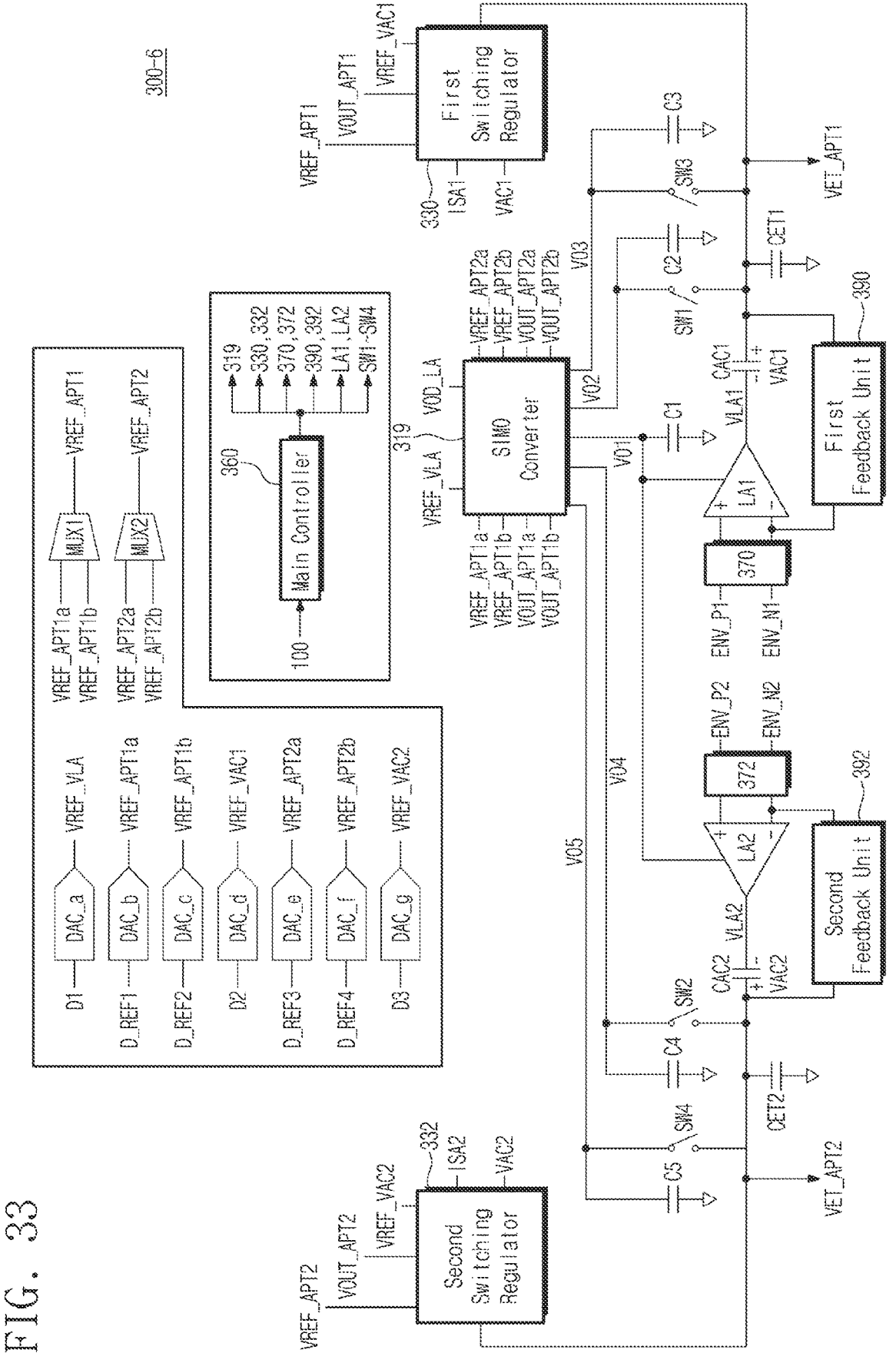
FIG. 33 is a circuit diagram illustrating a sixth example of a supply modulator included in a wireless communication apparatus according to some embodiments of the present disclosure.

In FIGS. 31-33, each of: (1) capacitors CET1 and CET2 comports with capacitor CET of FIG. 4, (2) sensing signals ISA1 and ISA2 comports with sensing signal ISA of FIG. 4, (3) voltages VAC1 and VAC2 comports with voltage VAC of FIG. 4, (4) voltages VLA1 and VLA2 comports with voltage VLA of FIG. 4, (5) voltages VAC1 and VAC2 comports with voltage VAC of FIG. 4, (6) positive signals ENV_P1 and ENV_P2 comports with positive signal ENV_P in FIG. 4, and (7) negative signals ENV_N1 and ENV_N2 comports with negative signal ENV_N in FIG. 4.

FIG. 32 is a circuit diagram illustrating a fifth example of a supply modulator included in a wireless communication apparatus according to some embodiments of the present disclosure.

Below, for convenience of description, it is assumed that a supply modulator 300-5 is implemented with the supply modulator 300 of the wireless communication apparatus 2 illustrated in FIG. 3. Also, the supply modulator 300-5 of FIG. 32 and the supply modulator 300-2 of FIG. 17 are identical except for some components and a mechanism, and thus, a difference will be mainly described.

Referring to FIG. 32, the supply modulator 300-5 according to an embodiment of the present disclosure may include the boost-buck converter 315, first and second linear chargers 320 and 323, the first and second switching regulator 330 and 332, the first and second linear regulators LA1 and LA2, the first and second noise reduction units 370 and 372, the first and second feedback units 390 and 392, the first and second AC coupling capacitors CAC1 and CAC2, the first and second switches SW1 and SW2, the plurality of digital-to-analog converters DAC_a to DAC_e, and the main controller 360.

In the case where the wireless communication apparatus 2 of FIG. 3 further includes another power amplifier (not illustrated) in addition to the power amplifier PA, the supply modulator 300-5 may be configured to supply the output voltages VET_APT1 and VET_APT2 to the power amplifiers of the wireless communication apparatus 2, respectively. For example, the supply modulator 300-5 may further include one linear charger, one switching regulator, one linear regulator, one noise reduction unit, one feedback unit, one AC coupling capacitor, and one switch compared to the supply modulator 300-2 of FIG. 17.

Because the supply modulator 300-5 requires more reference voltage signals than the supply modulator 300-2 of FIG. 17, the supply modulator 300-5 may further include more digital-to-analog converters than the supply modulator 300-2 of FIG. 17. As such, the supply modulator 300-5 may use the five reference voltage signals VREF_VLA, VREF_APT1, VREF_VAC1, VREF_APT2, and VREF_VAC2 respectively converted through the five digital-to-analog converters DAC_a to DAC_e.

The supply modulator 300-5 may include one boost-buck converter as in the supply modulator 300-2 of FIG. 17; however, unlike a boost-buck converter of FIG. 17, an output terminal of the boost-buck converter 315 may be connected with the first and second linear chargers 320 and 323 and the first and second linear regulators LA1 and LA2. As such, in the supply modulator 300-5, the first voltage VO1 of the boost-buck converter 315 may be provided to at least one of the first and second linear chargers 320 and 323 and the first and second linear regulators LA1 and LA2.

Meanwhile, two load capacitors C2 and C3 may be respectively implemented as components of the linear chargers 320 and 323 but may be implemented as external components of the linear chargers 320 and 323.

Here, for convenience of description, assuming that the first linear regulator LA1 and the first switching regulator 330 constitute a first modulation circuit and the second linear regulator LA2 and the second switching regulator 332 constitute a second modulation circuit, each component of the supply modulator 300-5 will be simply described below.

The first modulation circuit may include the first linear regulator LA1, which operates to generate the first output voltage VET_APT1 in the ET mode, and the first switching regulator 330, which operates together with the first linear regulator LA1 to generate the first output voltage VET_APT1 in the ET mode and selectively operates to generate the first output voltage VET_APT1 in the APT mode, and may provide the first output voltage VET_APT1 to a first power amplifier (e.g., PA of FIG. 3).

The second modulation circuit may include the second linear regulator LA2, which operates to generate the second output voltage VET_APT2 in the ET mode, and the second switching regulator 332, which operates together with the second linear regulator LA2 to generate the second output voltage VET_APT2 in the ET mode and selectively operates to generate the second output voltage VET_APT2 in the APT mode, and may provide the second output voltage VET_APT2 to a second power amplifier (e.g., PA of FIG. 3).

The boost-buck converter 315 may operate to provide a power supply voltage to a linear regulator operating in the ET mode from among the first and second linear regulators LA1 and LA2. The boost-buck converter 315 may include the first capacitor C1 that is connected with a power supply terminal of each of the first and second linear regulators LA1 and LA2 (i.e., connected with power supply terminals of the first and second linear regulators LA1 and LA2 and power supply terminals of the first and second linear chargers 320 and 323) and is charged/discharged for a magnitude change of the first or second output voltage VET_APT1 or VET_APT2 or a change of the tracking mode.

The first linear charger 320 may operate selectively with the first switching regulator 330 for the purpose of generating the first output voltage VET_APT1 in the APT mode. Also, the first linear charger 320 may include the second capacitor C2 that is selectively connected with the output terminal of the first linear regulator LA1 through the first switch SW1 and is charged/discharged for a change of the tracking mode or a magnitude change of the first output voltage VET_APT1.

The second linear charger 323 may operate selectively with the second switching regulator 332 for the purpose of generating the second output voltage VET_APT2 in the APT mode. Also, the second linear charger 323 may include the third capacitor C3 that is selectively connected with the output terminal of the second linear regulator LA2 through the second switch SW2 different from the first switch SW1 and is charged/discharged for a change of the tracking mode or a magnitude change of the second output voltage VET_APT2.

The main controller 360 may decide the tracking mode for each of the first and second amplifiers and may control at least one of the first switch SW1, the second switch SW2, the first modulation circuit, the second modulation circuit, and the boost-buck converter 315 based on the decided tracking mode. Of course, the main controller 360 may also control the first and second feedback units 390 and 392 and the first and second noise reduction units 370 and 372.

The first AC coupling capacitor CAC1 may be connected between the output terminal of the first linear regulator LA1 and a first output terminal (i.e., a portion from which VET_APT1 is output) of the supply modulator 300-5 to decrease a necessary amount of a power supply voltage of the first linear regulator LA1.

The second AC coupling capacitor CAC2 may be connected between the output terminal of the second linear regulator LA2 and a second output terminal (i.e., a portion from which VET_APT2 is output) of the supply modulator 300-5 to decrease a necessary amount of a power supply voltage of the second linear regulator LA2.

Here, the first output terminal of the supply modulator 300-5 may be connected with the first power amplifier, and the second output terminal of the supply modulator 300-5 may be connected with the second power amplifier.

That is, the supply modulator 300-5 may be driven in at least one tracking mode of the ET mode and the APT mode in the same principle as the supply modulator 300-2 of FIG. 17 based on the above configuration and characteristic and may provide the first and second output voltages VET_APT1 and VET_APT2 to the first and second power amplifiers, respectively.

In an embodiment, the supply modulator 300-5 is illustrated as components that are bilaterally symmetrical with respect to the boost-buck converter 315. However, the supply modulator 300-5 may include components that are bilaterally asymmetrical with respect to the boost-buck converter 315. For example, the supply modulator 300-5 may not include the linear charger 323 and the load capacitor C3 illustrated on the left of drawing. However, for convenience of description, the case where components of the supply modulator 300-5 are bilaterally symmetrical with respect to the boost-buck converter 315 is illustrated in FIG. 32 as an example.

FIG. 33 is a circuit diagram illustrating a sixth example of a supply modulator included in a wireless communication apparatus according to some embodiments of the present disclosure.

Below, for convenience of description, it is assumed that a supply modulator 300-6 is implemented with the supply modulator 300 of the wireless communication apparatus 2 illustrated in FIG. 3. Also, the supply modulator 300-6 of FIG. 33 and the supply modulator 300-3 of FIG. 23 are identical except for some components and a mechanism, and thus, a difference will be mainly described.

Referring to FIG. 33, the supply modulator 300-6 according to an embodiment of the present disclosure may include the SIMO converter 319, the first and second switching regulator 330 and 332, the first and second linear regulators LA1 and LA2, the first and second noise reduction units 370 and 372, the first and second feedback units 390 and 392, the first and second AC coupling capacitors CAC1 and CAC2, first to fourth switches SW1 to SW4, a plurality of digital-to-analog converters DAC_a to DAC_g, first and second multiplexers MUX1 and MUX2, and the main controller 360.

In the case where the wireless communication apparatus 2 of FIG. 3 further includes another power amplifier (not illustrated) in addition to the power amplifier PA, the supply modulator 300-6 may be configured to supply the output voltages VET_APT1 and VET_APT2 to the power amplifiers of the wireless communication apparatus 2, respectively. For example, compared to the supply modulator 300-3 of FIG. 23, the supply modulator 300-6 may further include one switching regulator, one linear regulator, one noise reduction unit, one feedback unit, one AC coupling capacitor, and one multiplexer and may further include two switches.

Because the supply modulator 300-6 requires more reference voltage signals than the supply modulator 300-3 of FIG. 23, the supply modulator 300-6 may further include more digital-to-analog converters than the supply modulator 300-3 of FIG. 23. As such, the supply modulator 300-6 may use seven reference voltage signals VREF_VLA, VREF_APT1a, VREF_APT1b, VREF_VAC1, VREF_APT2a, VREF_APT2b, VREF_VAC2 respectively converted through the seven digital-to-analog converters DAC_a to DAC_g.

The first multiplexer MUX1 may select one of the two reference voltage signals VREF_APT1a and VREF_APT1b so as to be provided to the first switching regulator 330. The second multiplexer MUX2 may select one of the two reference voltage signals VREF_APT2a and VREF_APT2b so as to be provided to the second switching regulator 332.

Meanwhile, unlike the SIMO converter 319 of FIG. 23, the SIMO converter 319 of FIG. 33 may include five capacitors C1 to C5 and may generate and output five voltages VO1 to VO5 through five output terminals. Here, the capacitors C1 to C5 may be implemented as components of the SIMO converter 319 or may be implemented as external components of the SIMO converter 319. As such, in the supply modulator 300-6 of FIG. 33, the first voltage VO1 of the SIMO converter 319 may be provided to at least one of the first and second linear regulators LA1 and LA2, and the second to fifth voltages VO2 to VO5 of the SIMO converter 319 may be provided to the second to fifth capacitors C2 to C5, respectively.

Here, for convenience of description, assuming that the first linear regulator LA1 and the first switching regulator 330 constitute a first modulation circuit and the second linear regulator LA2 and the second switching regulator 332 constitute a second modulation circuit, each component of the supply modulator 300-6 will be simply described below.

The first modulation circuit may include the first linear regulator LA1, which operates to generate the first output voltage VET_APT1 in the ET mode, and the first switching regulator 330, which operates together with the first linear regulator LA1 to generate the first output voltage VET_APT1 in the ET mode and selectively operates to generate the first output voltage VET_APT1 in the APT mode, and may provide the first output voltage VET_APT1 to a first power amplifier (e.g., PA of FIG. 3).

The second modulation circuit may include the second linear regulator LA2, which operates to generate the second output voltage VET_APT2 in the ET mode, and the second switching regulator 332, which operates together with the second linear regulator LA2 to generate the second output voltage VET_APT2 in the ET mode and selectively operates to generate the second output voltage VET_APT2 in the APT mode, and may provide the second output voltage VET_APT2 to a second power amplifier (e.g., PA of FIG. 3).

The SIMO converter 319 may selectively operate with a switching regulator operating in the APT mode from among the first and second switching regulators 330 and 332, and may operate to provide a power supply voltage to a linear regulator operating in the ET mode from among the first and second linear regulators LA1 and LA2. The SIMO converter 319 may include the first capacitor C1 that is connected with a power supply terminal of each of the first and second linear regulators LA1 and LA2 and is charged/discharged for a change of the tracking mode or a magnitude change of the first or second output voltage VET_APT1 or VET_APT2, the second capacitor C2 that is selectively connected with an output terminal of the first linear regulator LA1 through the first switch SW1 and is charged/discharged for a change of the tracking mode or a magnitude change of the first output voltage VET_APT1, the third capacitor C3 that is selectively connected with an output terminal of the second linear regulator LA2 through the second switch SW2 different from the first switch SW1 and is charged/discharged for a change of the tracking mode or a magnitude change of the second output voltage VET_APT2, the fourth capacitor C4 that is selectively connected with the output terminal of the first linear regulator LA1 through the third switches SW3 different from the first and second switches SW1 and SW2 and is charged/discharged for a change of the tracking mode or a magnitude change of the first output voltage VET_APT1, and the fifth capacitor C5 that is selectively connected with the output terminal of the second linear regulator LA2 through the fourth switch SW4 different from the first to third switches SW1 to SW3 and is charged/discharged for a change of the tracking mode or a magnitude change of the second output voltage VET_APT2.

The main controller 360 may decide the tracking mode for each of the first and second amplifiers and may control at least one of the first to fourth switches SW1 to SW4, the first and second multiplexers MUX1 and MUX2, the first modulation circuit, the second modulation circuit, and the SIMO converter 319 based on the decided tracking mode. Of course, the main controller 360 may also control the first and second feedback units 390 and 392 and the first and second noise reduction units 370 and 372.

The first AC coupling capacitor CAC1 may be connected between the output terminal of the first linear regulator LA1 and a first output terminal (i.e., a portion from which VET_APT1 is output) of the supply modulator 300-6 to decrease a necessary amount of a power supply voltage of the first linear regulator LA1.

The second AC coupling capacitor CAC2 may be connected between the output terminal of the second linear regulator LA2 and a second output terminal (i.e., a portion from which VET_APT2 is output) of the supply modulator 300-6 to decrease a necessary amount of a power supply voltage of the second linear regulator LA2.

Here, the first output terminal of the supply modulator 300-6 may be connected with the first power amplifier, and the second output terminal of the supply modulator 300-6 may be connected with the second power amplifier.

That is, the supply modulator 300-6 may be driven in at least one tracking mode of the ET mode and the APT mode in the same principle as the supply modulator 300-3 of FIG. 23 based on the above configuration and characteristic and may provide the first and second output voltages VET_APT1 and VET_APT2 to the first and second power amplifiers, respectively.

In an embodiment, the supply modulator 300-6 is illustrated as components that are bilaterally symmetrical with respect to the SIMO converter 319. However, the supply modulator 300-6 may include components that are bilaterally asymmetrical with respect to the SIMO converter 319 (e.g., two load capacitors and two switches being on the left and three load capacitors and three switches being on the right). However, for convenience of description, the case where components of the supply modulator 300-6 are bilaterally symmetrical with respect to the SIMO converter 319 is illustrated in FIG. 33 as an example.

In FIG. 33, reference voltage signal VREF_APT2a is generated by digital-to-analog converter DAC_e from digital signal D_REF3 and reference voltage signal VREF_APT2b is generated by digital-to-analog converter DAC_f from digital signal D_REF4. Current output voltage VOUT_APT1a provides feedback of second voltage VO2, and current output voltage VOUT_APT1b provides feedback of third voltage VO3. Current output voltage VOUT_APT2a provides feedback of fourth voltage VO4, and current output voltage VOUT_APT2b provides feedback of fifth voltage VO5.

Figure 34:
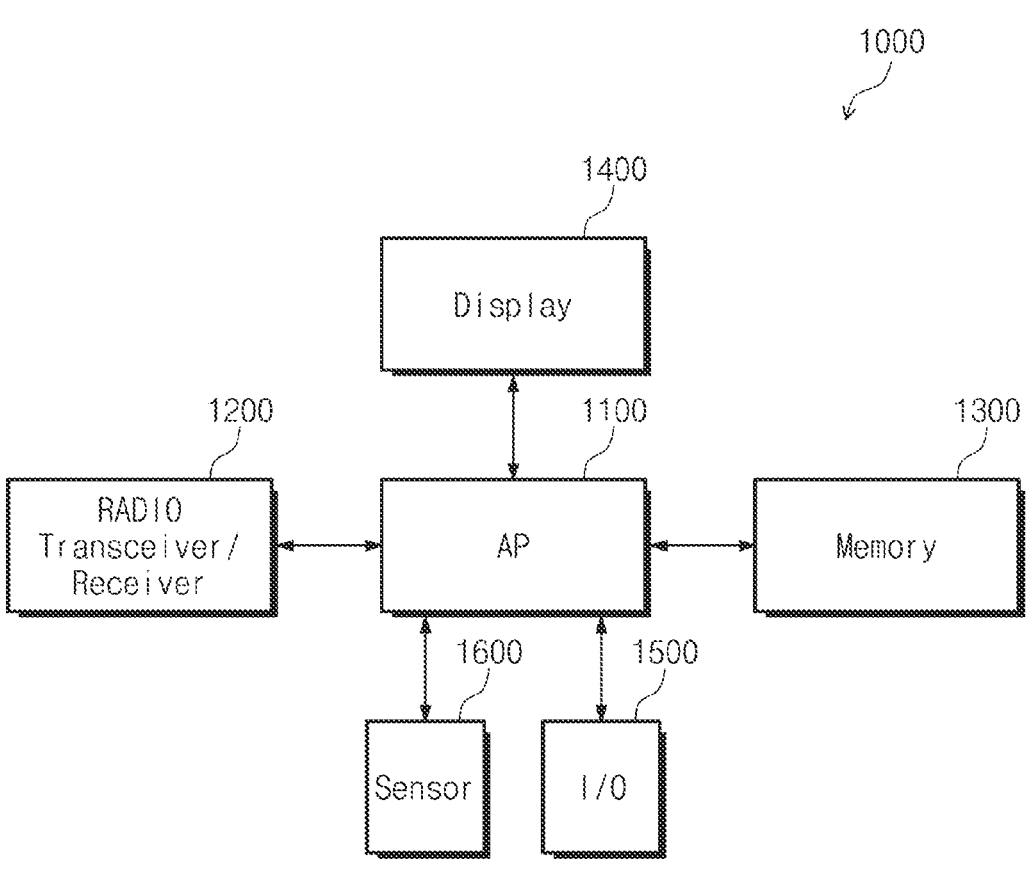
FIG. 34 is a block diagram illustrating an Internet of Things (IoT) apparatus to which a wireless communication apparatus according to some embodiments of the present disclosure is applied.

FIG. 34 is a block diagram illustrating an Internet of Things (IoT) apparatus to which a wireless communication apparatus according to some embodiments of the present disclosure is applied.

Referring to FIG. 34, an IoT may be a network between things that use wired and/or wireless communication. An IoT apparatus may include an accessible wired or/and wireless interface and may include devices that communicate with at least one or more other devices through the wired or/and wireless interface to transmit or receive data. The accessible interface may include a MODEM communication interface that is accessible to a local area network (LAN), a wireless local area network (WLAN) such as a wireless fidelity (Wi-Fi), a wireless personal area network (WPAN) such as Bluetooth, a wireless universal serial bus (USB), a Zigbee, a near field communication (NFC), a radio-frequency identification (RFID), a power line communication (PLC), or mobile cellular networks such as 3rd generation (3G), long term evolution (LTE), 4th generation (4G), or 5th generation (5G). The Bluetooth interface may support Bluetooth low energy (BLE).

In detail, an IoT apparatus 1000 may include a communication interface 1200 (RADIO transceiver/receiver) for communicating with the outside. The communication interface 1200 may be, for example, a MODEM communication interface that is accessible to: (1) a wireless local area network such as a LAN, Bluetooth, Wi-Fi or Zeebee, (2) PLC, or (3) a mobile communication network, such as 3G, LTE, 4G, or 5G, etc. The communication interface 1200 may include a transceiver and/or a receiver. The IoT apparatus 1000 may transmit and/or receive information from an access point or a gateway through the transceiver and/or the receiver. Also, the IoT apparatus 1000 may communicate with a user apparatus or any other IoT apparatus to transmit and/or receive control information or data of the IoT apparatus 1000.

At least one of the wireless communication apparatuses 1 and 2 described with reference to FIGS. 1 to 3 may be implemented in the communication interface 1200, and thus, at least one of the supply modulators 300-1 to 300-6 described with reference to FIGS. 4 to 33 may be implemented in a transmitter of the communication interface 1200.

The IoT apparatus 1000 may further include a processor or application processor (AP) 1100 performing a calculation. For internal power supply, the IoT apparatus 1000 may further include an embedded battery or a power supply unit that is supplied with power from the outside. Also, the IoT apparatus 1000 may include a display 1400 for displaying an internal state or data. The user may control the IoT apparatus 1000 through a user interface (UI) of the display 1400 in the IoT apparatus 1000. The IoT apparatus 1000 may transmit an internal state and/or data to the outside through the transmitter and may receive a control instruction and/or data to the outside through the receiver.

A memory 1300 may store a control instruction code controlling the IoT apparatus 1000, control data, or user data. The memory 1300 may include at least one of a volatile memory or a nonvolatile memory. The nonvolatile memory includes at least one of various memories such as a read only memory (ROM), a programmable ROM (PROM), an electrically programmable ROM (EPROM), an electrically erasable and programmable ROM (EEPROM), a flash memory, a phase-change RAM (PRAM), a magnetic RAM (MRAM), a resistive RAM (ReRAM), and a ferroelectric RAM (FRAM). The volatile memory may include at least one of various memories such as a static RAM (SRAM), a dynamic RAM (DRAM), and a synchronous DRAM (SDRAM).

The IoT apparatus 1000 may further include a storage device. The storage device may include at least one of nonvolatile media such as a hard disk drive (HDD), a solid state drive (SSD), an embedded multimedia card (eMMC), and a universal flash storage (UFS). The storage device may store user information provided through an input/output unit (I/O) 1500 and pieces of sensing information collected through a sensor 1600.

Figure 35:
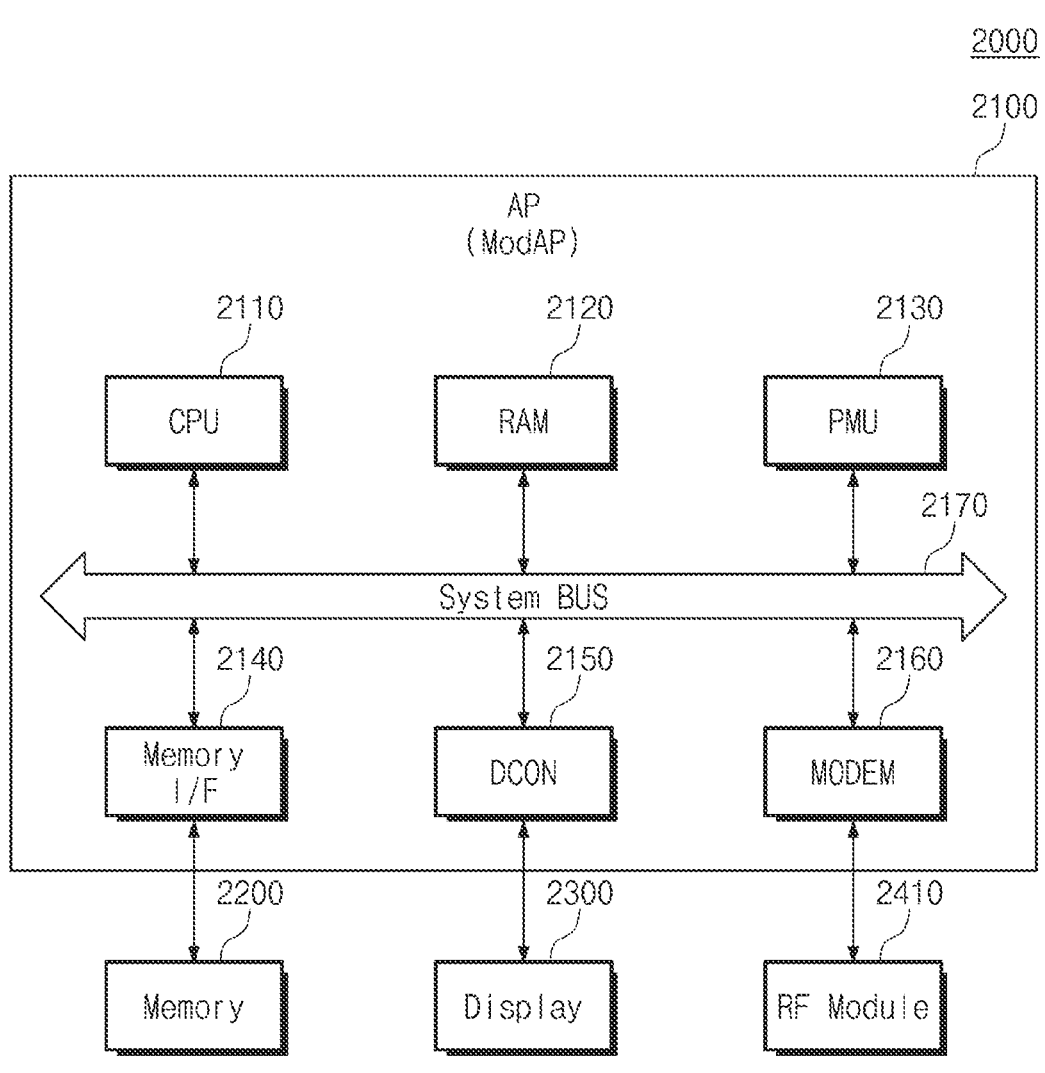
FIG. 35 is a block diagram illustrating a mobile terminal to which a wireless communication apparatus according to some embodiments of the present disclosure is applied.

FIG. 35 is a block diagram illustrating a mobile terminal to which a wireless communication apparatus according to some embodiments of the present disclosure is applied.

Referring to FIG. 35, a mobile terminal 2000 may include an application processor (hereinafter referred to as an "AP") 2100, a memory 2200, a display 2300, and an RF module 2410. In addition, the mobile terminal 2000 may further include various components such as a lens and an audio module.

The AP 2100 may be implemented with a system on chip (SoC) and may include a central processing unit (CPU) 2110, a RAM 2120, a power management unit (PMU) 2130, a memory interface (I/F) 2140, a display controller (DCON) 2150, a MODEM 2160, and a system bus 2170. In addition, the AP 2100 may further include various intellectual properties (IPs). The AP 2100 may be integrated with a function of a MODEM chip therein, which is referred to as a "ModAP".

The CPU 2110 may control overall operations of the AP 2100 and the mobile terminal 2000. The CPU 2110 may control an operation of each component of the AP 2100. Also, the CPU 2110 may be implemented with a multi-core. The multi-core may be one computing component having two or more independent cores.

The RAM 2120 may temporarily store programs, data, or instructions. For example, the programs and/or data stored in the memory 2200 may be temporarily stored in the RAM 2120 under control of the CPU 2110 or depending on a booting code. The RAM 2120 may be implemented with a DRAM or an SRAM.

The PMU 2130 may manage power of each component of the AP 2100. The PMU 2130 may also determine an operating situation of each component of the AP 2100 and may control an operation thereof.

The memory interface 2140 may control overall operations of the memory 2200 and may control data exchange of the memory 2200 with each component of the AP 2100. Depending on a request of the CPU 2110, the memory interface 2140 may write data in the memory 2200 or may read data from the memory 2200.

The display controller 2150 may provide the display 2300 with image data to be displayed on the display 2300. The display 2300 may be implemented with a flat panel display, such as a liquid crystal display (LCD) or an organic light emitting diode (OLED) display, or a flexible display.

For wireless communication, the MODEM 2160 may modulate data to be transmitted so as to be appropriate for a wireless environment and may recover received data. The MODEM 2160 may perform digital communication with the RF module 2410.

In an embodiment, the MODEM 2160 may be implemented with the MODEM 100 with reference to FIGS. 1 to 3.

The RF module 2410 may convert a high-frequency signal received through an antenna into a low-frequency signal and may transmit the converted low-frequency signal to the MODEM 2160. Also, the RF module 2410 may convert a low-frequency signal received from the MODEM 2160 into a high-frequency signal and may transmit the converted high-frequency signal to the outside of the mobile terminal 2000 through the antenna. Also, the RF module 2410 may amplify or filter a signal.

In an embodiment, the RFIC 200, the supply modulator 300, the power amplifier PA, the duplexer 400, and the antenna ANT described with reference to FIGS. 1 to 3 may be implemented in the RF module 2410.

As such, at least one of the supply modulators 300-1 to 300-6 described with reference to FIGS. 4 to 33 may be implemented in the RF module 2410.

For this reason, in the mobile terminal 2000, wide band communication may be possible, and power consumption for communication may be reduced.

According to an embodiment of the present disclosure, a supply modulator and a wireless communication apparatus including the same may improve a speed at which an output voltage changes and may also prevent the output voltage from being distorted due to a clipping phenomenon, through two or more capacitors that are charged/discharged at a time point when a mode is changed from an ET/APT mode to an APT/ET mode or before or after an output voltage of the supply modulator changes. In addition, power use efficiency and modulation operation performance may be improved through the improvement of the output voltage change speed and the prevention of the output voltage distortion.

As is traditional in the field, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure. An aspect of an embodiment may be achieved through instructions stored within a non-transitory storage medium and executed by a processor.

While the present disclosure has been described with reference to exemplary embodiments thereof, it will be apparent to those of ordinary skill in the art that various changes and modifications may be made thereto without departing from the spirit and scope of the present disclosure as set forth in the following claims.

What is claimed is:

1. A supply modulator that is driven in each of an envelope tracking mode and an average power tracking mode to provide an output voltage to a power amplifier, the supply modulator comprising:

a linear regulator configured to generate the output voltage for the envelope tracking mode;

a switching regulator configured to operate with the linear regulator to generate the output voltage for the envelope tracking mode and to selectively operate to generate the output voltage for the average power tracking mode;

a single inductor multiple output converter including a first capacitor connected with a power supply terminal of the linear regulator and a second capacitor selectively connected with an output terminal of the linear regulator through a first switch and configured to:

selectively operate with the switching regulator to generate the output voltage for the average power tracking mode, and to provide a power supply voltage to the linear regulator for the envelope tracking mode;

a main controller configured to select a tracking mode, between the envelope tracking mode and the average power tracking mode, and to control at least one of the first switch, the linear regulator, the switching regulator, and the single inductor multiple output converter based on the tracking mode; and an alternating current (AC) coupling capacitor connected between the output terminal of the linear regulator and an output terminal of the supply modulator.

2. The supply modulator of claim 1, wherein:

when the envelope tracking mode is selected as the tracking mode:

the main controller turns off the first switch; and the linear regulator and the switching regulator generate a first modulation voltage according to envelope tracking and provide the first modulation voltage to the power amplifier as the output voltage, under control of the main controller, and when the average power tracking mode is selected as the tracking mode:

the main controller turns on the first switch; and one of the single inductor multiple output converter and the switching regulator generates a second modulation voltage according to average power tracking and provides the second modulation voltage to the power amplifier as the output voltage, under control of the main controller.

3. The supply modulator of claim 2, wherein:

the single inductor multiple output converter further includes a third capacitor selectively connected with the output terminal of the linear regulator through a second switch different from the first switch, the main controller controls the second switch, and in the average power tracking mode, the main controller turns on at least one of the first switch and the second switch.

4. The supply modulator of claim 3, wherein, in a case of increasing a voltage level of the second modulation voltage from a first voltage level to a second voltage level higher than the first voltage level in a state where the first switch is turned on, the second switch is turned off, and the second modulation voltage is being provided to the power amplifier as the output voltage, the single inductor multiple output converter charges a voltage of the third capacitor to the second voltage level before a time point when the voltage level of the second modulation voltage starts to change, and at the time point when the voltage level of the second modulation voltage starts to change, the main controller turns off the first switch and turns on the second switch.

5. The supply modulator of claim 3, wherein, in a case of decreasing a voltage level of the second modulation voltage from a second voltage level to a first voltage level lower than the second voltage level in a state where the second switch is turned on, the first switch is turned off, and the second modulation voltage is being provided to the power amplifier as the output voltage, the single inductor multiple output converter discharges a voltage of the second capacitor to the first voltage level before a time point when the voltage level of the second modulation voltage starts to change, and at the time point when the voltage level of the second modulation voltage starts to change, the main controller turns on the first switch and turns off the second switch.

6. The supply modulator of claim 3, wherein, in a case where a voltage level of the first capacitor in the average power tracking mode is lower than an expected voltage level of the first modulation voltage according to the envelope tracking mode in a state where the first switch is turned on, the second switch is turned off, and the average power tracking mode has to switch to the envelope tracking mode, the main controller turns off the first switch and switches from the average power tracking mode to the envelope tracking mode, after the single inductor multiple output converter charges a voltage of the first capacitor as much as the expected voltage level of the first modulation voltage before a tracking mode change time point.

7. A supply modulator which is driven in each of an envelope tracking mode and an average power tracking mode to provide an output voltage to a power amplifier, the supply modulator comprising:

a linear regulator configured to generate the output voltage in the envelope tracking mode;

a switching regulator configured to operate with the linear regulator to generate the output voltage in the envelope tracking mode and to selectively operate to generate the output voltage in the average power tracking mode;

a boost-buck converter including a first capacitor connected with a power supply terminal of the linear regulator and configured to provide a power supply voltage to the linear regulator in the envelope tracking mode;

a linear charger including a second capacitor selectively connected with an output terminal of the linear regulator through a switch and configured to selectively operate with the switching regulator to generate the output voltage in the average power tracking mode, wherein the linear charger is supplied with the power supply voltage from the boost-buck converter in the average power tracking mode; and a main controller configured to select a tracking mode, between the envelope tracking mode and the average power tracking mode, and to control at least one of the switch, the linear regulator, the switching regulator, the boost-buck converter, and the linear charger based on the tracking mode; and an alternating current (AC) coupling capacitor connected between the output terminal of the linear regulator and an output terminal of the supply modulator.

8. The supply modulator of claim 7, wherein:

when the envelope tracking mode is selected as the tracking mode:

the main controller turns off the switch, and the linear regulator and the switching regulator generate a first modulation voltage according to envelope tracking and provide the first modulation voltage to the power amplifier as the output voltage, under control of the main controller, and when the average power tracking mode is selected as the tracking mode:

the main controller turns on the switch, and one of the linear charger and the switching regulator generates a second modulation voltage according to average power tracking and provides the second modulation voltage to the power amplifier as the output voltage, under control of the main controller.

9. The supply modulator of claim 8, wherein to increase a voltage level of the second modulation voltage from a first voltage level to a second voltage level higher than the first voltage level while: (1) the switch is turned on and (2) the second modulation voltage is being provided to the power amplifier as the output voltage:

the boost-buck converter charges a voltage of the first capacitor to the second voltage level before the voltage level of the second modulation voltage starts to change, and when the voltage level of the second modulation voltage starts to change, the main controller turns off the switch and changes the tracking mode from the average power tracking mode to the envelope tracking mode.

10. The supply modulator of claim 9, wherein in an operation in which the main controller changes the tracking mode from the envelope tracking mode to the average power tracking mode while substantially maintaining the voltage level of the second modulation voltage at the second voltage level:

when the voltage level of the second modulation voltage starts to change, the linear charger charges the second capacitor from the first voltage level to the second voltage level using the power supply voltage provided from the boost-buck converter, and when the second capacitor is completely charged to the second voltage level, the main controller turns on the switch and changes the tracking mode from the envelope tracking mode to the average power tracking mode.

11. The supply modulator of claim 8, wherein when: (1) a voltage level of the first capacitor operating according to the average power tracking mode is lower than an expected voltage level of the first modulation voltage according to the envelope tracking mode and (2) the main controller will change the tracking mode from the average power tracking mode to the envelope tracking mode.

12. The supply modulator of claim 8, wherein when: (1) a voltage level of the second capacitor operating according to the envelope tracking mode is higher than an expected voltage level of the second modulation voltage according to the average power tracking mode and (2) the main controller will change the tracking mode from the envelope tracking mode to the average power tracking mode:

the linear charger discharges a voltage of the second capacitor to the expected voltage level of the second modulation voltage, and thereafter the main controller switches from the envelope tracking mode to the average power tracking mode.

13. The supply modulator of claim 8, wherein to increase a maximum voltage level of the first modulation voltage in a next period, in which the tracking mode will be the envelope tracking mode, to a second voltage level higher than a first voltage level while the maximum voltage level of the first modulation voltage in a current period, in which the tracking mode is the envelope tracking mode, is the first voltage level:

the boost-buck converter:

charges a voltage of the first capacitor to the second voltage level in the current period, and provides the voltage of the first capacitor charged to the second voltage level to the linear regulator as the power supply voltage before entering the next period.

14. The supply modulator of claim 8, wherein to decrease a maximum voltage level of the first modulation voltage in a next period, in which the tracking mode will be the envelope tracking mode, to a first voltage level lower than a second voltage level while the maximum voltage level of the first modulation voltage in a current period, in which the tracking mode is the envelope tracking mode, is the second voltage level:

the boost-buck converter:

maintains a voltage of the first capacitor at the second voltage level in the current period, and discharges the voltage of the first capacitor, charged to the second voltage level, to the first voltage level when the next period starts.

15. The supply modulator of claim 8, wherein to decrease a voltage level of the second modulation voltage from a second voltage level to a first voltage level lower than the second voltage level while: (1) the switch is turned on and (2) the second modulation voltage is being provided to the power amplifier as the output voltage:

the main controller:

turns off the switch, and changes the tracking mode from the average power tracking mode to the envelope tracking mode when the voltage level of the second modulation voltage starts to change.

16. The supply modulator of claim 15, wherein in an operation in which the main controller changes the tracking mode from the envelope tracking mode to the average power tracking mode while substantially maintaining the voltage level of the second modulation voltage at the first voltage level:

the linear charger discharges a voltage of the second capacitor from the second voltage level to the first voltage level when the voltage level of the second modulation voltage starts to change, and the main controller turns on the switch and changes the tracking mode from the envelope tracking mode to the average power tracking mode, when the second capacitor is completely discharged to the first voltage level.

17. A supply modulator that is driven in each of an envelope tracking mode and an average power tracking mode to provide a first and a second output voltages to a first and a second power amplifiers, respectively, the supply modulator comprising:

a first modulation circuit configured to provide the first output voltage to the first power amplifier, wherein:

the first modulation circuit includes:

a first linear regulator configured to generate the first output voltage for the envelope tracking mode;

a first switching regulator configured to operate with the first linear regulator to generate the first output voltage for the envelope tracking mode and to selectively operate to generate the first output voltage for the average power tracking mode;

a second modulation circuit configured to provide the second output voltage to the second power amplifier, wherein:

the second modulation circuit includes:

a second linear regulator configured to generate the second output voltage for the envelope tracking mode;

a second switching regulator configured to operate with the second linear regulator to generate the second output voltage for the envelope tracking mode and to selectively operate to generate the second output voltage for the average power tracking mode;

a single inductor multiple output converter including a first capacitor connected with a power supply terminals of each of the first linear regulator and second linear regulator, a second capacitor selectively connected with an output terminal of the first linear regulator through a first switch and a third capacitor selectively connected with an output terminal of the second linear regulator through a second switch and configured to:

selectively operate with a switching regulator operating in the average power tracking mode among the first and second switching regulators, and to provide a power supply voltage to a linear regulator operating in the envelope tracking mode among the first and second switching regulators; and a main controller configured to select a tracking mode for each of the first and second power amplifiers, between the envelope tracking mode and the average power tracking mode, and to control at least one of the first switch, the second switch, the first modulation circuit, the second modulation circuit and the single inductor multiple output converter based on the tracking mode.

18. The supply modulator of claim 17, further comprising:

a first alternating current (AC) coupling capacitor connected between the output terminal of the first linear regulator and a first output terminal of the supply modulator; and a second alternating current (AC) coupling capacitor connected between the output terminal of the second linear regulator and a second output terminal of the supply modulator, wherein, the first output terminal of the supply modulator is connected to the first power amplifier and the second output terminal of the supply modulator is connected to the second power amplifier.

19. The supply modulator of claim 17, wherein the single inductor multiple output converter further comprises:

a fourth capacitor selectively connected with the output terminal of the first linear regulator through a third switch; and a fifth capacitor selectively connected with the output terminal of the second linear regulator through a fourth switch, wherein the main controller is further configured to control the third switch and the second switch.

20. The supply modulator of claim 19, further comprising:

a first alternating current (AC) coupling capacitor connected between the output terminal of the first linear regulator and a first output terminal of the supply modulator; and a second alternating current (AC) coupling capacitor connected between the output terminal of the second linear regulator and a second output terminal of the supply modulator, wherein, the first output terminal of the supply modulator is connected to the first power amplifier and the second output terminal of the supply modulator is connected to the second power amplifier.

\* \* \* \* \*